United States Patent
Drees et al.

(10) Patent No.: US 9,575,475 B2
(45) Date of Patent: *Feb. 21, 2017

(54) SYSTEMS AND METHODS FOR GENERATING AN ENERGY USAGE MODEL FOR A BUILDING

(71) Applicant: Johnson Controls Technology Company, Holland, MI (US)

(72) Inventors: Kirk H. Drees, Cedarburg, WI (US); James P. Kummer, Wales, WI (US); Michael J. Wenzel, Oak Creek, WI (US)

(73) Assignee: Johnson Controls Technology Company, Plymouth, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 15/016,243

(22) Filed: Feb. 4, 2016

(65) Prior Publication Data
US 2016/0154389 A1  Jun. 2, 2016

Related U.S. Application Data

(63) Continuation of application No. 13/252,092, filed on Oct. 3, 2011, now Pat. No. 9,286,582, which is a
(Continued)

(51) Int. Cl.
*G06F 7/60* (2006.01)
*G06F 17/10* (2006.01)
(Continued)

(52) U.S. Cl.
CPC .............. *G05B 13/048* (2013.01); *G05F 1/66* (2013.01); *G06F 17/5009* (2013.01);
(Continued)

(58) Field of Classification Search
CPC ...... G05B 13/048; G06F 17/5009; G05F 1/66;
G06Q 10/06; G06Q 50/06; H02J 13/0013;
H02J 2003/007; H02J 2003/003; Y04S
40/22; Y04S 10/54; Y04S 40/12; Y02E
60/76
(Continued)

(56) References Cited

U.S. PATENT DOCUMENTS 2,812,141 A    11/1957   Sueda et al.
3,181,791 A    5/1965    Axelrod
(Continued)

FOREIGN PATENT DOCUMENTS

JP    63-231127 A    9/1988
JP    04-062352 A    2/1992
(Continued)

OTHER PUBLICATIONS

U.S. Appl. No. 61/302,854, filed Feb. 9, 2010, Drees, K.
(Continued)

*Primary Examiner* — Eun Kim
(74) *Attorney, Agent, or Firm* — Foley & Lardner LLP

(57) ABSTRACT

A building management system (BMS) includes a baseline model generator configured to receive an initial set of predictor variables for potential use in an energy usage model for a building, generate a first set of coefficients for the baseline energy usage model based on the initial set of predictor variables, remove one of the predictor variables from the initial set of predictor variables to create a subset of the initial set of predictor variables, generate a second set of coefficients for the baseline energy usage model based on the subset of the initial set of predictor variables, calculate a test statistic for the removed variable using a difference between the first set of coefficients and the second set of coefficients, and automatically select the removed predictor variable for use in the baseline energy usage model in response the test statistic exceeding a critical value.

20 Claims, 29 Drawing Sheets

Related U.S. Application Data continuation-in-part of application No. 13/167,571, filed on Jun. 23, 2011, now Pat. No. 9,196,009, which is a continuation-in-part of application No. 13/023,392, filed on Feb. 8, 2011, now Pat. No. 8,532,808, which is a continuation-in-part of application No. 12/819,977, filed on Jun. 21, 2010, now Pat. No. 8,600,556.

(60) Provisional application No. 61/219,326, filed on Jun. 22, 2009, provisional application No. 61/234,217, filed on Aug. 14, 2009, provisional application No. 61/302,854, filed on Feb. 9, 2010.

(51) Int. Cl.
| | | |
|---|---|---|
| *G05B 13/04* | (2006.01) | |
| *G06Q 10/06* | (2012.01) | |
| *G06Q 50/06* | (2012.01) | |
| *G05F 1/66* | (2006.01) | |
| *G06F 17/50* | (2006.01) | |
| *H02J 13/00* | (2006.01) | |
| *H02J 3/00* | (2006.01) | |

(52) U.S. Cl.
CPC ............ *G06Q 10/06* (2013.01); *G06Q 50/06* (2013.01); *H02J 13/0013* (2013.01); *H02J 2003/003* (2013.01); *H02J 2003/007* (2013.01); *Y02B 90/2607* (2013.01); *Y02E 60/76* (2013.01); *Y04S 10/54* (2013.01); *Y04S 40/12* (2013.01); *Y04S 40/22* (2013.01)

(58) Field of Classification Search
USPC .......... 703/1, 2; 700/109, 291; 702/60, 179; 715/771
See application file for complete search history.

(56) References Cited

U.S. PATENT DOCUMENTS

| | | |
|---|---|---|
| 3,641,326 A | 2/1972 | Harte |
| 3,998,093 A | 12/1976 | Bertolasi |
| 4,114,807 A | 9/1978 | Naseck et al. |
| 4,182,180 A | 1/1980 | Mott |
| 4,199,101 A | 4/1980 | Bramow et al. |
| 4,211,089 A | 7/1980 | Mueller et al. |
| 4,213,174 A | 7/1980 | Morley et al. |
| 4,257,238 A | 3/1981 | Kountz et al. |
| 4,319,461 A | 3/1982 | Shaw |
| 4,325,223 A | 4/1982 | Cantley |
| 4,346,446 A | 8/1982 | Erbstein et al. |
| 4,432,031 A | 2/1984 | Premerlani |
| 4,512,161 A | 4/1985 | Logan et al. |
| 4,557,317 A | 12/1985 | Harmon, Jr. |
| 4,558,595 A | 12/1985 | Kompelien |
| 4,607,789 A | 8/1986 | Bowman |
| 4,611,470 A | 9/1986 | Enstrom |
| 4,622,922 A | 11/1986 | Miyagaki et al. |
| 4,749,122 A | 6/1988 | Shriver et al. |
| 4,776,301 A | 10/1988 | Dziubakowski |
| 4,802,100 A | 1/1989 | Aasen et al. |
| 4,855,922 A | 8/1989 | Huddleston et al. |
| 4,866,635 A | 9/1989 | Kahn et al. |
| 4,876,858 A | 10/1989 | Shaw et al. |
| 4,897,798 A | 1/1990 | Cler |
| 4,916,909 A | 4/1990 | Mathur et al. |
| 4,942,740 A | 7/1990 | Shaw et al. |
| 4,964,126 A | 10/1990 | Musicus et al. |
| 5,042,997 A | 8/1991 | Rhodes |
| 5,074,137 A | 12/1991 | Harris et al. |
| 5,090,303 A | 2/1992 | Ahmed |
| 5,099,436 A | 3/1992 | McCown et al. |
| 5,103,391 A | 4/1992 | Barrett |
| 5,115,967 A | 5/1992 | Wedekind |
| 5,131,746 A | 7/1992 | O'Rourke et al. |
| 5,189,606 A | 2/1993 | Burns et al. |
| 5,218,525 A | 6/1993 | Amasaki et al. |
| 5,251,814 A | 10/1993 | Warashina et al. |
| 5,253,159 A | 10/1993 | Bilas et al. |
| 5,274,571 A | 12/1993 | Hesse et al. |
| 5,299,312 A | 3/1994 | Rocco, Jr. |
| 5,315,502 A | 5/1994 | Koyama et al. |
| 5,346,129 A | 9/1994 | Shah et al. |
| 5,351,855 A | 10/1994 | Nelson et al. |
| 5,355,305 A | 10/1994 | Seem et al. |
| 5,384,697 A | 1/1995 | Pascucci |
| 5,414,640 A | 5/1995 | Seem |
| 5,426,421 A | 6/1995 | Gray |
| 5,461,877 A | 10/1995 | Shaw et al. |
| 5,467,287 A | 11/1995 | Wenner et al. |
| 5,481,481 A | 1/1996 | Frey et al. |
| 5,506,768 A | 4/1996 | Seem et al. |
| 5,528,516 A | 6/1996 | Yemini et al. |
| 5,552,763 A | 9/1996 | Kirby |
| 5,555,195 A | 9/1996 | Jensen et al. |
| 5,557,546 A | 9/1996 | Fukai et al. |
| 5,566,084 A | 10/1996 | Cmar |
| 5,566,092 A | 10/1996 | Wang et al. |
| 5,568,377 A | 10/1996 | Seem et al. |
| 5,572,878 A | 11/1996 | Kapoor |
| 5,582,021 A | 12/1996 | Masauji |
| 5,590,830 A | 1/1997 | Kettler et al. |
| 5,592,147 A | 1/1997 | Wong |
| 5,596,507 A | 1/1997 | Jones et al. |
| 5,602,761 A | 2/1997 | Spoerre et al. |
| 5,663,963 A | 9/1997 | Goodwin, III |
| 5,675,979 A | 10/1997 | Shah |
| 5,682,329 A | 10/1997 | Seem et al. |
| 5,751,916 A | 5/1998 | Kon et al. |
| 5,769,315 A | 6/1998 | Drees |
| 5,791,408 A | 8/1998 | Seem |
| 5,801,940 A | 9/1998 | Russ et al. |
| 5,838,561 A | 11/1998 | Owen |
| 5,867,384 A | 2/1999 | Drees et al. |
| 5,884,072 A | 3/1999 | Rasmussen |
| 5,911,127 A | 6/1999 | Tulpule |
| 5,918,200 A | 6/1999 | Tsutsui et al. |
| 5,924,486 A | 7/1999 | Ehlers et al. |
| 5,930,773 A | 7/1999 | Crooks et al. |
| 5,960,381 A | 9/1999 | Singers et al. |
| 5,963,458 A | 10/1999 | Cascia |
| 6,005,577 A | 12/1999 | Breitlow |
| 6,006,142 A | 12/1999 | Seem et al. |
| 6,012,152 A | 1/2000 | Douik et al. |
| 6,021,401 A | 2/2000 | Oravetz et al. |
| 6,029,092 A | 2/2000 | Stein |
| 6,058,161 A | 5/2000 | Anderson et al. |
| 6,064,310 A | 5/2000 | Busak et al. |
| 6,067,083 A | 5/2000 | Glen et al. |
| 6,104,963 A | 8/2000 | Cebasek et al. |
| 6,122,603 A | 9/2000 | Budike, Jr. |
| 6,122,605 A | 9/2000 | Drees et al. |
| 6,141,595 A | 10/2000 | Gloudeman et al. |
| 6,148,306 A | 11/2000 | Seidl et al. |
| 6,157,943 A | 12/2000 | Meyer |
| 6,161,764 A | 12/2000 | Jatnieks |
| 6,178,362 B1 | 1/2001 | Woolard et al. |
| 6,185,483 B1 | 2/2001 | Drees |
| 6,216,956 B1 | 4/2001 | Ehlers et al. |
| 6,219,590 B1 | 4/2001 | Bernaden, III et al. |
| 6,223,544 B1 | 5/2001 | Seem |
| 6,253,121 B1 | 6/2001 | Cline et al. |
| 6,265,843 B1 | 7/2001 | West et al. |
| 6,269,650 B1 | 8/2001 | Shaw |
| 6,282,910 B1 | 9/2001 | Helt |
| 6,296,193 B1 | 10/2001 | West et al. |
| 6,324,659 B1 | 11/2001 | Pierro |
| 6,366,832 B2 | 4/2002 | Lomonaco et al. |
| 6,366,889 B1 | 4/2002 | Zaloom |
| 6,369,716 B1 | 4/2002 | Abbas et al. |
| 6,389,331 B1 | 5/2002 | Jensen et al. |
| 6,408,228 B1 | 6/2002 | Seem et al. |
| 6,415,276 B1 | 7/2002 | Heger et al. |

(56) References Cited

U.S. PATENT DOCUMENTS

| | | |
|---|---|---|
| 6,415,617 B1 | 7/2002 | Seem |
| 6,456,622 B1 | 9/2002 | Skaanning et al. |
| 6,477,439 B1 | 11/2002 | Bernaden, III et al. |
| 6,535,865 B1 | 3/2003 | Skaaning et al. |
| 6,556,950 B1 | 4/2003 | Schwenke et al. |
| 6,577,962 B1 | 6/2003 | Afshari |
| 6,594,554 B1 | 7/2003 | Seem et al. |
| 6,622,264 B1 | 9/2003 | Bliley et al. |
| 6,626,366 B2 | 9/2003 | Kayahara et al. |
| 6,631,299 B1 | 10/2003 | Patel et al. |
| 6,633,782 B1 | 10/2003 | Schleiss et al. |
| 6,651,034 B1 | 11/2003 | Hedlund et al. |
| 6,676,831 B2 | 1/2004 | Wolfe |
| 6,684,208 B2 | 1/2004 | Kil et al. |
| 6,687,685 B1 | 2/2004 | Sadeghi et al. |
| 6,757,668 B1 | 6/2004 | Goebel et al. |
| 6,785,592 B1 | 8/2004 | Smith et al. |
| 6,816,811 B2 | 11/2004 | Seem |
| 6,834,208 B2 | 12/2004 | Gonzales et al. |
| 6,853,882 B2 | 2/2005 | Dudley |
| 6,862,499 B1 | 3/2005 | Cretella et al. |
| 6,862,540 B1 | 3/2005 | Welch et al. |
| 6,865,449 B2 | 3/2005 | Dudley |
| 6,891,536 B2 | 5/2005 | Smith |
| 6,937,909 B2 | 8/2005 | Seem |
| 6,944,524 B2 | 9/2005 | Shier et al. |
| 6,968,295 B1 | 11/2005 | Carr |
| 6,973,793 B2 | 12/2005 | Douglas et al. |
| 6,996,508 B1 | 2/2006 | Culp et al. |
| 7,031,880 B1 | 4/2006 | Seem et al. |
| 7,036,559 B2 | 5/2006 | Stanimirovic |
| 7,043,661 B2 | 5/2006 | Valadarsky et al. |
| 7,096,387 B2 | 8/2006 | Durrant et al. |
| 7,110,919 B2 | 9/2006 | Brindac et al. |
| 7,113,890 B2 | 9/2006 | Frerichs et al. |
| 7,113,988 B2 | 9/2006 | Chirashnya et al. |
| 7,124,637 B2 | 10/2006 | Singhal et al. |
| 7,181,648 B2 | 2/2007 | Bjorsne et al. |
| 7,212,887 B2 | 5/2007 | Shah et al |
| 7,216,021 B2 | 5/2007 | Matsubara et al. |
| 7,218,974 B2 | 5/2007 | Rumi et al. |
| 7,222,800 B2 | 5/2007 | Wruck |
| 7,225,089 B2 | 5/2007 | Culp et al. |
| 7,231,281 B2 | 6/2007 | Costa |
| 7,246,039 B2 | 7/2007 | Moorhouse |
| 7,251,582 B2 | 7/2007 | Singh et al. |
| 7,257,744 B2 | 8/2007 | Sabet et al. |
| 7,284,372 B2 | 10/2007 | Crow |
| 7,356,548 B1 | 4/2008 | Culp et al. |
| 7,409,303 B2 | 8/2008 | Yeo et al. |
| 7,434,413 B2 | 10/2008 | Wruck |
| 7,444,251 B2 | 10/2008 | Nikovski et al. |
| 7,451,003 B2 | 11/2008 | Chester et al. |
| 7,451,017 B2 | 11/2008 | McNally |
| 7,519,485 B2 | 4/2009 | MacGregor |
| 7,552,033 B1 | 6/2009 | Culp et al. |
| 7,567,844 B2 | 7/2009 | Thomas et al. |
| 7,567,888 B2 | 7/2009 | Chang et al. |
| 7,577,550 B2 | 8/2009 | Ozonat et al. |
| 7,578,734 B2 | 8/2009 | Ahmed et al. |
| 7,636,613 B2 | 12/2009 | Borah et al. |
| 7,685,830 B2 | 3/2010 | Thybo et al. |
| 7,698,233 B1 | 4/2010 | Edwards et al. |
| 7,705,269 B2 | 4/2010 | Daniel |
| 7,729,789 B2 | 6/2010 | Blevins et al. |
| 7,822,709 B2 | 10/2010 | Godwin |
| 7,827,813 B2 | 11/2010 | Seem |
| 7,844,366 B2 | 11/2010 | Singh |
| 7,844,370 B2 | 11/2010 | Pollack et al. |
| 7,873,442 B2 | 1/2011 | Tsui |
| 7,873,485 B2 | 1/2011 | Castelli et al. |
| 7,880,602 B2 | 2/2011 | Kasamatsu |
| 7,881,889 B2 * | 2/2011 | Barclay ............... G06F 17/5004 702/60 |
| 7,908,126 B2 | 3/2011 | Bahel et al. |
| 7,918,407 B2 | 4/2011 | Patch |
| 7,962,536 B2 | 6/2011 | Culp et al. |
| 7,965,178 B1 | 6/2011 | Schmuttor et al. |
| 8,027,742 B2 | 9/2011 | Seem et al. |
| 8,103,465 B2 | 1/2012 | Brzezowski et al. |
| 8,172,154 B1 | 5/2012 | Figley et al. |
| 8,180,664 B2 * | 5/2012 | Shan ..................... G06Q 10/04 705/7.31 |
| 8,200,344 B2 | 6/2012 | Li et al. |
| 8,200,345 B2 | 6/2012 | Li et al. |
| 8,200,449 B2 | 6/2012 | Mark |
| 8,200,456 B2 | 6/2012 | Marik et al. |
| 8,219,250 B2 | 7/2012 | Dempster et al. |
| 8,239,168 B2 | 8/2012 | House et al. |
| 8,374,725 B1 | 2/2013 | Ols |
| 8,417,392 B2 | 4/2013 | Higgins |
| 8,543,244 B2 | 9/2013 | Keeling et al. |
| 8,682,612 B2 | 3/2014 | Mousavi et al. |
| 8,826,165 B2 | 9/2014 | Harrod et al. |
| 2001/0045960 A1 | 11/2001 | Keeley |
| 2002/0010563 A1 | 1/2002 | Ratteree et al. |
| 2002/0016639 A1 | 2/2002 | Smith et al. |
| 2002/0030114 A1 | 3/2002 | Kayahara et al. |
| 2002/0038169 A1 | 3/2002 | Cline et al. |
| 2002/0045995 A1 | 4/2002 | Shimazaki et al. |
| 2002/0055820 A1 | 5/2002 | Scannell |
| 2002/0138782 A1 | 9/2002 | Durrant et al. |
| 2002/0152298 A1 | 10/2002 | Kikta et al. |
| 2002/0178047 A1 | 11/2002 | Or et al. |
| 2002/0183988 A1 | 12/2002 | Skaanning et al. |
| 2003/0014160 A1 | 1/2003 | Nordquist et al. |
| 2003/0028350 A1 | 2/2003 | Seem |
| 2003/0031164 A1 | 2/2003 | Nabkel et al. |
| 2003/0074304 A1 | 4/2003 | Okada |
| 2003/0079483 A1 | 5/2003 | Komatsu et al. |
| 2003/0090371 A1 | 5/2003 | Teowee et al. |
| 2003/0093186 A1 | 5/2003 | Patterson et al. |
| 2003/0105556 A1 | 6/2003 | Enis et al. |
| 2003/0114942 A1 | 6/2003 | Varone et al. |
| 2003/0135339 A1 | 7/2003 | Gristina et al. |
| 2003/0172087 A1 | 9/2003 | Godwin |
| 2003/0177705 A1 | 9/2003 | Forbis et al. |
| 2003/0229572 A1 | 12/2003 | Raines et al. |
| 2004/0002776 A1 | 1/2004 | Bickford |
| 2004/0010733 A1 | 1/2004 | S. et al. |
| 2004/0024494 A1 | 2/2004 | Bayoumi et al. |
| 2004/0072535 A1 | 4/2004 | Schneider et al. |
| 2004/0078094 A1 | 4/2004 | Nagatsuka et al. |
| 2004/0102924 A1 | 5/2004 | Jarrell et al. |
| 2004/0102937 A1 | 5/2004 | Ibrahim |
| 2004/0143474 A1 | 7/2004 | Haeberle et al. |
| 2004/0143510 A1 | 7/2004 | Haeberle et al. |
| 2004/0143810 A1 | 7/2004 | Ahmed et al. |
| 2004/0153819 A1 | 8/2004 | Bjorsne et al. |
| 2004/0158417 A1 | 8/2004 | Bonet |
| 2004/0164690 A1 | 8/2004 | Degner et al. |
| 2004/0186630 A1 | 9/2004 | Shier et al. |
| 2004/0225513 A1 | 11/2004 | Haeberle et al. |
| 2004/0267385 A1 | 12/2004 | Lingemann |
| 2004/0267395 A1 | 12/2004 | Discenzo et al. |
| 2005/0006488 A1 | 1/2005 | Stanimirovic |
| 2005/0033458 A1 | 2/2005 | Brindac et al. |
| 2005/0033481 A1 | 2/2005 | Budhraja et al. |
| 2005/0040250 A1 | 2/2005 | Wruck |
| 2005/0114311 A1 | 5/2005 | Cheng et al. |
| 2005/0159847 A1 | 7/2005 | Shah et al. |
| 2005/0160324 A1 | 7/2005 | Przytula et al. |
| 2005/0192680 A1 | 9/2005 | Cascia et al. |
| 2005/0192915 A1 | 9/2005 | Ahmed et al. |
| 2005/0256661 A1 | 11/2005 | Salsbury et al. |
| 2005/0278047 A1 | 12/2005 | Ahmed |
| 2006/0015195 A1 | 1/2006 | Lehman et al. |
| 2006/0058900 A1 | 3/2006 | Johanson et al. |
| 2006/0058923 A1 | 3/2006 | Kruk et al. |
| 2006/0090467 A1 | 5/2006 | Crow |
| 2006/0106739 A1 | 5/2006 | Holzbauer et al. |
| 2006/0125422 A1 | 6/2006 | Costa |
| 2006/0144057 A1 | 7/2006 | You et al. |
| 2006/0167591 A1 | 7/2006 | McNally |

(56) References Cited

U.S. PATENT DOCUMENTS

| | | |
|---|---|---|
| 2006/0171396 A1 | 8/2006 | Singh et al. |
| 2006/0173256 A1 | 8/2006 | Ridder et al. |
| 2006/0186214 A1 | 8/2006 | Simon et al. |
| 2006/0206240 A1 | 9/2006 | Tsui |
| 2006/0224254 A1 | 10/2006 | Rumi et al. |
| 2006/0259285 A1 | 11/2006 | Bahel et al. |
| 2007/0006124 A1 | 1/2007 | Ahmed et al. |
| 2007/0023533 A1 | 2/2007 | Liu |
| 2007/0061046 A1 | 3/2007 | Mairs et al. |
| 2007/0067062 A1 | 3/2007 | Mairs et al. |
| 2007/0139183 A1 | 6/2007 | Kates |
| 2007/0143045 A1 | 6/2007 | MacGregor |
| 2007/0225868 A1 | 9/2007 | Terlson et al. |
| 2007/0244573 A1 | 10/2007 | McFarland |
| 2008/0028778 A1 | 2/2008 | Millet |
| 2008/0033674 A1 | 2/2008 | Nikovski et al. |
| 2008/0054082 A1 | 3/2008 | Evans et al. |
| 2008/0082183 A1 | 4/2008 | Judge |
| 2008/0097651 A1 | 4/2008 | Shah et al. |
| 2008/0147465 A1 | 6/2008 | Raines et al. |
| 2008/0171396 A1 | 7/2008 | Fung et al. |
| 2008/0172258 A1 | 7/2008 | Weger et al. |
| 2008/0179408 A1 | 7/2008 | Seem |
| 2008/0183424 A1 | 7/2008 | Seem |
| 2008/0231437 A1 | 9/2008 | Singhal et al. |
| 2008/0275674 A1 | 11/2008 | Reghetti et al. |
| 2008/0277486 A1 | 11/2008 | Seem et al. |
| 2008/0300963 A1 | 12/2008 | Seetharaman et al. |
| 2009/0012654 A1 | 1/2009 | Culp et al. |
| 2009/0076790 A1 | 3/2009 | Fein et al. |
| 2009/0078401 A1 | 3/2009 | Cichanowicz |
| 2009/0083583 A1 | 3/2009 | Seem et al. |
| 2009/0099889 A1 | 4/2009 | Okamoto et al. |
| 2009/0105846 A1 | 4/2009 | Hesse et al. |
| 2009/0106178 A1 | 4/2009 | Chu |
| 2009/0112522 A1 | 4/2009 | Rasmussen |
| 2009/0132096 A1 | 5/2009 | Swarztrauber et al. |
| 2009/0138203 A1 | 5/2009 | Iossifov et al. |
| 2009/0204267 A1 | 8/2009 | Sustaeta et al. |
| 2009/0216393 A1 | 8/2009 | Schimert |
| 2009/0216469 A1 | 8/2009 | Marik et al. |
| 2009/0308941 A1 | 12/2009 | Patch |
| 2009/0327890 A1 | 12/2009 | Mertz et al. |
| 2010/0004882 A1 | 1/2010 | Chu et al. |
| 2010/0042453 A1 | 2/2010 | Scaramellino et al. |
| 2010/0049676 A1 | 2/2010 | Devitt et al. |
| 2010/0070907 A1 | 3/2010 | Harrod et al. |
| 2010/0082161 A1 | 4/2010 | Patch |
| 2010/0106316 A1 | 4/2010 | Curry et al. |
| 2010/0106319 A1 | 4/2010 | Grohman et al. |
| 2010/0106321 A1 | 4/2010 | Hadzidedic |
| 2010/0106328 A1 | 4/2010 | Li et al. |
| 2010/0106331 A1 | 4/2010 | Li et al. |
| 2010/0114385 A1 | 5/2010 | Dempster et al. |
| 2010/0207951 A1 | 8/2010 | Plaisted et al. |
| 2010/0211222 A1 | 8/2010 | Ghosn |
| 2010/0257108 A1 | 10/2010 | Skeels et al. |
| 2010/0274366 A1 | 10/2010 | Fata et al. |
| 2010/0280774 A1 | 11/2010 | Ewing et al. |
| 2010/0283606 A1 | 11/2010 | Tsypin et al. |
| 2010/0286937 A1 | 11/2010 | Hedley et al. |
| 2010/0324741 A1 | 12/2010 | House et al. |
| 2010/0324962 A1 | 12/2010 | Nesler et al. |
| 2011/0029422 A1 | 2/2011 | Rey |
| 2011/0046970 A1 | 2/2011 | Fontenot |
| 2011/0061015 A1 | 3/2011 | Drees et al. |
| 2011/0178977 A1 | 7/2011 | Drees |
| 2011/0204720 A1 | 8/2011 | Ruiz et al. |
| 2011/0231320 A1 | 9/2011 | Irving |
| 2011/0246381 A1 | 10/2011 | Fitch et al. |
| 2011/0285656 A1 | 11/2011 | Yaksick et al. |
| 2011/0320045 A1 | 12/2011 | Salsbury et al. |
| 2012/0072039 A1 | 3/2012 | Anderson et al. |
| 2013/0103201 A1 | 4/2013 | Huizenga et al. |

FOREIGN PATENT DOCUMENTS

| | | |
|---|---|---|
| JP | 10-047738 A | 2/1998 |
| JP | 06-079426 A | 3/2006 |
| JP | 2006-079426 A | 3/2006 |
| SU | 535103 | 11/1976 |
| WO | WO-00/68744 A1 | 11/2000 |
| WO | WO-2009/012269 A2 | 1/2009 |
| WO | WO-2009/012282 A2 | 1/2009 |

OTHER PUBLICATIONS

Andersen, Stochastic Modeling of Energy Systems, Technical University of Denmark, Department of Informatics and Mathematical Modeling, 2001, 212 pages.

Ashrae Guideline 14-2002, Measurement of Energy and Demand Savings, 2002, 170 pages.

Ashrae Standard 90.1-2004, Energy Standard for Buildings Except Low-Rise Residential Buildings, 2004, 4 pages.

Ashrae Standard, Energy Standard for Buildings Except Low-Rise Residential Buildings I-P Edition, Ansi/Ashrae/Iesna Standard 90.1-2004, 4 pages.

Barnett et al., Outliers in Statistical Data, 1994, 14 pages.

Cowan, Review of Recent Commercial Roof Top Unit Field Studies in the Pacific Northwest and California, Oct. 8, 2004, 18 pages.

Doe Federal Emergency Management Program, Actions You Can Take to Reduce Cooling Costs, http://www1.eere.energy.gov/femp/pdfs/om_cooling.pdf, May 2005, 8 pages.

Edelson, Building Automation Security in Office Building, Elsevier, 2004, 3 pages.

Final Office Action on U.S. Appl. No. 13/167,571, mail date Jan. 29, 2015, 6 pages.

Final Office Action on U.S. Appl. No. 13/485,682 Dated Sep. 1, 2015, 29 pages.

Final Office Action on U.S. Appl. No. 13/252,092 Dated Apr. 23, 2015, 12 pages.

Final Office Action on U.S. Appl. No. 13/439,779 Dated Apr. 2, 2015, 15 pages.

Final Office Action on U.S. Appl. No. 14/021,948 Dated Jul. 14, 2015, 8 pages.

Financial Times Energy, Inc. Economizers, Energy Design Resources, taken from http://www.energydesignresources.com/resource/28/, Jan. 2007, 32 pages.

Geweke, Efficient Simulation from the Multivariate Normal and Student-T Distributions Subject to Linear Constraints and the Evaluation of Constraint Probabilities, Computing Science and Statistics, Seattle, Apr. 22-24, 1991, 14 pages.

House et al., An Expert Rule Set for Fault Detection in Air-Handling Units, Ashrae Transactions, 2001, 32 pages.

Iglewicz et al., vol. 16: How to Detect and Handle Outliers, The ASQC Basic References in Quality Control: Statistical Techniques, 1993, 15 pages.

International Performance Measurement & Verification Protocol, Concepts and Options for Determining Energy and Water Savings, Mar. 2002, 93 pages.

International Search Report and Written Opinion for International Patent Application No. PCT/US2008/070091, mailed Sep. 30, 2009, 13 pages.

International Search Report and Written Opinion for International Patent Application No. PCT/US2008/070118, mailed Oct. 19, 2009, 11 pages.

International Search Report and Written Opinion for International Patent Application No. PCT/US2011/024079, mailed Oct. 24, 2011, 9 pages.

Jaehn, The Zone Control Chart, Quality Progress, Jul. 1991, 6 pages.

Kastner et al., Communication Systems for Building Automation and Control, 2005, 26 pages.

Katipamula et al., Methods for Fault Detection, Diagnostics, and Prognostics for Building Systems—A Review, Part I, American Society of Heating, 2005, 24 pages.

(56) References Cited

OTHER PUBLICATIONS

Kim et al., Performance Enhancement of Cyclostationarity Detector by Utilizing Multiple Cyclic Frequencies of OFDM Signals, IEEE DySPAN, 2010, 8 pages.
Leblanc, Sur l'electrification des Chemins de fer au Moyen de Courants Alternatifs de Frequence Elevee, Revue Generale de l'Electricite, 1922, 4 pages.
Leyva et al., MPPT of Photovoltaic Systems using Extremum-Seeking Control, IEEE Transactions on Aerospace and Electronic Systems, Jan. 2006, 10 pages.
Li et al., Extremum Seeking Control of a Tunable Thermoacoustic Cooler, IEEE Transactions on Control Systems Technology, Jul. 2005, 10 pages.
Martin et al., Supervisory Control for Energy Savings and Thermal Comfort in Commercial Building HVAC Systems, AAAI Technical Report, 2002, 8 pages.
Mathews et al., A Tool for Integrated HVAC, Building, Energy, and Control Analysis Part 1: Overview of Quick Control, 1999, 21 pages.
Nelson, Best Target Value for a Production Process, Journal of Quality Technology, Apr. 1978, 4 pages.
Non-Final Office Action on U.S. Appl. No. 13/167,571, mail date Aug. 27, 2014, 5 pages.
Non-Final Office Action on U.S. Appl. No. 13/485,682, mail date Feb. 6, 2015, 24 pages.
Non-Final Office Action on U.S. Appl. No. 14/320,203 Dated Sep. 15, 2015, 16 pages.
Non-Final Office Action on U.S. Appl. No. 13/252,092 Dated Sep. 29, 2014, 11 pages.
Non-Final Office Action on U.S. Appl. No. 13/439,779 Dated Nov. 3, 2015, 13 pages.
Non-Final Office Action on U.S. Appl. No. 13/439,779 Dated Sep. 10, 2014, 13 pages.
Non-Final Office Action on U.S. Appl. No. 14/021,948 Dated Mar. 5, 2015, 13 pages.
Non-Final Office Action on U.S. Appl. No. 14/021,948 Dated Oct. 2, 2014, 17 pages.
Non-Final Office Action on U.S. Appl. No. 14/091,261 Dated Aug. 28, 2015, 8 pages.
Notice of Allowance for U.S. Appl. No. 12/819,977, mail date Jul. 30, 2013, 9 pages.
Notice of Allowance for U.S. Appl. No. 12/949,660 mail date May 13, 2013, 6 pages.
Notice of Allowance for U.S. Appl. No. 13/023,392, mail date May 9, 2013, 6 pages.
Notice of Allowance on U.S. Appl. No. 13/167,571 Dated Aug. 3, 2015, 8 pages.
Notice of Allowance on U.S. Appl. No. 12/916,145 Dated Mar. 13, 2014, 8 pages.
Notice of Allowance on U.S. Appl. No. 13/246,644 Dated Feb. 3, 2014, 6 pages.
Notice of Allowance on U.S. Appl. No. 13/252,092 Dated Nov. 2, 2015, 9 pages.
Notice of Allowance on U.S. Appl. No. 14/021,971 Dated Feb. 24, 2015, 7 pages.
Notice of Allowance on U.S. Appl. No. 14/021,948 Dated Feb. 1, 2016, 5 pages.
Office Action for U.S. Appl. No. 11/699,859, mail date Mar. 15, 2010, 12 pages.
Office Action for U.S. Appl. No. 11/699,860, mail date Aug. 20, 2009, 18 pages.
Office Action for U.S. Appl. No. 11/699,860, mail date Jun. 9, 2010, 9 pages.
Office Action for U.S. Appl. No. 12/819,977, mail date Feb. 13, 2013, 40 pages.
Office Action for U.S. Appl. No. 12/819,977, mail date Sep. 13, 2012, 21 pages.
Office Action for U.S. Appl. No. 12/916,145, mail date Mar. 14, 2013, 21 pages.
Office Action for U.S. Appl. No. 12/916,145, mail date Oct. 8, 2013, 23 pages.
Office Action for U.S. Appl. No. 12/949,660, mail date Nov. 7, 2012, 33 pages.
Office Action for U.S. Appl. No. 13/023,392, mail date Nov. 7, 2012, 31 pages.
Office Action for U.S. Appl. No. 13/077,508, mail date Dec. 3, 2013, 39 pages.
Office Action for U.S. Appl. No. 13/077,508, mail date May 22, 2013, 26 pages.
Office Action for U.S. Appl. No. 13/167,571, mail date Jun. 26, 2013, 40 pages.
Office Action for U.S. Appl. No. 13/167,571, mail date Nov. 5, 2013, 43 pages.
Office Action for U.S. Appl. No. 13/246,644, mail date Oct. 4, 2013, 15 pages.
Office Action for U.S. Appl. No. 13/252,092, mail date Nov. 19, 2013, 12 pages.
Office Action on U.S. Appl. No. 13/252,092 Dated May 12, 2014, 16 pages.
Office Action on U.S. Appl. No. 14/021,971 Dated Oct. 8, 2014. 21 pages.
Quesenberry, SPC Methods of Quality Improvement, 1997, 49 pages.
Rosner, Percentage Points for a Generalized ESD Many-Outlier Procedure, Technometrics, May 1983, 10 pages.
Salsbury, A Controller for HVAC Systems with Embedded Fault Detection Capabilities Based on Simulation Models, Sep. 1999, 8 pages.
Sanchez-Pena et al., "Iterative Identification and Control Design: Methodology and Applications," Identification and Control: The Gap Between Theory and Practice (2007), Chapter 9, 34 pages.
Sane et al., Building Hvac Control Systems—Role of Controls and Optimization, Jun. 2006, 6 pages.
Shakeri et al., "Optimal and Near-Optimal Algorithms for Multiple Fault Diagnosis with Unreliable Tests", IEEE, 1996, pp. 473-482.
Shengwei et al., Parameter Estimation of Internal Thermal Mass of Building Dynamic Models Using Genetic Algorithm:, Elsevier, vol. 47, Issues 13,14 Aug. 2006, pp. 1927-1941.
Sreedharan et al., Comparison of Chiller Models for Use in Model-Based Fault Detection, eScholarship, 2001, 12 pages.
Supplemental Notice of Allowance on U.S. Appl. No. 13/252,092 Dated Nov. 16, 2015, 2 pages.
Teel, Lyapunov Methods in Nonsmooth Optimization, Part I: Quasi-Newton Algorithms for Lipschitz, Regular Functions, Dec. 2000, 8 pages.
Teel, Lyapunov Methods in Nonsmooth Optimization, Part II: Persistenly Exciting Finite Differences, Dec. 2000, 8 pages.
Titica et al., Adaptive Extremum Seeking Control of Fed-Batch Bioreactors, European Journal of Control, 2003, 14 pages.
Tudoroiu et al., "Fault Detection and Diagnostic of Valve Actuators in HVAC System", IEEE, 2005, pp. 1281-1286.
U.S. Department of Energy, International Performance Measurement & Verification Protocol, DOE/GO-102002-1554, 93 pages.
U.S. Department of Energy, M&V Guidelines: Measurement and Verification for Federal Energy Projects, Apr. 2008, 306 pages.
Uraikul et al., Artificial Intelligence for Monitoring and Supervisory Control of Process Systems, 2006, 17 pages.
Wong et al., Building Automation in the 21st Century, IEEE, 1997, 6 pages.
Xu et al., "A Simplified Dynamic Model for Existing Buildings Using CTF and Thermal Network Models", Elsevier, vol. 47, Issue 9, Sep. 2008, pp. 1249-1262.
Notice of Allowance on U.S. Appl. No. 13/485,682 Dated Mar. 14, 2016, 13 pages.
Office Action on U.S. Appl. No. 14/320,203 Dated Mar. 31, 2016, 33 pages.
Notice of Allowance on U.S. Appl. No. 14/091,261 Dated Apr. 25, 2016, 8 pages.
Notice of Allowance on U.S. Appl. No. 13/439779 Dated Nov. 18, 2016, 12 pages.

(56) References Cited

OTHER PUBLICATIONS

Notice of Allowance on U.S. Appl. No. 14/320203 Dated Oct. 4, 2016, 7 pages.

* cited by examiner

Create New Baseline
Plan Name: ATSMPL

| | | |
|---|---|---|
| Name: | rv demo | — 1402 |
| Description: | rv demo | — 1404 |
| Building | Building 1 ▼ | — 1406 |
| Tuning Start Date: | 1/1/2009 | — 1408 |
| Tuning End Date: | 12/31/2009 | — 1410 |
| Utility Type: | Electric ▼ | — 1412 |
| Utility Charge Type: | Consumption ▼ | — 1414 |
| Unit of Measure (Output): | KVAh ▼ | — 1416 |

1400

Save   Cancel

FIG. 14A

Baseline: rv demo

Edit Data
Add Dependent Variable

Return to Baselines
Return to Plan

Variable Name: mtr — 1421
Short Name: mtr — 1422
Variable Source: AdvantageDataProvider - Building 1 Power 2B Demand-INS-ElecMeter2 — 1423
Interval Type: ● Stream  ○ Period  ○ Calendar — 1424
Equipment Name: Building 1 Power 2B-Elec — 1425
Utility Type: Electric — 1426
Charge Type: Consumption
Sample Type: Instantaneous — 1427
Unit of Measure: kW — 1428

Save

FIG. 14B

Baseline: rv demo

Edit Data
Show Dependent Variable
Add Independent Variable

Return to Baselines
Return to Plan

1430

| | |
|---|---|
| Variable Name | OAT — 1431 |
| Short Name | OAT — 1432 |
| Variable Source | WeatherDataProvider - OAT ▶ — 1433 |
| Interval Type | ● Stream  ○ Period  ○ Calendar — 1434 |
| Equipment Name | NOAA/14839/MILWAU — 1435 |
| Unit of Measure | deg F ▶ — 1436 |

Save

FIG. 14C

Baseline: rv demo — 1440

Edit Data
Show Dependent Variable
Add Independent Variable
Show Independent Variables
[Generate Default Model]

Return to Baselines
Return to Plan

Generate First Model

Baseline Data Warnings — 1441

The following issues were discovered while verifying your data. The items listed below will not prevent a model from being created. However, the model may not be as expected.

- Variable set does not contain sufficient overlap. Variable data must contain at least 12 months overlapping data. Current available variable data:

| Variable | Start Date | End Date | Months |
|----------|------------|------------|--------|
| mtr | 1/1/2009 | 12/31/2009 | 12 |
| OAT | 1/1/2009 | 12/31/2009 | 12 |
| OAH | 1/1/2009 | 12/31/2009 | 12 |
| OCC | 3/21/2009 | 12/31/2009 | 10 |

— 1442

[Generate]

There are no models for this baseline.

FIG. 14D

Baseline: rv demo

Edit Data
Show Dependent Variable
Show Independent Variables
Show Sync Data
Show the Model
Configure Data Sources
Show Savings Return to Baselines
Return to Plan

1460

Final Model

▲ Regression Graph
▶ Model Inputs

Variables — 1462
☐ CDD (deg F)
☒ *CDD (deg F)*
☐ DAYS_OFF (DAYS)
☐ ENTHALPY (Btu/lb dry air)
☐ HDD (deg F)
☐ HED (Btu/lb dry air)
☐ OAH (%RH)
☐ OAT (deg F)
☐ OCC (people)

Periods — 1463
☒ 03/21/2009  ☒ 08/18/2009
☒ 04/20/2009  ☒ 09/17/2009
☒ 04/20/2009  ☒ 10/17/2009
☒ 06/19/2009  ☒ 11/16/2009
☒ 07/19/2009

Override — 1464
☐ OVERRIDE RECOMMENDED

Items in bold/italics are recommended

Balance Point Overrides

CED (Btu/lb dry air) [10.5000]  HED (Btu/lb dry air) [10.5000]
CDD (deg F) [55.0000]  HDD (deg F) [55.0000]

| Period | | | Electric Energy KILOVOLTAMPERES_HOURS | | | |
|---|---|---|---|---|---|---|
| Start | End | Ref | Adjusted Baseline | Actual | Savings | Sav % of Baseline |
| 1/1/2010 | 2/1/2010 | Feb | 660,462 | 672,325 | -11,863 | -1.8% |
| 2/1/2010 | 3/1/2010 | Mar | 596,464 | 636,232 | -39,769 | -6.7% |
| 3/1/2010 | 4/1/2010 | Apr | 716,187 | 710,753 | 5,434 | 0.8% |
| 4/1/2010 | 5/1/2010 | May | 734,810 | 725,605 | 9,205 | 1.3% |
| 5/1/2010 | 6/1/2010 | Jun | 908,539 | 844,176 | 64,363 | 7.1% |
| Installation Period Total | | | 3,616,461 | 3,589,092 | 27,369 | 0.8% |
| 6/1/2010 | 7/1/2010 | Jul | 1,005,071 | 985,385 | 19,687 | 2.0% |
| 7/1/2010 | 8/1/2010 | Aug | 1,143,058 | 1,113,847 | 29,212 | 2.6% |
| 8/1/2010 | 9/1/2010 | Sep | 1,142,316 | 1,081,493 | 60,823 | 5.3% |
| 9/1/2010 | 10/1/2010 | Oct | 935,543 | 860,920 | 74,623 | 8.0% |
| 10/1/2010 | 11/1/2010 | Nov | 849,176 | 795,132 | 54,044 | 6.4% |
| 11/1/2010 | 12/1/2010 | Dec | 723,646 | 689,581 | 34,065 | 4.7% |
| 12/1/2010 | 1/1/2011 | Jan | 667,299 | 676,518 | -9,219 | -1.4% |
| Reporting Period Total | | | 6,466,111 | 6,202,875 | 263,236 | 4.1% |
| Grand Total | | | 10,082,572 | 9,791,967 | 290,605 | 2.9% |

SYSTEMS AND METHODS FOR GENERATING AN ENERGY USAGE MODEL FOR A BUILDING

CROSS-REFERENCES TO RELATED PATENT APPLICATIONS

This application is a continuation of U.S. application Ser. No. 13/252,092 filed Oct. 3, 2011, and granted as U.S. Pat. No. 9,286,582 Mar. 15, 2016, which is a continuation-in-part of U.S. application Ser. No. 13/167,571 filed Jun. 23, 2011, and granted as U.S. Pat. No. 9,196,009 Nov. 24, 2015, which is a continuation-in-part of U.S. application Ser. No. 13/023,392 filed Feb. 8, 2011, and granted as U.S. Pat. No. 8,532,808 Sep. 10, 2013, which is a continuation-in-part of U.S. application Ser. No. 12/819,977 filed Jun. 21, 2010, and granted as U.S. Pat. No. 8,600,556 Dec. 3, 2013, which claims the benefit of U.S. Provisional Application No. 61/219,326 filed Jun. 22, 2009, U.S. Provisional Application No. 61/234,217 filed Aug. 14, 2009, and U.S. Provisional Application No. 61/302,854 filed Feb. 9, 2010. The entireties of U.S. application Ser. Nos. 13/252,092, 13/167,571, 13/023,392, 12/819,977, 61/219,326, 61/234,217, and 61/302,854 are incorporated by reference herein.

BACKGROUND

The present disclosure generally relates to energy conservation in a building. The present disclosure relates more specifically to detecting changes in the energy use of a building.

In many areas of the country, electrical generation and transmission assets have or are reaching full capacity. One of the most cost effective ways to ensure reliable power delivery is to reduce demand (MW) by reducing energy consumption (MWh). Because commercial buildings consume a good portion of the generated electricity in the United States, a major strategy for solving energy grid problems is to implement energy conservation measures (ECMs) within buildings. Further, companies that purchase energy are working to reduce their energy costs by implementing ECMs within buildings.

Entities that invest in ECMs typically want to verify that the expected energy savings associated with ECMs are actually realized (e.g., for verifying the accuracy of return-on-investment calculations). Federal, state, or utility based incentives may also be offered to encourage implementation of ECMs. These programs will have verification requirements. Further, some contracts between ECM providers (e.g., a company selling energy-efficient equipment) and ECM purchasers (e.g., a business seeking lower ongoing energy costs) establish relationships whereby the ECM provider is financially responsible for energy or cost savings shortfalls after purchase of the ECM. Accordingly, Applicants have identified a need for systems and methods for measuring and verifying energy savings and peak demand reductions in buildings. Applicants have further identified a need for systems and methods that automatically measure and verify energy savings and peak demand reductions in buildings.

Once a baseline model has been developed for measuring and verifying energy savings in a building, the baseline model may be used to estimate the amount of energy that would have been used by the building if ECMs were not performed. Calculation of the energy avoidance may be rather simple if the baseline model is accurate and routine adjustments related to building usage are included in the baseline model. However, non-routine adjustments related to building usage may not be included in the baseline model, and therefore not included in the energy avoidance calculation. Examples of static factors for which non-routine adjustments may occur include the size of the facility, the hours of operation of the building, the number of employees using the building, the number of computer servers in the building, etc.

Such non-routine adjustments may cause problems during the reporting period when trying to verify energy savings in a building. An unnoticed change (e.g., a non-routing adjustment) in static factors may cause energy savings in the building to be underestimated. This may cause an engineer to miss requirements in a contract or cause a building owner not to invest money in ECMs even though the actual return on investment was high.

Unaccounted for changes in static factors that occur during the baseline period may also negatively impact calculations (e.g., creation of an accurate baseline model). If changes in static factors occur during the baseline period, the statistical regression module used to build the baseline model may essentially be based on a midpoint between energy usage before the change in static factors and energy usage after the change in static factors. Such a situation may lead to an inaccurate estimation of energy usage. For example, if a change in static factors causes a decrease in energy usage, the energy savings of the building due to the ECMs will be overestimated by the baseline model, and the building owner may be disappointed with a resulting return on investment. As another example, if a change in static factors causes an increase in energy usage, the energy savings of the building will be underestimated by the baseline model, and a performance contractor may miss the contractual guarantee of energy savings and be required to reimburse the building owner. Monitoring static factors traditionally requires manual monitoring. This may lead to changes in static factors going unnoticed or incorrectly calculated.

SUMMARY

One embodiment of the invention relates to a method for generating a baseline energy usage model for a building management system. The method includes determining, by a processing circuit, one or more automatically selected variables for use in the baseline energy usage model for predicting energy use in a building. The method also includes causing the display of the one or more automatically selected variables on a user interface device. The method further includes receiving, at the user interface, a selection of one or more variables which differ from the one or more automatically selected variables. The method also includes using the received selection to generate a new baseline energy usage model.

Another embodiment of the invention relates to a system for generating a baseline energy usage model for a building management system. The system includes a processing circuit configured to determine one or more automatically selected variables for use in the baseline energy usage model for predicting energy use in a building. The processing circuit is further configured to cause the display of the one or more automatically selected variables on a user interface device. The processing circuit is further configured to receive, from the user interface, a selection of one or more variables which differ from the one or more automatically selected variables. The processing circuit is further configured to use the received selection to generate a new baseline energy usage model.

Yet another embodiment of the invention relates to computer-readable media with computer-executable instructions embodied thereon that when executed by a computer system perform a method for use with a building management system in a building. The instructions include instructions for determining one or more automatically selected variables for use in the baseline energy usage model for predicting energy use in a building. The instructions also include instructions for causing the display of the one or more automatically selected variables on a user interface device. The instructions further include instructions for receiving a selection of one or more variables which differ from the one or more automatically selected variables. The instructions also include instructions for using the received selection to generate a new baseline energy usage model.

Alternative exemplary embodiments relate to other features and combinations of features as may be generally recited in the claims.

BRIEF DESCRIPTION OF THE FIGURES

The disclosure will become more fully understood from the following detailed description, taken in conjunction with the accompanying figures, wherein like reference numerals refer to like elements, in which:

FIGS. 14A-14K are exemplary graphical user interfaces for a building management system, according to various embodiments.

DESCRIPTION

Figure 1A:
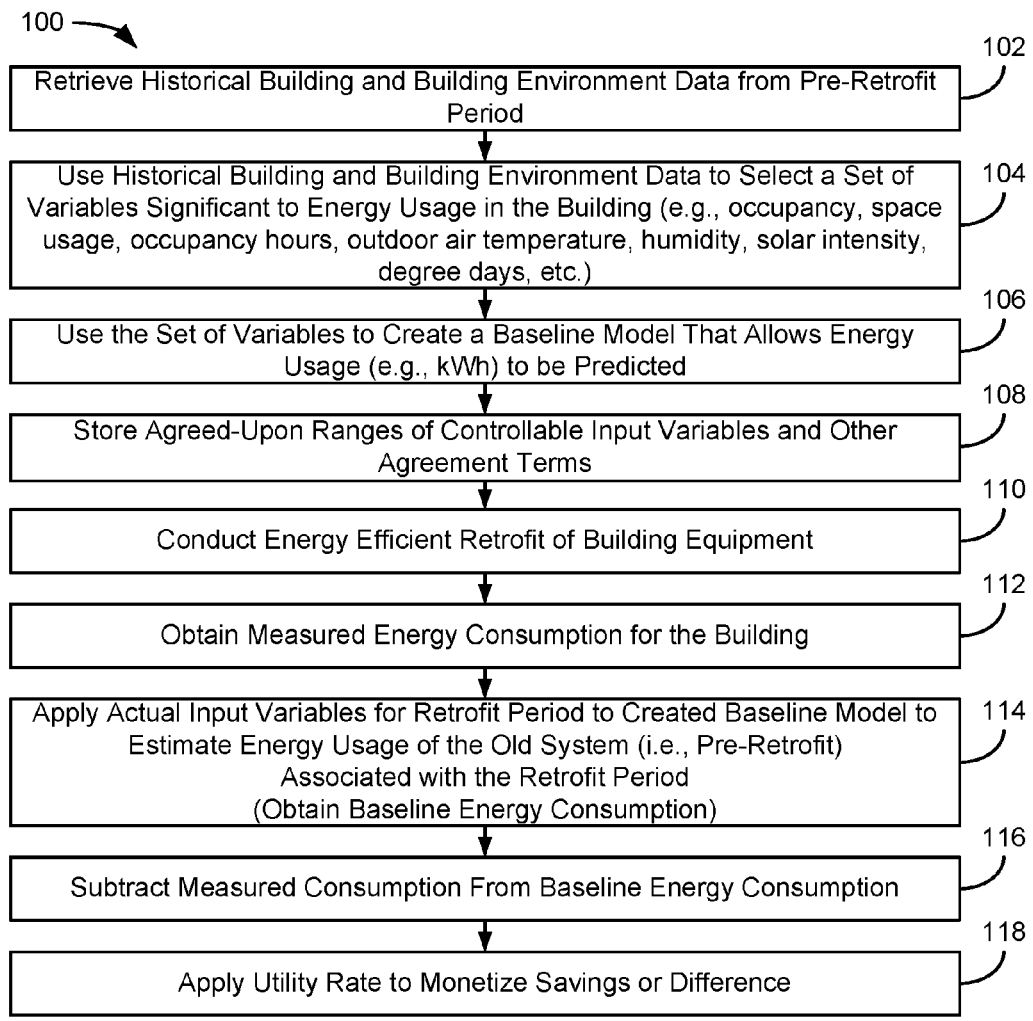
FIG. 1A is a flow chart of a process for measuring and verifying energy savings and peak demand reductions in a building, according to an exemplary embodiment.

Before turning to the figures, which illustrate the exemplary embodiments in detail, it should be understood that the disclosure is not limited to the details or methodology set forth in the description or illustrated in the figures. It should also be understood that the terminology is for the purpose of description only and should not be regarded as limiting.

Referring generally to the figures, a computer system for use with a building management system in a building is provided for automatically detecting changes in factors correlated to energy use that are expected to remain static (e.g., one or more static factors). The computer system includes a processing circuit configured to automatically identify a change in such a static factor of a building based on data received from the building management system. The processing circuit may be configured to communicate the identified change in the static factor to at least one of (a) a module for alerting a user to changes and (b) a module for initiating adjustment to an energy model for a building.

Embodiments of the present disclosure are configured to automatically (e.g., via a computerized process) calculate a baseline model (i.e., a predictive model) for use in measuring and verifying energy savings and peak demand reductions attributed to the implementation of energy conservation measures in building. The calculation of the baseline model may occur by applying a partial least squares regression (PLSR) method to data from a building management system (BMS). The baseline model is used to predict energy consumption and peak demand reductions in a building if an ECM were not installed or used in the building. Actual energy consumption using the ECM is subtracted from the predicted energy consumption to obtain an energy savings estimate or peak demand estimate.

The computerized process can utilize many collinear or highly correlated data points from the BMS to calculate the baseline model using the PLSR algorithm. Data clean-up, data synchronization, and regression analysis activities of the computerized process can be used to prepare the data and to tune the baseline model for improved performance relative to the pertinent data. Further, baseline contractual agreements and violations based on the generated baseline model may be determined with a predetermined statistical confidence.

To provide improved performance over conventional approaches to baseline calculations, an exemplary embodiment includes the following features: one or more computerized modules for automatically identifying which predictor variables (e.g., controllable, uncontrollable, etc.) are the most important to an energy consumption prediction and a computerized module configured to automatically determine the baseline model using the identified predictor variables determined to be the most important to the energy consumption prediction.

While the embodiments shown in the figures mostly relate to measuring and verifying energy consumption and energy savings in a building with the use of expected values as inputs, it should be understood that the systems and methods below may be used to measure and verify peak demand consumption and savings with the use of maximum values as inputs.

Measuring and Verifying Energy Savings in Buildings

Figure 1B:
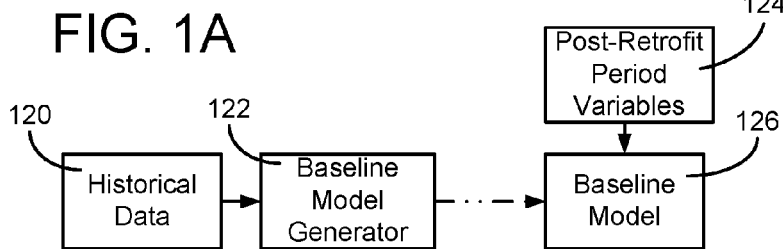
FIG. 1B is a simplified block diagram of a system for completing or facilitating the process of FIG. 1A, according to an exemplary embodiment.
Figure 1B:
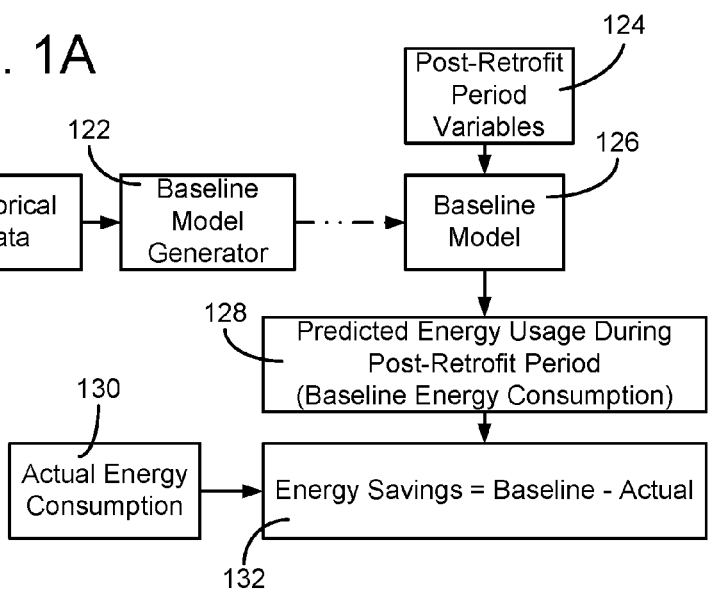

Referring now to FIGS. 1A and 1B, a process 100 for measuring and verifying energy savings and peak demand in a building is shown, according to an exemplary embodiment. Process 100 is shown to include retrieving historical building and building environment data 120 from a pre-retrofit period (step 102). Input variables retrieved in step 102 and used in subsequent steps may include both controllable variables (i.e., variables that may be controlled by a user such as occupancy of an area and space usage) and uncontrollable variables (e.g., outdoor temperature, solar intensity and duration, humidity, other weather occurrences, etc.).

Process 100 further includes using the data obtained in step 102 to calculate and select a set of variables significant to energy usage in the building (step 104). Step 104 may include calculating variables that may be used to determine energy usage in the building. For example, calculated variables such as cooling degree days, heating degree days, cooling energy days, or heating energy days that are representative of energy usage in the building relating to an outside air temperature and humidity may be calculated. Energy days (cooling energy days and heating energy days) are herein defined as a predictor variable that combines both outside air temperature and outside air humidity. Energy days differ from degree days at least in that the underlying integration is based on the calculated outside air enthalpy. Step 104 may include the selection of a set of calculated variables, variables based on a data set from the data received in step 102, or a combination of both. For example, the set of variables may include variables associated with a data set of the building (e.g., occupancy and space usage of an area, outdoor air temperature, humidity, solar intensity) and calculated variables (e.g., occupancy hours, degree days, energy days, etc.). Variables and data that are not significant (e.g., that do not have an impact on energy usage in the building) may be discarded or ignored by process 100.

The set of variables is then used to create a baseline model 126 that allows energy usage or power consumption to be predicted (step 106). With reference to the block diagram of FIG. 1B, baseline model 126 may be calculated using a baseline model generator 122 (e.g., a computerized implementation of a PLSR algorithm).

Process 100 further includes storing agreed-upon ranges of controllable input variables and other agreement terms in memory (step 108). These stored and agreed-upon ranges or terms are used as baseline model assumptions in some embodiments. In other embodiments the baseline model or a resultant contract outcome may be shifted or changed when agreed-upon terms are not met.

Process 100 further includes conducting an energy efficient retrofit of building equipment (step 110). The energy efficient retrofit may include any one or more process or equipment changes or upgrades expected to result in reduced energy consumption by a building. For example, an energy efficient air handling unit having a self-optimizing controller may be installed in a building in place of a legacy air handling unit with a conventional controller.

Once the energy efficient retrofit is installed, process 100 begins obtaining measured energy consumption 130 for the building (step 112). The post-retrofit energy consumption 130 may be measured by a utility provider (e.g., power company), a system or device configured to calculate energy expended by the building HVAC system, or otherwise.

Process 100 further includes applying actual input variables 124 of the post-retrofit period to the previously created baseline model 126 to predict energy usage of the old system during the post-retrofit period (step 114). This step results in obtaining a baseline energy consumption 128 (e.g., in kWh) against which actual energy consumption 130 from the retrofit can be compared.

In an exemplary embodiment of process 100, estimated baseline energy consumption 128 is compared to measured energy consumption 130 by subtracting measured energy consumption 130 during the post-retrofit period from estimated baseline energy consumption 128 (step 116). This subtraction will yield the energy savings 132 resulting from the retrofit. The energy savings 132 resulting from the retrofit is multiplied or otherwise applied to utility rate information for the retrofit period to monetize the savings (step 118). Steps 114 and 116 may further include determining a peak demand reduction in the building and monetizing cost related to the reduction.

Figure 1C:
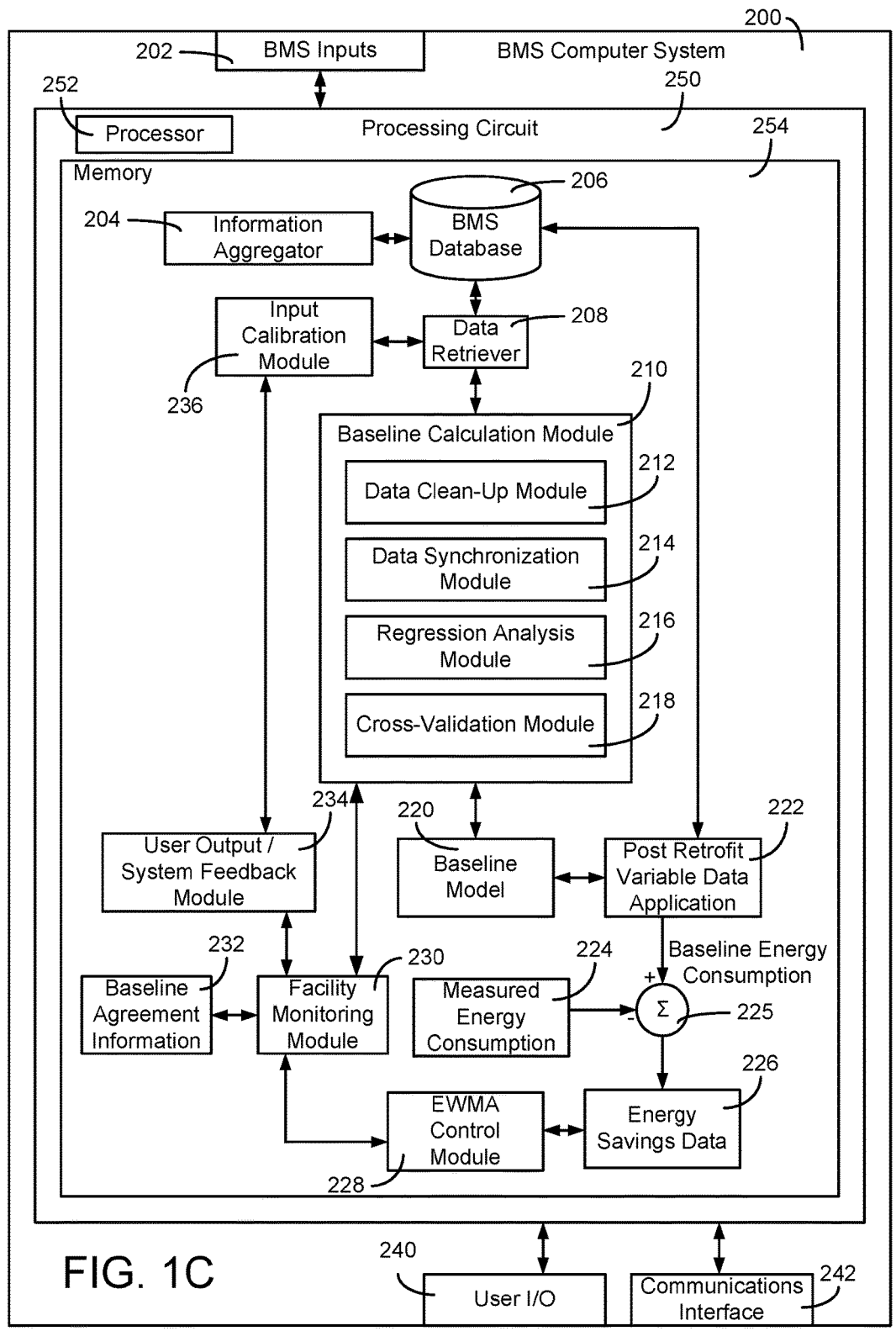
FIG. 1C is a block diagram of a system for measuring and verifying energy savings in a building is shown, according to an exemplary embodiment.

Referring now to FIG. 1C, a more detailed block diagram of a BMS computer system 200 for measuring and verifying energy savings in a building is shown, according to an exemplary embodiment. System 200 includes multiple inputs 202 from disparate BMS sources. Inputs 202 are received and parsed or otherwise negotiated by an information aggregator 204 of the processing circuit 254.

BMS computer system 200 includes a processing circuit 250 including a processor 252 and memory 254. Processor 252 can be implemented as a general purpose processor, an application specific integrated circuit (ASIC), one or more field programmable gate arrays (FPGAs), a group of processing components, or other suitable electronic processing components. Memory 254 is one or more devices (e.g., RAM, ROM, Flash memory, hard disk storage, etc.) for storing data and/or computer code for completing and/or facilitating the various processes, layers, and modules described in the present disclosure. Memory 254 may be or include volatile memory or non-volatile memory. Memory 254 may include database components, object code components, script components, or any other type of information structure for supporting the various activities and information structures described in the present disclosure. According to an exemplary embodiment, memory 254 is communicably connected to processor 252 via processing circuit 250 and includes computer code for executing (e.g., by processing circuit 250 and/or processor 252) one or more processes described herein.

Memory 254 includes information aggregator 204. Information aggregator 204 may serve as middleware configured to normalize communications or data received from the multiple inputs. Information aggregator 204 may be a middleware appliance or module sold by Johnson Controls, Inc. Information aggregator 204 is configured to add data to a BMS database 206. A data retriever 208 is configured to retrieve (e.g., query) data from BMS database 206 and to pass the retrieved data to baseline calculation module 210.

Baseline calculation module 210 is configured to create a baseline model using historical data from the multiple inputs and aggregated in BMS database 206 or other data sources. Some of the information may be received from sources other than building data sources (e.g., weather databases, utility company databases, etc.). The accuracy of the baseline model will be dependent upon errors in the data received.

Baseline calculation module 210 is shown to include data clean-up module 212. Data clean-up module 212 receives data from data retriever 208 and prefilters the data (e.g., data scrubbing) to discard or format bad data. Data clean-up module 212 conducts one or more checks to determine whether the data is reliable, whether the data is in the correct format, whether the data is or includes a statistical outlier, whether the data is distorted or "not a number" (NaN), whether the sensor or communication channel for a set of data has become stuck at some value, and if the data should be discarded. Data clean-up module 212 may be configured to detect errors via, for example, threshold checks or cluster analysis.

Baseline calculation module 210 is further shown to include data synchronization module 214. Data synchronization module 214 receives the data after the data is "cleaned up" by data clean-up module 212 and is configured to determine a set of variables for use in generating the baseline model. The variables may be calculated by module 214, may be based on received data from data retriever 208 and data clean-up module 212, or a combination of both. For example, data synchronization module 214 may determine variables (e.g., cooling and heating degree days and cooling and heating energy days) that serve as a proxy for energy usage needed to heat or cool an area of the building. Data synchronization module 214 may then further determine which type of calculated variable to use (e.g., whether to use degree days or energy days in the regression analysis that generates the baseline model). Further, data synchronization module 214 may identify and use measured data received from data retriever 208 and formatted by data clean-up module for use in the set of variables. For example, module 214 may select temperature data received from data retriever 208 as a predictor variable for energy usage in the building.

Baseline calculation module 210 further includes regression analysis module 216. Regression analysis module 216 is configured to generate the baseline model based on the set of variables from data synchronization module 214. According to one exemplary embodiment, a partial least squares regression (PLSR) method may be used to generate the baseline model. According to other embodiments, other regression methods (e.g., a principal component regression (PCR), ridge regression (RR), ordinary least squares regression (OLSR)) are also or alternatively used in the baseline model calculation. The PLSR method is based on a linear transformation from the set of variables from module 214 to a linear model that is optimized in terms of predictivity.

Baseline calculation module 210 further includes cross-validation module 218. Cross-validation module 218 is configured to validate the baseline model generated by regression analysis module 216. Validation of the baseline model may include ensuring there is no overfitting of the baseline model (e.g., having too many variables or inputs influencing the model), determining a correct order or number of components in the model, or conducting other tests or checks of the baseline module output by regression analysis module 216. Baseline calculation module 210 and submodules 212-218 are shown in greater detail in FIG. 2 and subsequent figures.

Post retrofit variable data 222 is applied to baseline model 220 generated by baseline calculation module 210 (e.g., data relating to estimated energy use of the building) to obtain a resultant baseline energy consumption. Measured energy consumption 224 from the building is subtracted from the resultant baseline energy consumption at element 225 to obtain energy savings data 226. Energy savings data 226 may be used to determine payments (e.g., from the retrofit purchaser to the retrofit seller), to demonstrate the new equipment's compliance with a guaranteed level of performance, or as part of a demand-response commitment or bid validation. Energy savings data 226 may relate to overall energy consumption and/or peak demand reduction.

Energy savings data 226 or other information from the prior calculations of the system is used to monitor a building after retrofit to ensure that the facility occupants have not violated the terms of the baseline agreement (e.g., by substantially adding occupants, by changing the building space use, by bringing in more energy using devices, by substantially changing a setpoint or other control setting, etc.). Conventionally this involves making periodic visits to the facilities, reviewing job data, and/or making specialized measurements. Because visits and specialized reviews are time consuming, they are often not done, which puts any savings calculations for a period of time in question.

System 200 includes an Exponentially Weighted Moving Average (EWMA) control module 228 configured to automate a baseline term validation process. EWMA control module 228 monitors the difference between the predicted and measured consumption. Specifically, EWMA control module 228 checks for differences between the predicted and measured consumption that are outside of predetermined statistical probability thresholds and provides the results to a facility monitoring module 230. Any statistically unlikely occurrences can cause a check of related data against baseline agreement information 232, used to update baseline agreement information, or are provided to a user output/system feedback module 234. User output/system feedback module 234 may communicate alarm events to a user in the form of a displayed (e.g., on an electronic display) EWMA chart configured to highlight unexpected shifts in the calculated energy savings. Input calibration module 236 may receive feedback from module 234 and additionally provide data to data retriever 208 regarding instructions to add or remove variables from consideration for the baseline model in the future. In other embodiments, different or additional control modules may implement or include statistical process control approaches other than or in addition to EWMA to provide baseline validation features.

BMS computer system 200 further includes a user input/output (I/O) 240. User I/O 240 is configured to receive a user input relating to the data set used by baseline calculation module 210 and other modules of system 200. For example, user I/O 240 may allow a user to input data into system 200, edit existing data points, etc. System 200 further includes communications interface 242. Communications interface 242 can be or include wired or wireless interfaces (e.g., jacks, antennas, transmitters, receivers, transceivers, wire terminals, etc.) for conducting data communications with the BMS, subsystems of the BMS, or other external sources via a direct connection or a network connection (e.g., an Internet connection, a LAN, WAN, or WLAN connection, etc.).

Figure 2:
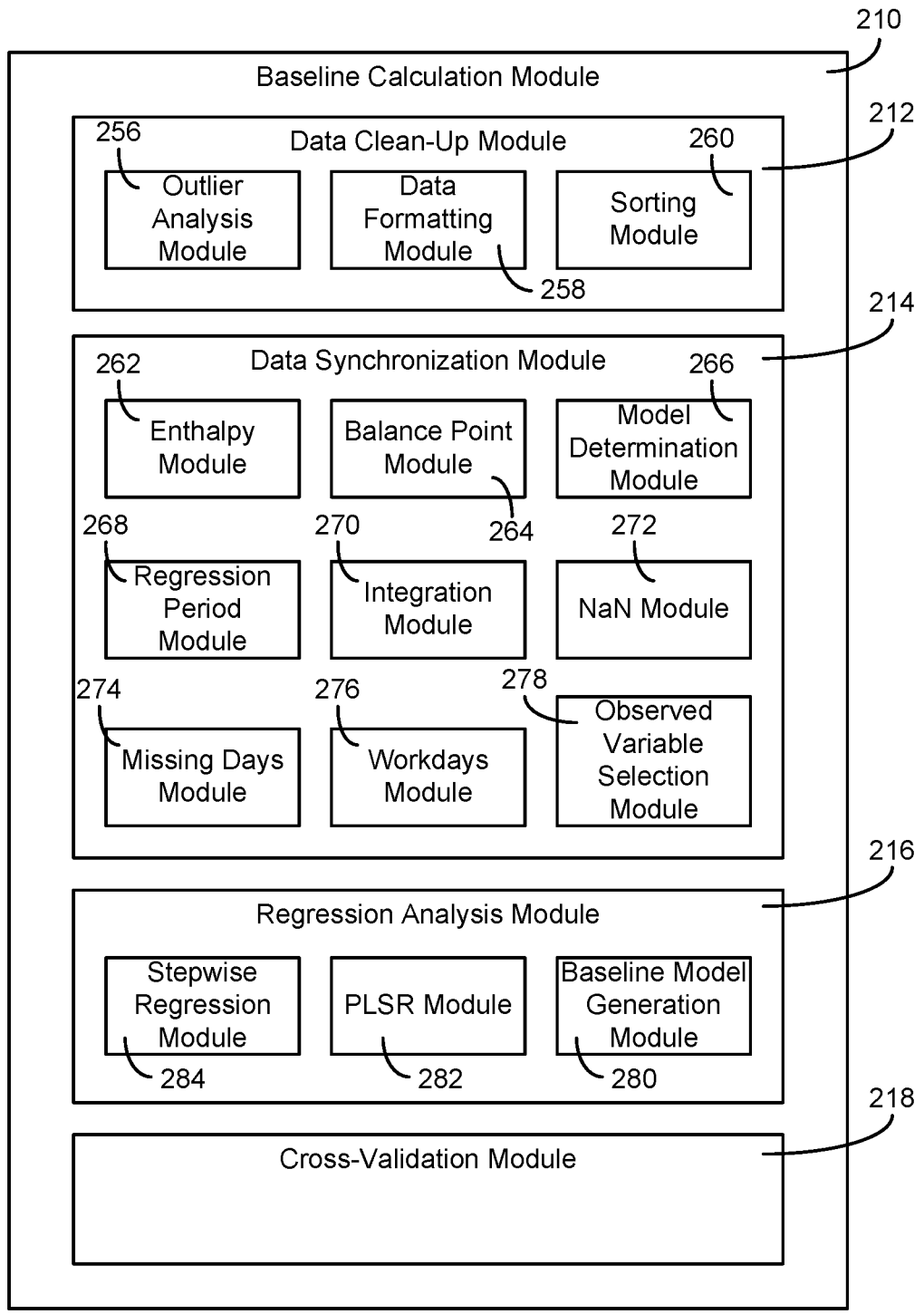
FIG. 2 is a detailed block diagram of the baseline calculation module of FIG. 1C, according to an exemplary embodiment.

Referring now to FIG. 2, baseline calculation module 210 is shown in greater detail, according to an exemplary embodiment. Baseline calculation module 210 includes data clean-up module 212. Data clean-up module 212 generally receives data from the BMS computer system of the building and pre-filters the data for data synchronization module 214 and the other modules of baseline calculation module 210. Data clean-up module 212 includes outlier analysis module 256, data formatting module 258, and sorting module 260 for pre-filtering the data. Data clean-up module 212 uses sub-modules 256-260 to discard or format bad data by normalizing any formatting inconsistencies with the data, removing statistical outliers, or otherwise preparing the data for further processing. Data formatting module 258 is configured to ensure that like data is in the same correct format (e.g., all time-based variables are in the same terms of hours, days, minutes, etc.). Sorting module 260 is configured to sort data for further analysis (e.g., place in chronological order, etc.).

Outlier analysis module 256 is configured to test data points and determine if a data point is reliable. For example, if a data point is more than a threshold (e.g., three standard deviations, four standard deviations, or another set value) away from the an expected value (e.g., the mean) of all of the data points, the data point may be determined as unreliable and discarded. Outlier analysis module 256 may further calculate the expected value of the data points that each data point is to be tested against. Outlier analysis module 256 may be configured to replace the discarded data points in the data set with a NaN or another flag such that the new value will be skipped in further data analysis.

According to another exemplary embodiment, outlier analysis module 256 can be configured to conduct a cluster analysis. The cluster analysis may be used to help identify and remove unreliable data points. For example, a cluster analysis may identify or group operating states of equipment (e.g., identifying the group of equipment that is off). A cluster analysis can return clusters and centroid values for the grouped or identified equipment or states. The centroid values can be associated with data that is desirable to keep rather than discard. Cluster analyses can be used to further automate the data clean-up process because little to no configuration is required relative to thresholding.

Data clean-up module 212 may further include any other pre-filtering tasks for sorting and formatting the data for use by baseline calculation module 210. For example, data clean-up module 212 may include an integrator or averager which may be configured to smooth noisy data (e.g., a varying number of occupants in a building area). The integrator or averager may be used to smooth data over a desired interval (e.g., a 15 minute average, hourly average, etc.).

Baseline calculation module 210 includes data synchronization module 214. Data synchronization module 214 is configured to select a possible set of variables estimated to be significant to energy usage in the building. Data synchronization module 214 selects the possible set of variables (e.g., a preliminary set of variables) that are provided to stepwise regression module 284 for selection of the actual set of variables to use to generate the baseline model. According to various exemplary embodiments, the selection of some or all of the set of variables to use for baseline model generation may occur in data synchronization module 214, stepwise regression analysis 284, or a combination of both. Data synchronization module 214 includes sub-modules for calculating predictor variables and selecting one or more of the predicted variables to include in the possible set of variables. Data synchronization module 214 further includes sub-modules for selecting observed (e.g., measured) data points for the set of variables.

According to one exemplary embodiment, data synchronization module 214 is configured to calculate degree days and energy days (e.g., a predictor variable associated with heating or cooling of a building) and determine which of these predictors should be used to yield a better baseline model. The outputs of data synchronization module 214 (e.g., inputs provided to regression analysis module 216) may include the measurements or predictor variables to use, a period of time associated with the measurements or predictor variables, and errors associated with the data included in the measurements or predictor variables.

Data synchronization module 214 includes enthalpy module 262, balance point module 264, model determination module 266, regression period module 268, integration module 270, NaN module 272, missing days module 274, workdays module 276, and observed variable selection module 278. Enthalpy module 262 is configured to calculate an enthalpy given a temperature variable and a humidity variable. Enthalpy module 262 combines an outdoor temperature variable and an outside air humidity variable via a nonlinear transformation or another mathematical function into a single variable. The single variable may then be used by baseline calculation module 210 as a better predictor of a building's energy use than using both temperature and humidity values separately.

Balance point module 264 is configured to find an optimal balance point for a calculated variable (e.g., a variable based on an enthalpy value calculated in enthalpy module 262, an outdoor air temperature variable, etc.). Balance point module 264 determines a base value for the variable for which the estimated variance of the regression errors is minimized. Model determination module 266 is configured to determine a type of baseline model to use for measuring and verifying energy savings. The determination may be made based on an optimal balance point generated by balance point module 264. Modules 264, 266 are described in greater detail in FIGS. 4A-4E.

Regression period module 268 is configured to determine periods of time that can be reliably used for model regression by baseline calculation module 210 and data synchronization module 214. Regression period module 268 may identify period start dates and end dates associated with calculated and measured variables for the data synchronization. Regression period module 268 may determine the start date and end date corresponding with the variable with the longest time interval (e.g., the variable for which the most data is available). For example, regression period module 268 determines the period by finding the period of time which is covered by all variables, and providing the start date and end date of the intersection to data synchronization module 214. Regression period module 268 is further configured to identify data within the periods that may be erroneous or cannot be properly synchronized.

Integration module 270 is configured to perform an integration over a variable structure from a given start and end time period (e.g., a time period from regression period module 268). According to an exemplary embodiment, integration module 270 uses a trapezoidal method of integration. Integration module 270 may receive an input from balance point module 264 or another module of data synchronization module 214 for performing an integration for a balance point determined by balance point module 264. NaN module 272 is configured to identify NaN flags in a variable structure. NaN module 272 is further configured to replace the NaN flags in the variable structure via interpolation. NaN module 272 may receive an input from, for example, data clean-up module 212, and may be configured to convert the outlier variables and NaNs determined in module 212 into usable data points via interpolation.

Missing days module 274 is configured to determine days for which is there is not enough data for proper integration performance. Missing days module 274 compares the amount of data for a variable for a given day (or other period of time) and compares the amount to a threshold (e.g., a fraction of a day) to make sure there is enough data to accurately calculate the integral. Workdays module 276 is configured to determine the number of work days in a given interval based on the start date and end date of the interval. For example, for a given start date and end date, workdays module 276 can determine weekend days and holidays that should not figure into the count of number of work days in a given interval. Modules 274, 276 may be used by data synchronization module 214 to, for example, identify the number of days within a time interval for which there exists sufficient data, identify days for which data should not be included in the calculation of the baseline model, etc.

Observed variable selection module 278 is configured to receive observed or measured data from the BMS and determine which observed data should be used for baseline model generation based on the selection of calculated data in modules 264-266. For example, when balance point module 264 determines a calculated variable, observed variable selection module 278 is configured to determine if there is enough predictor variable data for the observed variable. According to an exemplary embodiment, the predictor variable data and observed variable data for a specific variable (e.g., temperature) may only be used when sufficient predictor variable data (e.g., degree days) for the observed variable data exists. For example, if the predictor variable data is available over a specified range (e.g., 20 days, 2 months, or any other length of time), then module 278 may determine there is enough predictor variable data such that the predictor variable data and observed variable data can be used for baseline model generation. Observed variable selection module 278 is described in greater detail in FIG. 3A.

Baseline calculation module 210 further includes regression analysis module 216. Regression analysis module 216 is configured to generate the baseline model via a PLSR method. Regression analysis module 216 includes baseline model generation module 280 for generating the baseline model and PLSR module 282 for receiving data from data synchronization module 214, applying the data to a PLSR method for, and providing baseline model generation module 280 with the method output.

Baseline model generation module 280 is configured to generate the baseline model. Baseline model generation module 280 is configured to use PLSR module 282 to perform PLSR of the data and stepwise regression module 284 to determine the predictor variables for the baseline model and to eliminate insignificant variables. Module 280 is configured to provide, as an output, the baseline model along with calculating various statistics for further analysis of the baseline model (e.g., computing the number of independent observations of data in the data set used, computing the uncertainty of the model, etc.).

Regression analysis module 216 is further shown to include stepwise regression module 284. Stepwise regression module 284 is configured to perform stepwise linear regression in order to eliminate statistically insignificant predictor variables from an initial set of variables selected by data synchronization module 214. In other words, stepwise regression module 284 uses stepwise regression to add or remove predictor variables from a data set (e.g., the data set from data synchronization module 214) for further analysis.

A stepwise regression algorithm of module 284 is configured to add or remove predictor variables from a set for further analysis in a systematic way. At each step the algorithm conducts statistical hypothesis testing (e.g., by computing a probability of obtaining a test statistic, otherwise known as a p-value, of an F-statistic, which is used to describe the similarity between data values) to determine if the variable should be added or removed. For example, for a particular variable, if the variable would have a zero (or near zero) coefficient if it were in the baseline model, then the variable is removed from consideration for the baseline model. According to various alternative embodiments, other approaches to stepwise regression are used (e.g., factorial designs, principal component analysis, etc.). Referring also to FIG. 1C, instructions to add or remove variables from future consideration based on the analysis of module 216 may be provided to, for example, input calibration module 236 for affecting the queries run by data retriever 208.

PLSR module 282 is configured to receive a subset of the variables from data synchronization module 214 which has been selected by stepwise regression module 284, and to compute a partial least squares regression of the variables in order to generate a baseline model. According to various alternative embodiments, other methods (e.g., a principal component regression (PCR), ridge regression (RR), ordinary least squares regression (OLSR)) are also or alternatively used in the baseline model calculation instead of a PLSR method.

Baseline models calculated using historical data generally include four possible sources of error: modeling errors, sampling errors, measurement errors, and errors relating to multiple distributions in the data set. Sampling errors occur when the number of data samples used is too small or otherwise biased. Measurement errors occur when there is sensor or equipment inaccuracy, due to physics, poor calibration, a lack of precision, etc. Modeling errors (e.g., errors associated with the data set) occur due to inaccuracies and inadequacies of the algorithm used to generate the model. Errors relating to multiple distributions in the data set occur as more data is obtained over time. For example, over a one to three year period, data may be collected for the period and older data may become obsolete as conditions change. The older data may negatively impact the prediction capabilities of the current baseline model.

Conventional baseline energy calculations use ordinary least squares regression (OLS). For example, ASHRAE Guideline 14-2002 titled "Measurement of Energy Demand Savings" and "The International Performance Measurement and Verification Protocol" (IPMVP) teach that OLS should be used for baseline energy calculations. For OLS:

$$y = 1^* \beta_0 + X\beta_{OLS} + \epsilon$$

where y is a vector of the response variables, X is a matrix consisting of n observations of the predictor variables, $\beta_0$ is an unknown constant, $\beta_{OLS}$ is an unknown vector of OLS regression coefficients, and $\epsilon$ is a vector of independent normally distributed errors with zero mean and variance $\sigma^2$. The regression coefficients are determined by solving the following equation:

$$\beta_{OLS} = (X^T X)^{-1} X^T y.$$

PLSR may outperform OLS in a building environment where the inputs to an energy consumption can be many, highly correlated, or collinear. For example, OLS can be numerically unstable in such an environment resulting in large coefficient variances. This occurs when $X^T X$, which is needed for calculating OLS regression coefficients, becomes ill-conditioned in environments where the inputs are many and highly correlated or collinear. In alternative embodiments, PCR or RR are used instead of or in addition to PLSR to generate a baseline model. In the preferred embodiment PLSR was chosen due to its amenability to automation, its feature of providing lower mean square error (MSE) values with fewer components than methods such as PCR, its feature of resolving multicollinearity problems attributed to methods such as OLS, and due to its feature of using variance in both predictor and response variables to construct model components.

Baseline calculation module 210 is further shown to include cross-validation module 218. Cross-validation module 218 is configured to validate the baseline model generated by regression analysis module 216 (e.g., there is no overfitting of the model, the order and number of variables in the model is correct, etc.) by applying data for a test period of time (in the past) to the model and determining whether the model provides a good estimate of energy usage. Cross-validation of the baseline model is used to verify that the model will fit or adequately describe varying data sets from the building. According to one exemplary embodiment, cross-validation module 218 may use a K-fold cross-validation method. The K-fold cross validation method is configured to randomly partition the historical data provided to baseline calculation module 210 into K number of subsamples for testing against the baseline model. In other embodiments, a repeated random subsampling process (RRSS), a leave-one-out (LOO) process, a combination thereof, or another suitable cross-validation routine may be used by cross-validation module 218.

Figure 3A:
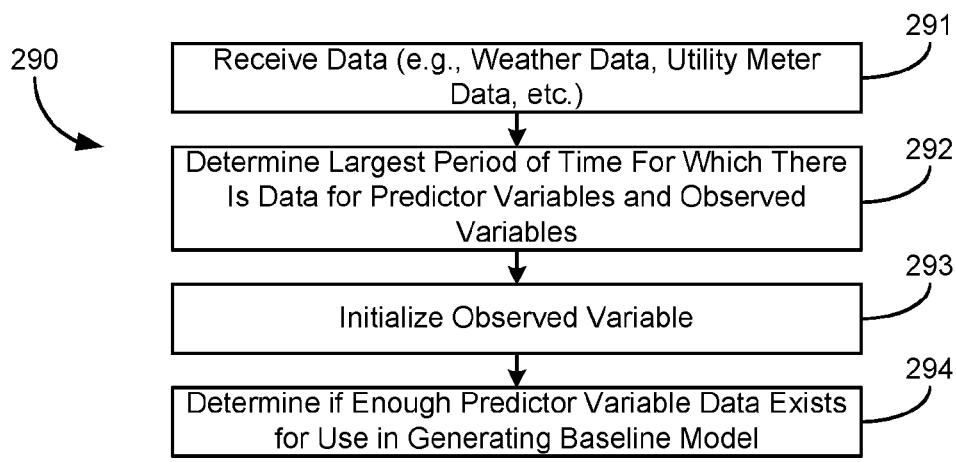
FIG. 3A is a flow chart of a process for selecting observed variable data to use for generation of the baseline model, according to an exemplary embodiment.

Referring now to FIG. 3A, a flow chart of a process 290 for determining observed or measured variables to use in generation of a baseline model is shown, according to an exemplary embodiment. Process 290 is configured to select observed variables based on predictor variables generated by the data synchronization module of the baseline calculation module. Process 290 includes receiving data (step 291). Process 290 further includes determining the largest period of time for which there is data for predictor variables and observed variables (step 292). The period of time determined in step 292 may represent a period of time for which there will be enough predictor variable data for the corresponding data received in step 291. Step 292 may include, for example, removing insufficient data points and determining the longest period for which there is enough data. For example, if there is too little data for one day, it may be determined that a predictor variable for that day may not be generated and therefore the day may not be used in ultimately determining a baseline model.

Process 290 includes initializing the observed variable (step 293). Initializing the observed variable includes determining a start and end point for the observed variable data, determining the type of data and the units of the data, and any other initialization step. Step 293 is used to format the received data from step 291 such that the observed data is in the same format as the predictor variable data.

Process 290 includes determining if enough predictor variable data exists (step 294). For example, if there is enough predictor variables (e.g., energy days) for a set period of time (e.g., 20 days), then process 290 determines that the predictor variables and its associated observed variable (e.g., enthalpy) may be used for baseline model generation.

Figure 3B:
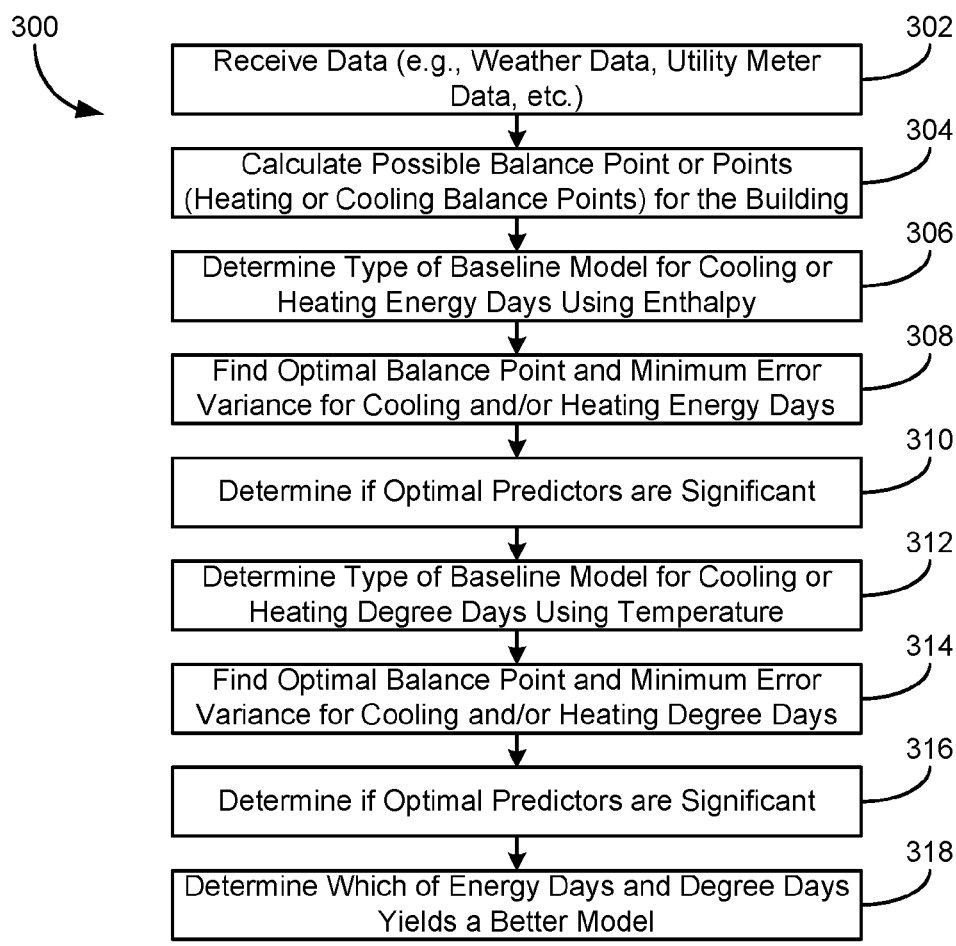
FIG. 3B is a flow chart of a process for selecting calculated variable data to use for generation of the baseline model, according to an exemplary embodiment.

Referring now to FIG. 3B, a flow chart of a process 300 for determining calculated variables to use in generation of a baseline model is shown, according to an exemplary embodiment. Selecting some calculated variables for inclusion in a regression analysis used to generate a baseline model may provide better results than selecting some other calculated variables for inclusion, depending on the particulars of the building and its environment. In other words, proper selection of calculated variables can improve a resultant baseline model's ability to estimate or predict a building's energy use. Improvements to energy use prediction or estimation capabilities can improve the performance of algorithms that rely on the baseline model. For example, an improved baseline model can improve the performance of demand response algorithms, algorithms for detecting abnormal energy usage, and algorithms for verifying the savings of an energy conservation measure (e.g., M&V calculations, etc.).

Process 300 provides a general process for selecting calculated variables to use in generation of a baseline model. FIGS. 4A-4E provide a more detailed view of process 300. The output of process 300 (and of the processes shown in FIGS. 4A-4E) is the selection of calculated variables to use to generate the baseline model. Particularly, in an exemplary embodiment, process 300 selects between cooling energy days, heating energy days, cooling degree days, and heating degree days. The selection relies on a calculation of balance points (e.g., optimal base temperatures or enthalpies) of a building and using the calculations to calculate the potential variables (e.g., the energy days and degree days) for selection into the set of variables used to generate the baseline model.

The calculation and selection of calculated variables (for inclusion into the baseline model generation) is based in part on calculated balance points and may be accomplished in different ways according to different exemplary embodiments. According to one embodiment, a nonlinear least squares method (e.g., a Levenburg-Marquardt method) may be used to find the best calculated variables. Such a method, for example, may use daily temperature and energy meter readings to calculate balance points. A nonlinear least squares method may then be applied to the balance points to generate and select the appropriate calculated variables.

According to another embodiment, an optimization scheme may be used to determine the best balance point or points. The optimization scheme may include an exhaustive search of the balance points, a gradient descent algorithm applied to the balance points to find a local minimum of the balance points, a generalized reduced gradient method to determine the best balance point, and a cost function that is representative of the goodness of fit of the best balance point. The cost function may be an estimated variance of the model errors obtained from an iteratively reweighted least squares regression method, according to an exemplary embodiment. The iteratively reweighted least squares regression method is configured to be more robust to the possibility of outliers in the set of balance points generated and can therefore provide more accurate selections of calculated variables.

The optimization scheme algorithm may also use statistics (e.g., a t-statistic representative of how extreme the estimated variance is) to determine if building energy use is a function of, for example, heating or cooling. The statistics may be used to determine which balance points to calculate as necessary (e.g., calculating balance points relating to heating if statistics determine that building energy use is based on heating the building.

Referring to FIG. 3B and FIGS. 4A-4E, an optimization scheme is described which uses a golden section search rule to calculate energy days and degree days and to determine which of the calculated variables to use based on a statistics to determine the type of energy use in the building.

Process 300 includes receiving data such as temperature data, humidity data, utility meter data, etc. (step 302). Process 300 further includes using the received data to calculate possible balance points (step 304). For example, step 304 may include using the received temperature data and humidity data to calculate an enthalpy. As another example, step 304 may include determining an optimal base temperature using the received temperature data. Process 300 further includes steps 306-318 for determining a calculated variable to use for baseline model generation based on enthalpy and temperature data calculated in step 304; according to various exemplary embodiments, steps 306-318 of process 300 may be used to determine calculated variables based on other types of balance points.

Process 300 includes steps 306-310 for determining optimal predictor variables based on the enthalpy calculated in step 304. Process 300 includes determining a type of baseline model for cooling or heating energy days using the enthalpy (step 306). Process 300 further includes finding an optimal enthalpy balance point or points and minimum error variance for the resultant cooling and/or heating energy days (step 308). The optimal enthalpy balance point relates to, for example, a preferred base enthalpy of the building, and the minimum error variance relates to the variance of the model errors at the optimal balance point (determined using IRLS). Process 300 further includes determining if the optimal predictors determined in step 308 are significant (step 310).

Process 300 includes steps 312-316 for determining optimal predictor variables based on a temperature (e.g., temperature data received in step 302 by baseline calculation module 210). Process 300 includes determining a type of baseline model for cooling or heating degree days using the temperature (step 312). Process 300 further includes finding an optimal temperature balance point and minimum error variance for the cooling and/or heating degree days (step 314). Process 300 also includes determining if the optimal predictors determined in step 314 are significant (step 316). Using the results of steps 306-316, process 300 determines which of energy days and degree days yields a better (e.g., more accurate) baseline model (step 318) when used by baseline calculation module 210.

Referring now to FIGS. 4A-4E, a detailed flow chart of process 300 of FIG. 3B is shown, according to an exemplary embodiment. Process 400 of FIGS. 4A-4E is shown using enthalpy and temperature to determine the balance points. The balance points are used to calculate the optimal degree or energy days predictor variable and in determining which calculated variables to use for baseline model generation. According to other embodiments, other methods may be used to determine the balance points. Referring more specifically to process 400 shown in FIG. 4A, process 400 may calculate an enthalpy using temperature data input 402 and humidity data 404 (step 408). According to an exemplary embodiment, enthalpy may be calculated using a psychometric calculation. Process 400 includes receiving meter data 406 and enthalpy data and averages the data over all periods (step 410) for use in the rest of process 400.

Process 400 includes determining possible baseline model types (i.e., whether both the heating and cooling balance points are needed to describe energy use in the building) based on the calculated enthalpy (step 412). For example, step 412 includes the method of determining a predictor variable associated with minimum energy use and then sorting all of the calculated variables (e.g., the variables determined in steps 408-410) and finding where the minimum energy predictor variable ranks compared to the other predictor variables.

Process 400 includes determining if using cooling base enthalpy in the baseline model calculation is feasible (step 414). If the predictor variable associated with the minimum energy found in step 412 is close enough to the maximum calculated variable, then it may be determined that a cooling base does not exist because cooling does not significantly impact energy consumption in the building or it cannot be found due to lack of data. If using the cooling base enthalpy is not feasible, the cooling base enthalpy is set to NaN and the minimum sigma is set to infinity (step 428) such that both values will be "ignored" later by process 400.

If using a cooling base enthalpy is feasible, a range of feasible cooling base enthalpies is set (step 416). The range may vary from the maximum average monthly enthalpy to ten units less than the predictor variable associated with the minimum energy use.

Process 400 includes finding the base temperature of the predictor variable (e.g., via balance point module 264) by finding the base enthalpy for which the estimated variance of the regression errors is minimized. According to one exemplary embodiment, the minimization may be performed using the golden section search rule. Process 400 includes initializing the golden section search (step 418) and iterating the golden section search (step 420) until a desired base tolerance has been reached (step 422). The base tolerance may be predetermined via a logarithmic function of the size of the range, according to an exemplary embodiment. The golden section search of steps 420-422 provides an optimal balance point. The optimal balance point is then used to calculate a measure of variability and determine the t-statistic for the predictor variable.

When a desired base tolerance has been reached for the golden section search (step 422), process 400 may determine whether the t-statistic is significant (step 424). If the t-statistic is not significant, the minimum sigma representative of the t-statistic is set to infinity (step 428). If the t-statistic is significant, it is used in a later step of process 400 to determine the best predictor variable to use for the baseline model.

Figure 4A:
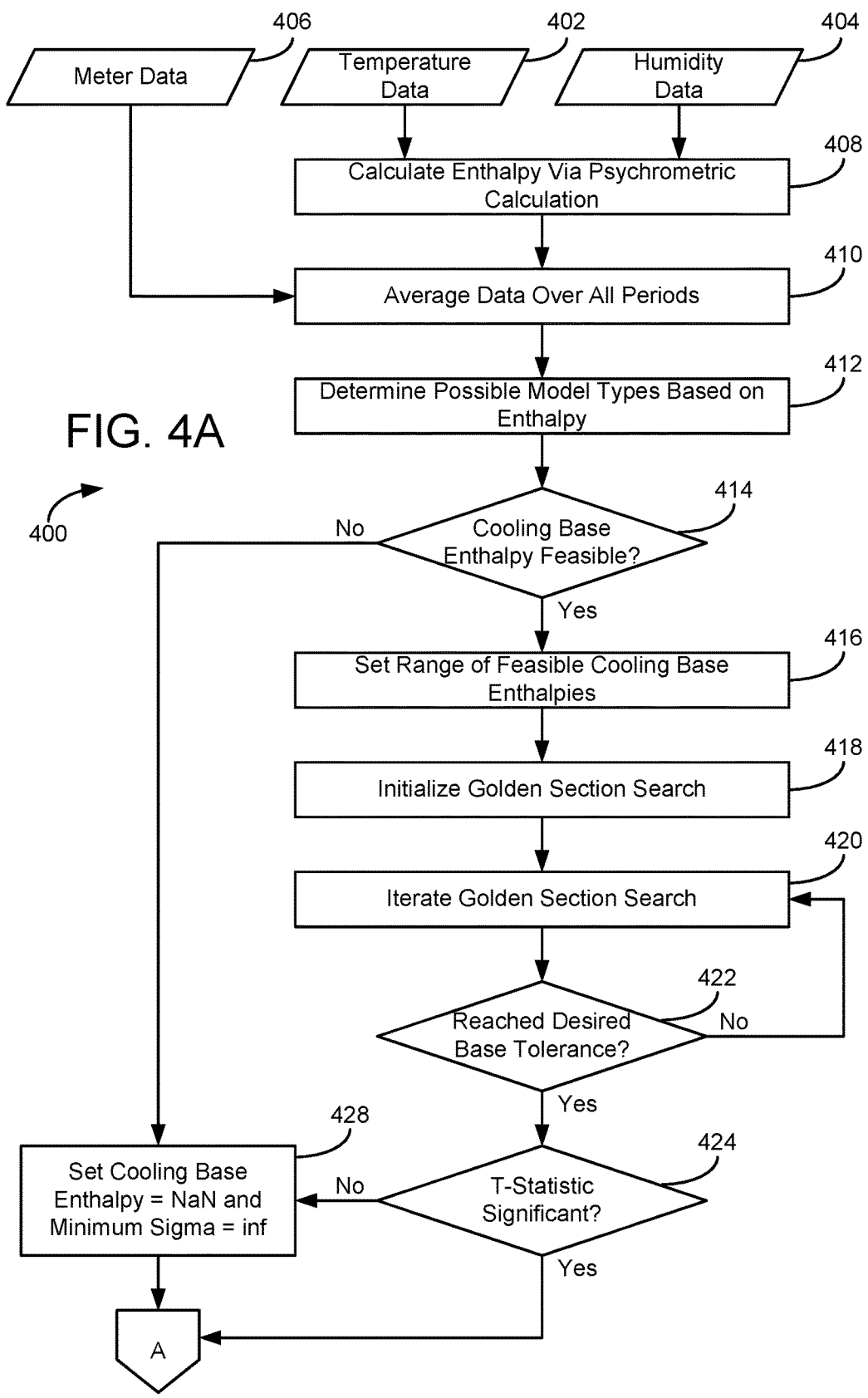
FIGS. 4A-4E are more detailed flow charts of the process of FIG. 3B, according to an exemplary embodiment.
Figure 4B:
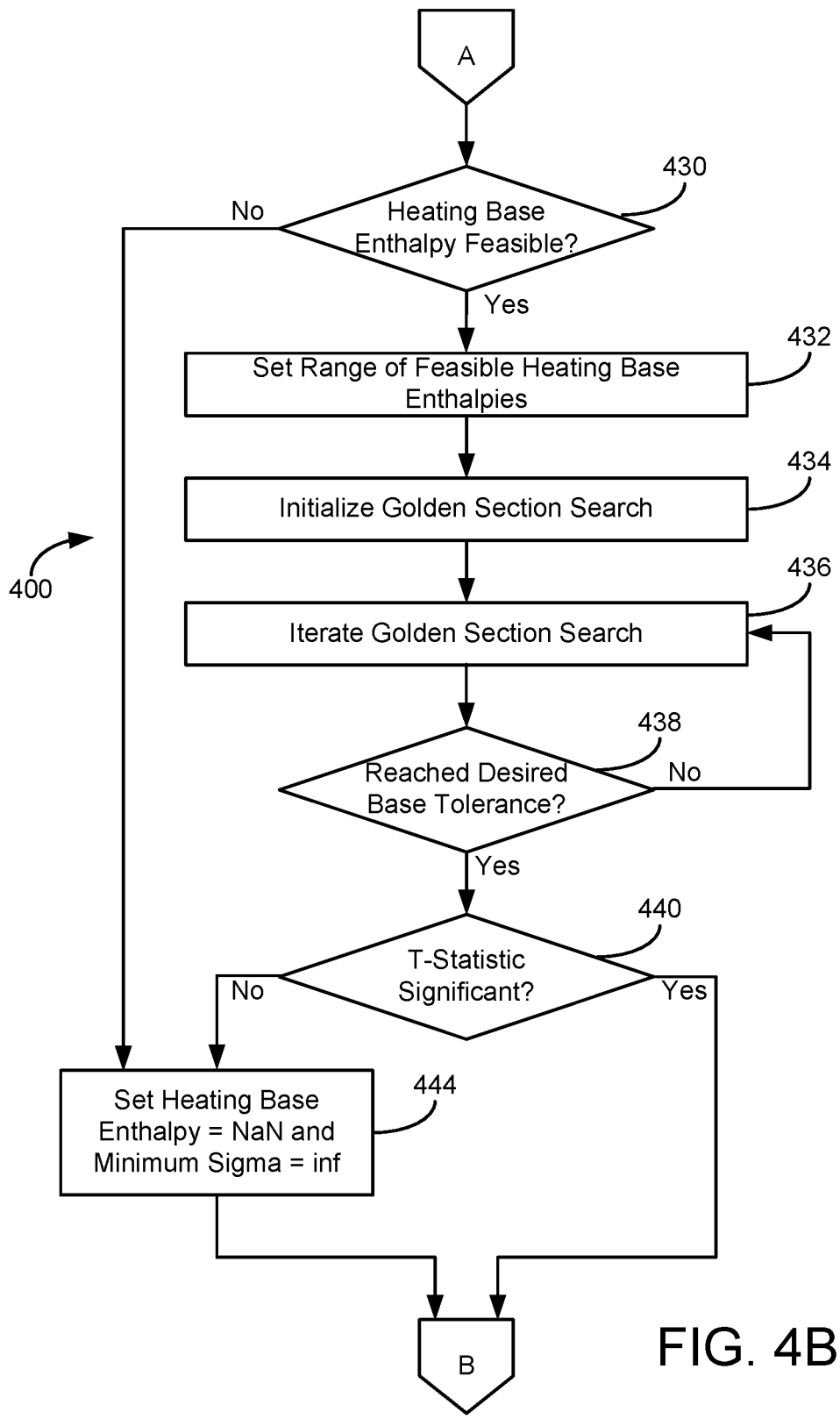
Figure 4C:
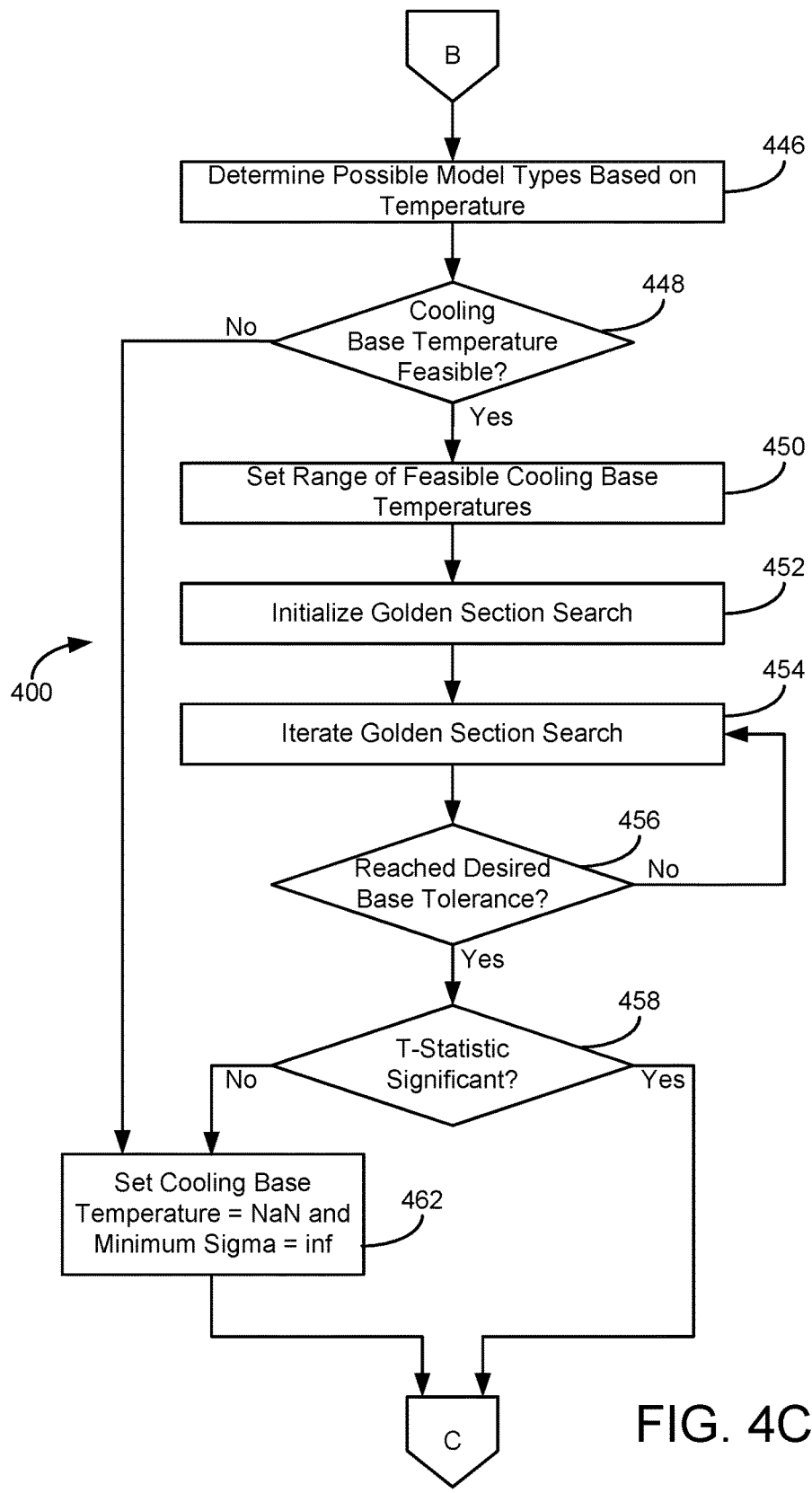
Figure 4D:
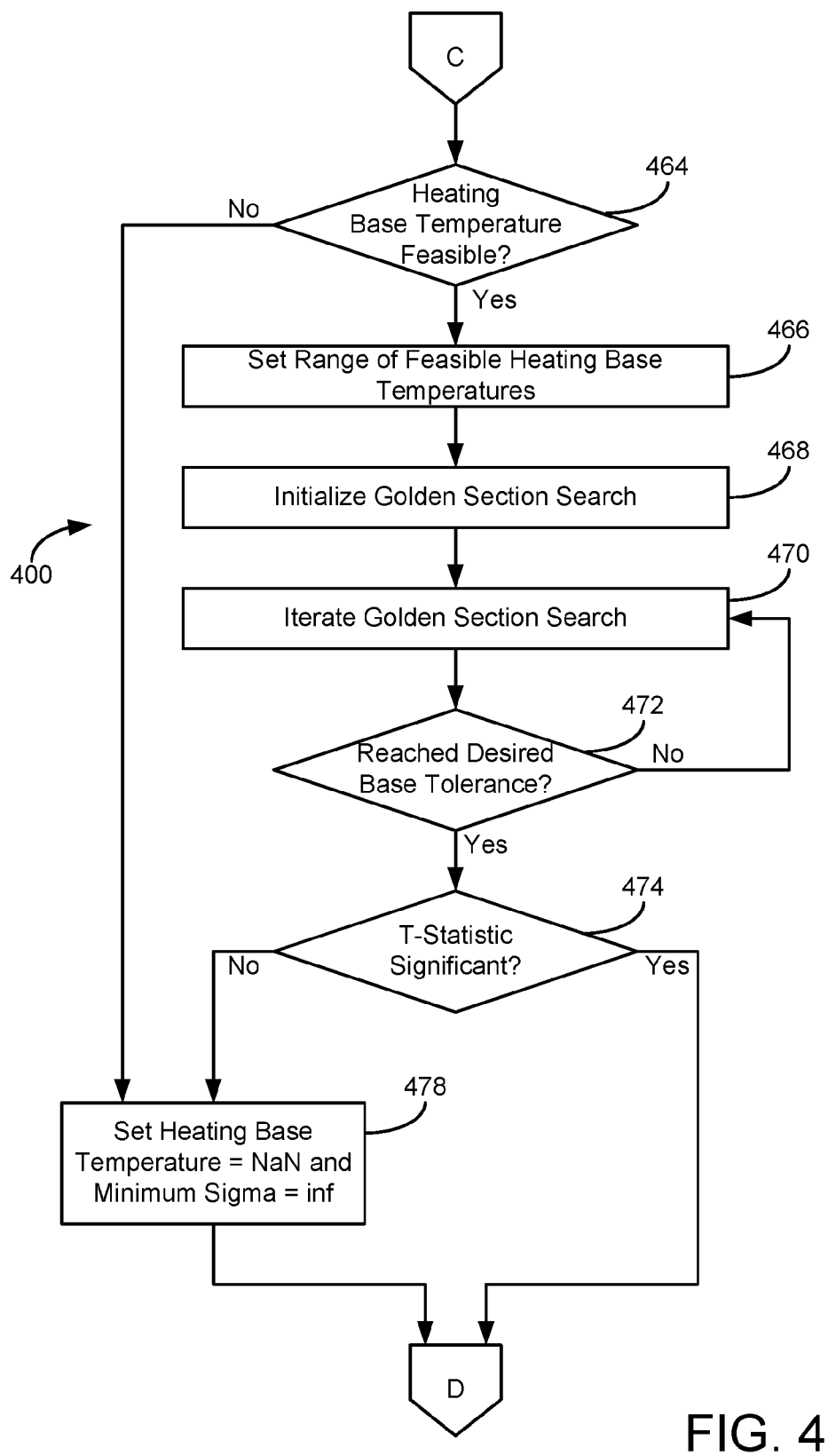
Figure 4E:
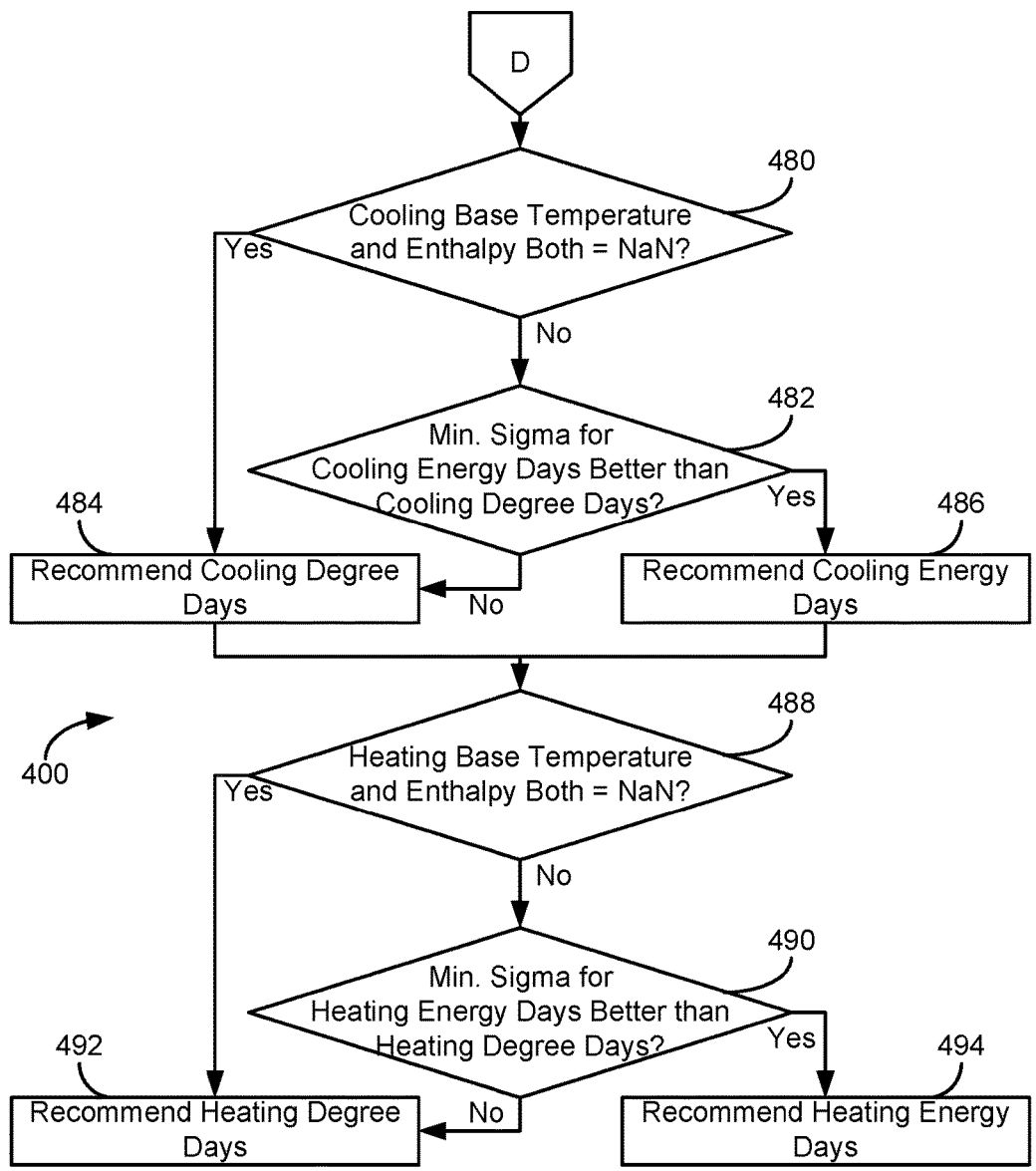
Figure 5:
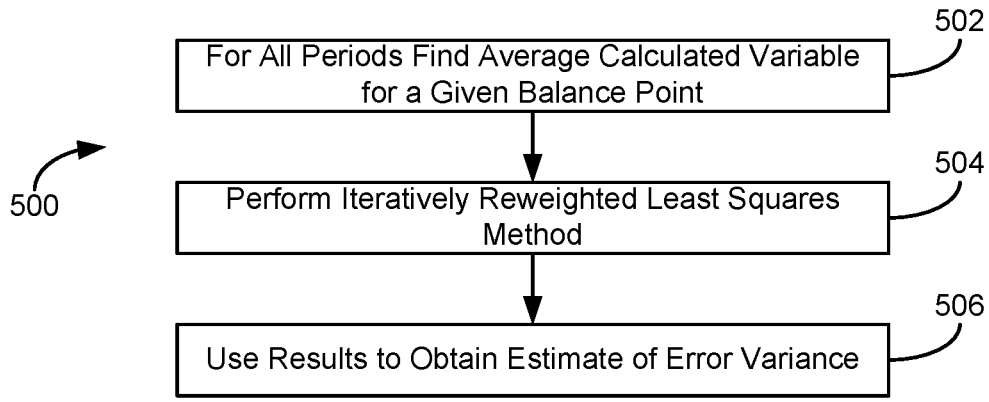
FIG. 5 is a flow chart of the objective function used in the golden section search of the process of FIGS. 4A-E shown in greater detail, according to an exemplary embodiment.

Referring now to FIG. 5, the objective function used in the golden section search of FIGS. 4A-4E is shown in greater detail, according to an exemplary embodiment. Process 500 is configured to calculate the objective function for use in the golden section search. Process 500 includes receiving data from, for example, step 416 of process 400 relating to a range of enthalpies or temperatures (or other measurements) that may be used for the baseline model. Process 500 includes, for all periods, finding an average predictor variable for each given balance point (step 502). For example, the following integral may be used to find the predictor variable:

$$\frac{1}{T} \int_{periodstart}^{periodend} \max(0, X(t) - b) dt$$

while the following integral may be used to determine the average response variable:

$$\frac{1}{T} \int_{periodstart}^{periodend} Y(t) dt$$

where b is the balance point and T is the length of the period.

After obtaining the predictor variable, process 500 includes performing an iteratively reweighted least squares method (IRLS) (step 504). IRLS is used because it is more robust to outliers than standard OLS methods. Process 500 includes using the results of step 504 to obtain an estimate of the error variance (step 506) which is used by process 400 to determine the predictor variable with the best fit for generating a baseline model.

Referring back to FIGS. 4A-4B, process 400 further includes repeating the steps of steps 414-428 for the heating base enthalpy instead of the cooling base enthalpy. Referring now to FIG. 4B, process 400 includes determining if heating base enthalpy is feasible (step 430), setting a range of feasible heating base enthalpies (step 432), initializing a golden section search (step 434), iterating the golden section search (step 436) until a desired base tolerance is reached (step 438), and determining if the t-statistic is significant (step 440). If the t-statistic is not significant, the minimum sigma is set to infinity (step 444), and if otherwise, the t-statistic will be used later in process 400.

Process 400 further includes repeating the steps shown in FIGS. 4A-B, only for the temperature instead of the enthalpy. Referring now to FIG. 4C, process 400 includes determining possible model types based on the temperature data (step 446). Process 400 further includes determining if cooling base temperature is feasible (step 448), setting a range of feasible cooling base temperatures (step 450), initializing a golden section search (step 452), iterating the golden section search (step 454) until a desired base tolerance is reached (step 456), and determining if the t-statistic is significant (step 458). Referring now to FIG. 4D, process 400 includes determining if heating base temperature is feasible (step 464), setting a range of feasible heating base temperatures (step 466), initializing a golden section search (step 468), iterating the golden section search (step 470) until a desired base tolerance is reached (step 472), and determining if the t-statistic is significant (step 474). If the t-statistic is insignificant for either, the cooling or heating base temperature is set to NaN and the minimum sigma for the cooling or heating base temperature is set to infinity (steps 462, 478 respectively).

Process 400 is then configured to recommend a predictor variable based on the base temperatures and minimum sigmas determined in the process. Process 400 includes recommending a default cooling degree day calculation (step 484) as a predictor variable if both the cooling base temperature and cooling base enthalpy were both set to NaN in process 400 (step 480). Process 400 may also recommend cooling degree days as a predictor variable if the minimum sigma for cooling energy days is better (e.g., lower) than the minimum sigma for cooling degree days (step 482). Otherwise, process 400 recommends using cooling energy days (step 486).

Process 400 may repeat steps 488-494 for heating degree days and heating energy days. Process 400 includes recommending a default heating degree day calculation (step 492) as a predictor variable if both the heating base temperature and heating base enthalpy were both set to NaN in process 400 (step 488). Process 400 may also recommend heating degree days as a predictor variable if the minimum sigma for heating energy days is better than the minimum sigma for heating degree days (step 490). Otherwise, process 400 recommends using heating energy days (step 494).

Figure 6:
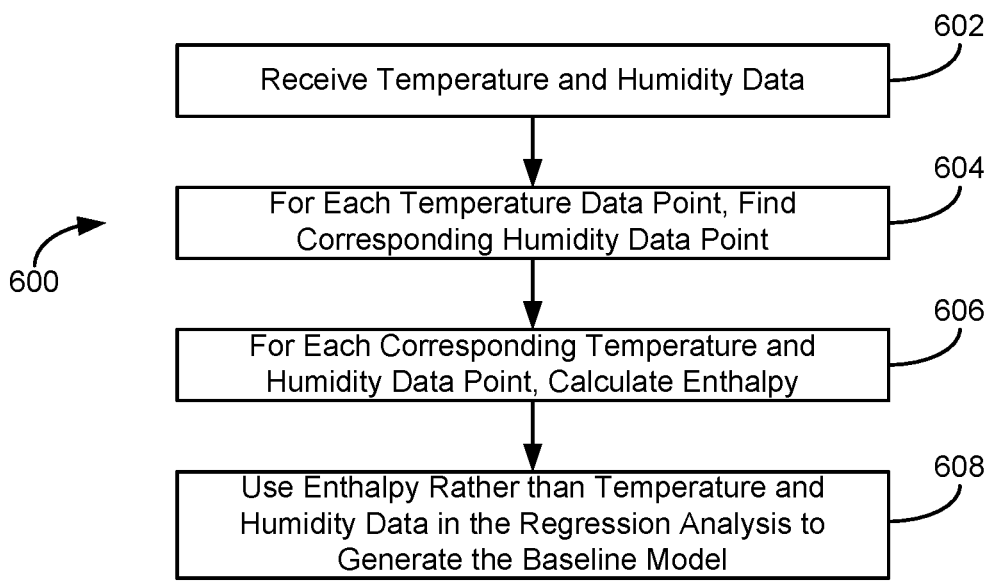
FIG. 6 is a flow chart of a process of calculating enthalpy, according to an exemplary embodiment.

Referring now to FIG. 6, a flow chart of a process 600 of calculating enthalpy is shown, according to an exemplary embodiment. Process 600 includes receiving temperature and humidity data (step 602). Step 602 may further include identifying and removing humidity data points that are NaN, converting temperature data points to the correct format, or any other pre-processing steps.

Process 600 further includes, for each temperature data point, finding a corresponding humidity data point (step 604). For example, for a given time stamp for a temperature data point, step 604 includes searching for a corresponding time stamp for a humidity data point. According to an exemplary embodiment, a humidity data point with a time stamp within 30 minutes (or another period of time) of the time stamp of the temperature data point may be chosen as a corresponding humidity data point. Step 604 may further include searching for the closest humidity data point time stamp corresponding with a temperature data point time stamp. If a corresponding humidity data point is not found for a temperature data point, an enthalpy for the time stamp of the temperature data point is not calculated.

Process 600 further includes, for each corresponding temperature and humidity data point, calculating the enthalpy for the corresponding time stamp (step 606). The enthalpy calculation may be made via a nonlinear transformation, according to an exemplary embodiment. The calculation includes: converting the temperature data into a Rankine measurement and calculating the partial pressure of saturation using the below equation:

$$pws = \exp\left\{\frac{C_1}{T} + C_2 + C_3T + C_4T^2 + C_5T^3 + C_6T^4 + C_7\ln(T)\right\}$$

where C1 through C7 are coefficients and T is the temperature data. The coefficients may be, for example, based on ASHRAE fundamentals. The enthalpy calculation further includes: calculating the partial pressure of water using the partial pressure of saturation:

$$pw = \frac{H}{100 * pws}$$

where H is the relative humidity data. The enthalpy calculation further includes calculating the humidity ratio:

$$W = \frac{0.621945 * pw}{p - pw}$$

where W is in terms of pounds water per pound of dry air. The enthalpy calculation further includes the final step of calculating the enthalpy in BTUs per pound dry air:

Enthalpy=$0.24*T+W*(1061+0.444*T)$

Once the enthalpy is calculated, the enthalpy is used rather than temperature data or humidity data in regression analysis to generate the baseline model (step 608).

Detecting Changes in Energy Use in the Building to Support Measurement and Verification Systems and Methods As described above, the predictor variables for use for the above-described baseline model may generally be calculated as described above by the equation:

$$x = \int_{t_1}^{t_2} \max(0, p(t) - b) dt$$

where x is the synchronized predictor variable, p(t) is the input predictor variable, $t_1$ and $t_2$ represent the start and end points for the period of time, and b is the balance point. The synchronized predictor variables are then used to develop the linear model:

$$\hat{y}_k = \beta_0 t_k + \beta_1 x_{1,k} + \beta_2 x_{2,k} + \ldots + \beta_p x_{p,k}$$

where $t_k$ is the time duration of the period and $\beta_q$ is the $q^{th}$ marginal energy cost per synchronized predictor variable $x_{q,k}$. One or more of the systems or methods described above may be used to develop the linear model and to select appropriate predictor variables for the baseline model.

Once the baseline model is developed, it is used, e.g., during a reporting period, to estimate the amount of energy that would have been used during the reporting period had the ECM not been performed. The avoided energy use can be described and calculated using:

energy avoidance = BE ± RA ± NRA − RPE where BE is the baseline energy (e.g., average energy use during the baseline), RA are the routine adjustments (e.g., adjustments based on the predictor variables and typically included in the baseline model), NRA are the non-routine adjustments (e.g., adjustments based on (typically constant) factors related to energy usage that are not included in the baseline model), and RPE is the reporting period energy (e.g., the actual reported energy usage in the building). If there are no non-routine adjustments, the energy avoidance can be represented as:

energy avoidance = $\hat{y}_k$ − RPE where $\hat{y}_k$ is the estimated energy use using the baseline model, i.e., the estimated energy use (BE) plus the routine adjustments based on the reporting period predictor variables (RA).

If the need for non-routine adjustments is identified (e.g., if static factors have changed in a way such that energy use is affected), then non-routine adjustments must be performed by taking them into account in the energy avoidance calculation. Changes in static factors that could necessitate non-routine adjustments may include, for example, changes in the size of the used facility space, the hours of operation of the building, the number of employees using the building, and the number of computer servers in the building. Any factor not expected to normally change and having an impact on energy use that is not included in the predictor variables of the baseline model could be considered a static factor. A change in static factors may occur during the reporting period or during the baseline period.

Referring generally to the figures below, systems and methods are described for automatically detecting changes in static factors during a baseline period or reporting period. A method for automatically detecting changes in static factors may include developing a null hypothesis of a baseline model with constant coefficients (stationary). The method further includes determining whether a statistically significant change in the baseline model's parameters has occurred. If statistically significant changes in the baseline model's parameters are detected over time, the method can include outputting an indication (e.g., to a user interface, to a computerized module for recalculating the baseline model, etc.) that a static factor has changed. The method can include conducting multiple sequential hypothesis tests spread over a period of time. Known theoretical correlations between temporally adjacent test statistics can be used to provide false positive suppression (e.g., suppress an indication that a static factor has changed where the data causing such an indication was spurious due to weather or another transient condition) without the undesirable effect of greatly reducing the test power (as would occur if, for example, the Bonferroni correction was applied).

When a building is operating in a consistent manner (e.g., consistent energy usage) and the baseline model for the building includes all the independent predictor variables necessary to accurately estimate the energy usage, the coefficients of the baseline model should remain constant over time. Therefore, if two temporally consecutive windows of data from time intervals $[t_a, t_b]$ and $[t_b, t_c]$ are used, the difference in two baseline model coefficients should be near zero. The difference in model coefficients can be represented as:

$$\Delta\beta = \hat{\beta}_1 - \hat{\beta}_2$$

where $\Delta\beta$ is the difference between the baseline model coefficients from window one and window two $\hat{\beta}_1$, $\hat{\beta}_2$, respectively. Because the baseline model coefficients have physical meaning (e.g., cost per cooling degree day), unexpected changes in coefficients over time can advantageously be linked to root causes (e.g., chiller fouling, decrease in setpoints, etc.).

For the coefficients, there may be random variation in a coefficient the magnitude of which is based on, for example: the number of periods or data points in the time intervals, the variance of the errors of the baseline model, the number of predictor variables used in the model, and the values of the predictor variables during each of the two time intervals. Additionally, the values of the predictor variables during each time interval can have a significant effect of the variation of the coefficients. Thus, in the preferred embodiment, the statistical methods described below may be used to determine whether the difference in the coefficients is large enough to be considered statistically significant or whether the coefficient difference is due to the random variation described above, rather than a real change in a static factor affecting the building's energy use.

Figure 7:
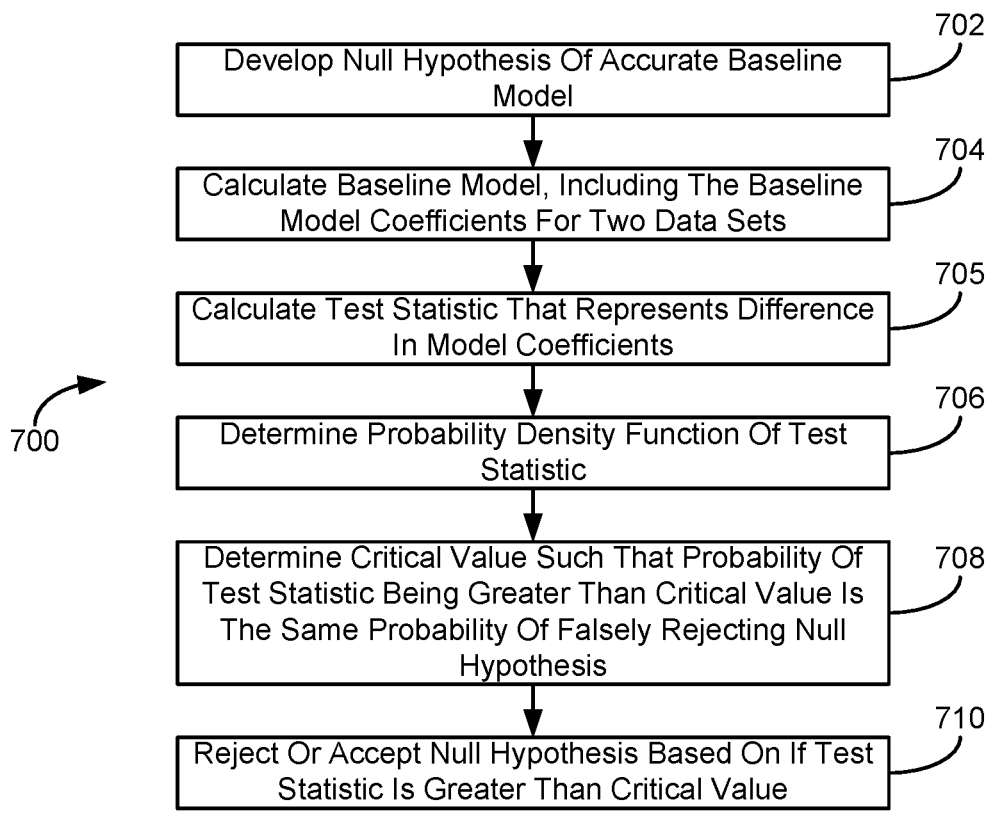
FIG. 7 is a flow chart of a process for identifying changes in the static factors of a baseline model such as that discussed with reference to previous Figures, according to an exemplary embodiment.

Referring now to FIG. 7, a flow chart of a process 700 for automatically detecting changes in static factors that occurred between two sequential time periods is shown, according to an exemplary embodiment. Process 700 includes developing a null hypothesis that the baseline model is accurate (e.g., the baseline model is a correct representation of building energy usage) and stationary (e.g., the coefficients are constant) (step 702).

Process 700 further includes calculating the baseline model including the baseline model coefficients for two different chronologically ordered data sets (step 704). The coefficients may include, for example, energy use per degree day or energy use per energy day. In other embodiments, the coefficients could include an aggregation, or other value that describes the coefficients for a given periodic baseline model. In step 705, process 700 includes calculating at least one test statistic that is related to the difference in a coefficient or a set of coefficients from the two data sets. If two consecutive windows of data are used to build similar baseline models (i.e., the coefficients of the models are similar) and static factor changes have not occurred during the time period of the windows, then the test statistic should be small (i.e., within the expected amount of random variation).

Process 700 further includes determining a probability density function (PDF) of the test statistic (step 706). Using the PDF of the test statistic, process 700 determines a critical value such that the probability of the test statistic being greater than the critical value is the same as the specified probability of falsely rejecting the null hypothesis of step 702 (step 708). A user of the building management system may select an acceptable level for the probability of falsely rejecting the null hypothesis, according to an exemplary embodiment. In some embodiments, the probability may be built into contract standards and differ from building to building, building type to building type, or otherwise vary.

Process 700 further includes rejecting or accepting the null hypothesis based on whether the test statistic is greater than the critical value found in step 708 (step 710). If the test statistic is greater than the critical value, then the null hypothesis of a constant baseline model is rejected. When the null hypothesis is rejected, the system can determine that a static factor has changed and a non-routine adjustment may be necessary. The user may be alerted to the necessity of a non-routine adjustment, additional calculations may be performed, or other various actions related to the non-routine adjustment may be performed by the building management system.

Referring further to process 700, least squares estimation may be used to find the coefficients of the baseline models. The least squares estimation problem can be stated as the following: given a linear model $$Y = X\beta + \epsilon, \quad \epsilon \sim N(0, \sigma^2 I)$$

find the vector $\hat{\beta}$ that minimizes the sum of squared error RSS:

$$RSS = \|Y - X\hat{\beta}\|^2.$$

In the above equations, Y is a vector that contains the individual n observations of the dependent variable and X is a n by p+1 matrix that contains a column of ones and the p predictor variables at which the observation of the dependent variable was made. $\epsilon$ is a normally distributed random vector with zero mean and uncorrelated elements. According to various exemplary embodiments, other methods than using RSS may be used (e.g., weighted linear regression, regression through the origin, etc.) The optimal value of based on the least squares estimation has the solution stated above with respect to FIG. 2:

$$\hat{\beta} = (X^T X)^{-1} X^T Y$$

and $\hat{\beta}$ is a normal random vector distributed as:

$$\hat{\beta} \sim N(\beta, \sigma^2 (X^T X)^{-1}).$$

The resulting sum of squared error divided by sigma squared is a chi-square distribution:

$$\frac{RSS}{\sigma^2} \sim \chi^2_{n-(p+1)}.$$

The difference in the coefficients is distributed as:

$$\Delta\beta = \hat{\beta}_1 - \hat{\beta}_2 \sim N(0, \sigma^2 [(X_1^T X_1)^{-1} + (X_2^T X_2)^{-1}]).$$

The quadratic form of a normally distributed random vector where the symmetric matrix defining the quadratic form is given by the inverse of the covariance matrix of the normal random vector is itself a chi-square distributed random variable with degrees of freedom equal to the length of $\Delta\beta$:

$$\frac{\Delta\beta^T [(X_1^T X_1)^{-1} + (X_2^T X_2)^{-1}]^{-1} \Delta\beta}{\sigma^2} \sim \chi^2_{p+1}.$$

Additionally, the sum of two independent chi-square distributions is itself a chi-square distribution with degrees of freedom equal to the sum of the degrees of freedom of the two original chi-square distributions. Thus, the sum of the two sum of squared errors divided by the original variance is chi-square distributed, as:

$$\frac{RSS_1 + RSS_2}{\sigma^2} \sim \chi^2_{n_1 + n_2 - 2(p+1)}.$$

$n_1$ and $n_2$ are the number of data points used to estimate the model coefficients $\hat{\beta}_1$, $\hat{\beta}_2$. Finally, the ratio of two chi-square distributions divided by their respective degrees of freedom is an F-distributed random variable:

$$F_{\Delta\beta} = \left(\frac{\Delta\beta^T [(X_1^T X_1) + (X_2^T X_2)^{-1}]^{-1} \Delta\beta}{RSS_1 + RSS_2}\right)\left(\frac{n_1 + n_2 - 2(p+1)}{p+1}\right) \sim$$

$$F_{p+1, n_1 + n_2 - 2(p+1)}.$$

$F_{\Delta\beta}$ is defined as the test statistic. As $\Delta\beta$ moves away from the origin, $F_{\Delta\beta}$ increases. Further, the maximum increase occurs in the direction of the least variance of the model coefficients and is scaled by the sum of squared errors. Thus, $F_{\Delta\beta}$ is based on changes in model coefficients which can easily be related back to a root cause and it takes into account the random variation of the changes of the model coefficients even when the model is stationary. The $F_{\Delta\beta}$ statistic may further be converted into a standard normal variable $Z_{\Delta\beta}$ by the proper transformation function.

The $F_{\Delta\beta}$ or $Z_{\Delta\beta}$ statistic can be used as the test statistic in step 710 of process 700 (if $Z_{\Delta\beta}$ is used then the critical value will be calculated with the inverse distribution function of the standard normal distribution). The user of the building (or a contract or automated process) determines an acceptable level for $\alpha$, the probability of rejecting the null hypothesis when it is in fact valid. An automated process uses $\alpha$ to determine the critical value for use in accepting or rejecting the null hypothesis. The null hypothesis is rejected if the F-statistic $F_{\Delta\beta}$ is greater than its critical value $f_{crit}$ which may be calculated using $F_{p+1, n_1+n_2-2(p+1)}(1-\alpha)$, where $F^{-1}$ is the inverse of the cumulative F-distribution with the required degrees of freedom. In other words, the null hypothesis is rejected and a static factor can be determined to have changed when $F_{\Delta\beta} > f_{crit}$.

Process 700 is used to determine whether a single test statistic, from a single test, including the model coefficients of two (time adjacent) building models, indicates a change in static factors in a building. Process 700 is more particularly used to determine whether a change has occurred at any point in time during the baseline period or reporting period. In an exemplary embodiment, process 700 is repeated multiple times over sets of data that are windowed using different methods based on whether the baseline period data (model building) or reporting period data (facility monitoring) is being tested for static factor changes (i.e., model coefficient consistency). Two representative different methods are shown in greater detail in FIGS. 8A and 9A. In these cases, the critical value must be adjusted from that shown above to limit the false alarm rate of any of the multiple tests performed.

When attempting to detect static factor changes during the baseline or reporting period, several iterations of model calculations and associated coefficient testing can be conducted. For example, over the baseline data, the test may be run n−2(p+1)+1 times, where n is the number of data points and p is the number of predictor variables in each model. If that many tests are run, the probability of finding at least one false alarm will be much greater than $\alpha$ (in fact, as the number of tests increase, the probability approaches 1). Therefore, for the baseline period, some embodiments limit the probability that any of the several tests falsely reject the null hypothesis to avoid false alarms (i.e., false indications that a static factor of a baseline model has changed), since several tests will be performed. For the reporting period, limiting the probability of a false alarm in a set time duration to a predefined value can help avoid falsely rejecting the null hypothesis. For example, the user or electronics (e.g., based on minimum performance or contract specification) may specify that the probability of a false rejecting the null hypothesis on any test performed in a given year should be less than 15%.

Figure 8A:
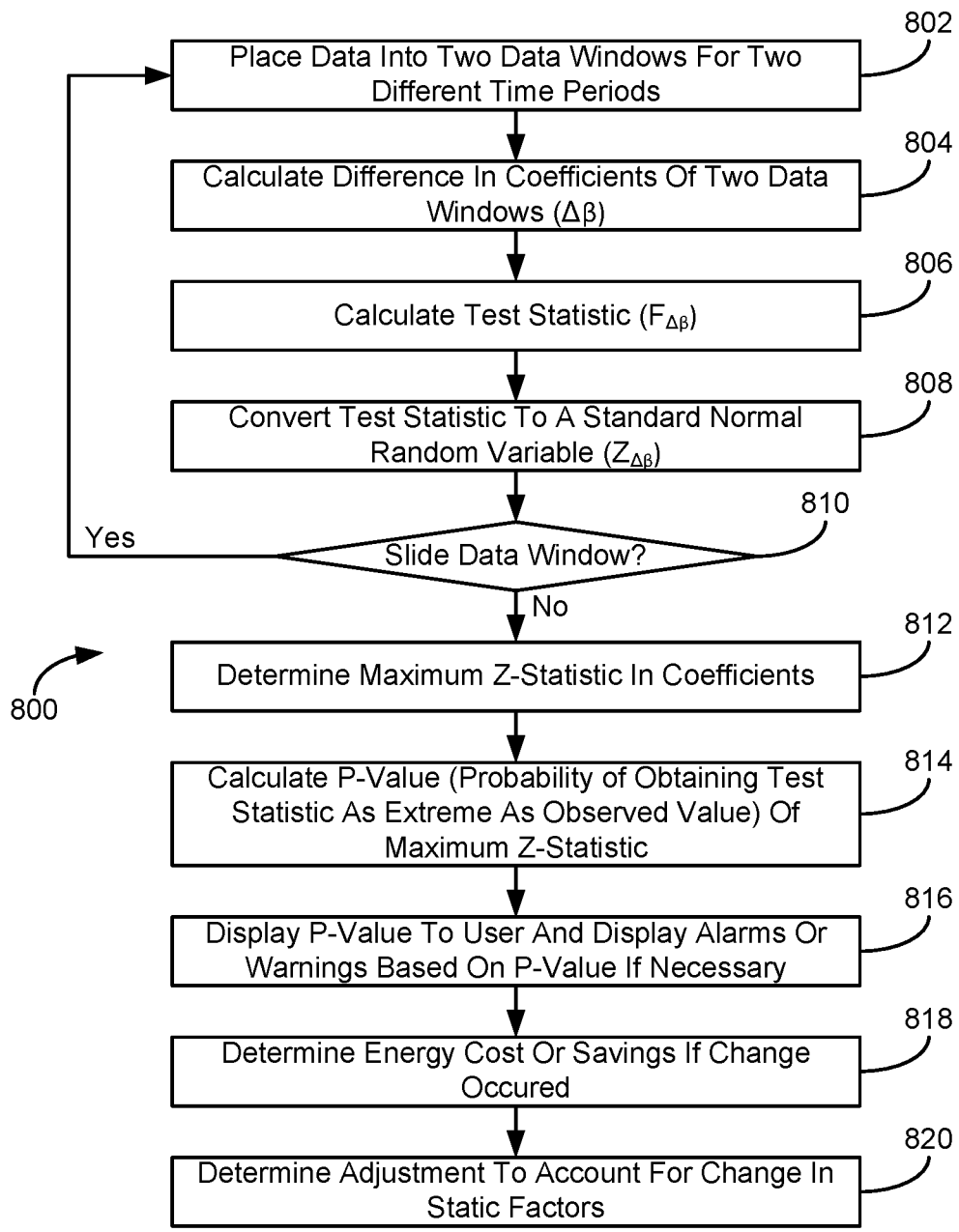
FIG. 8A is a flow chart of a process for detecting changes in static factors of a baseline model during a baseline period, according to an exemplary embodiment.

Referring now to FIG. 8A, a flow chart of a process 800 for detecting changes in static factors of a baseline model during a baseline period is shown, according to an exemplary embodiment. To detect changes, the $Z_{\Delta\beta}$ statistic is calculated at each possible value for the dividing time between the two data windows, and all baseline data (e.g., all data from the beginning of the baseline period to the beginning of the installation period) is used. That is, the statistic is calculated for each possible windowing (for which the data remains in chronological order and there is at least one degree of freedom in each window) in the baseline period.

Process 800 includes temporally windowing the data into two windows (step 802). During the baseline period, the data received and used in the baseline model is received by process 800 and divided into two different time periods (i.e., windows). The data is placed into the data windows in chronological order (e.g., into the first window until the first window fills, then the second window). Referring also to process 850 of FIG. 8B, a process for determining the size and time periods for the data windows may be used. Baseline model coefficients may be calculated for the two different data windows, and the difference in coefficients $\Delta\beta$ is calculated (step 804). Step 804 may further include storing the difference (e.g., for consideration in step 820 of process 800). Process 800 further includes calculating the test statistic $F_{\Delta\beta}$ based on the change in model coefficients (step 806). Process 800 further includes converting the test statistic $F_{\Delta\beta}$ into a standard normal random variable $Z_{\Delta\beta}$ (step 808). The conversion is done by passing the test statistic through its cumulative probability distribution and then through the inverse of the standard normal distribution. The resultant standard normal random variable $Z_{\Delta\beta}$ is given by:

$$Z_{\Delta\beta}=N_{0,1}^{-1}\{F_{p+1,n_1+n_2-2(p+1)}(F_{\Delta\beta,k})\}.$$

Process 800 further includes determining whether to slide the data window (step 810). After calculating a difference in step 804 for two given time periods, the data windows for the two given time periods may be adjusted. For example, for two time periods defined by $[t_a, t_b]$ and $[t_b, t_c]$, step 810 of sliding the data window is executed by increasing $t_b$, increasing the first data window by one data point and decreasing the second data window by one data point. Sliding the data window may include moving data points from one time period to another based on a timestamp or other property of each individual data point. By sliding the data window (e.g., by moving the end point of the first data window and the start point of the second data window), new coefficients for the data windows may be calculated, and another difference in coefficients and Z-statistic may be calculated. Process 800 repeats steps 802-808 until, for example, the second data window contains the fewest allowable data points (e.g., the second window has p+2 data points). For example, process 800 may repeat steps 802-808, beginning from when the first data window contains the fewest number of possible data point until the second data window contains the fewest number of possible data points. The method of repeating steps 802-808 by shifting the data windows is shown in greater detail in FIG. 8B.

Figure 8B:
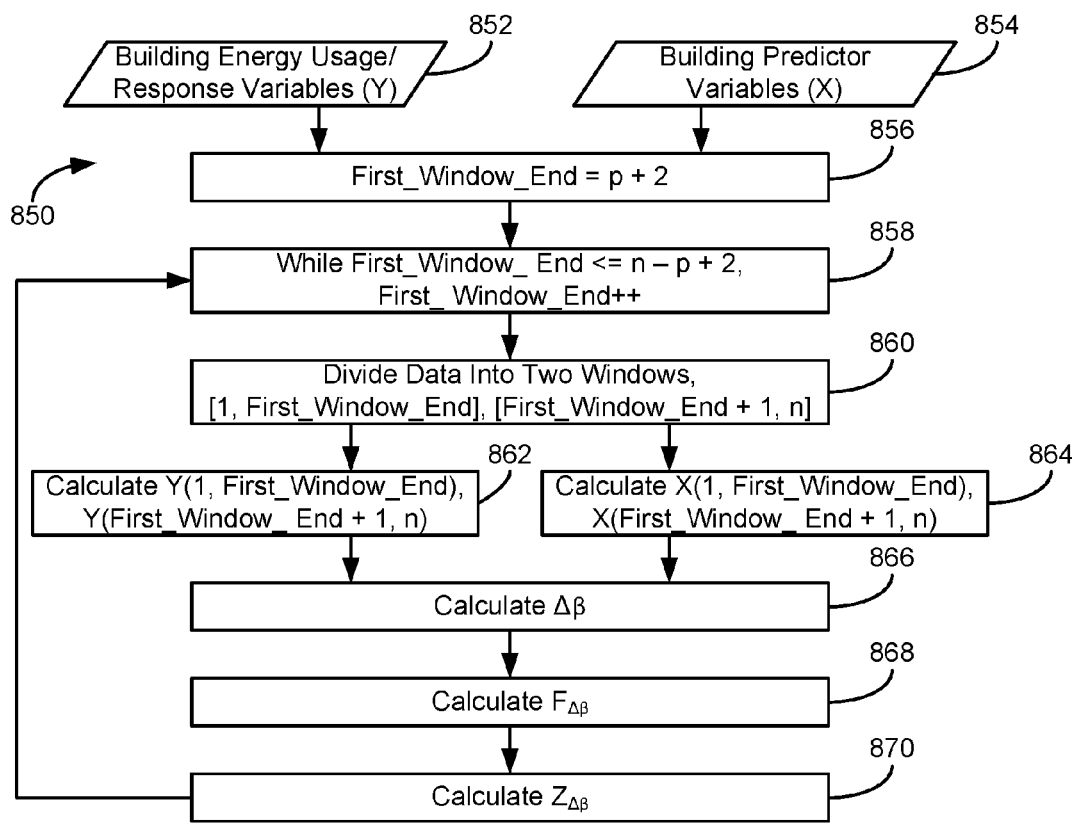
FIG. 8B is a flow chart of a process for calculating an observed statistic for detecting changes in static factors during a baseline period, according to an exemplary embodiment.

Referring now to FIG. 8B, the shifting of the data windows for calculating a new observed $Z_{\Delta\beta}$ statistic is shown in greater detail. The detailed process of FIG. 8B may be the steps that occur during steps 802-806 of FIG. 8A. Process 850 includes receiving response variables Y (e.g., variables representative of building energy usage) 852 and building predictor variables X 854. Process 850 includes setting an initial first window end of p+2, where p is the number of predictor variables (step 856). Such a choice means that the initial first data window only includes p+2 data points (enough for one degree of freedom in the probability distribution calculations). The first window end marks the last data point that is in the first window; thus, the next data point is the first datum in the second window. If the observed maximum statistic indicates that a static factor has changed, this point can be inferred to represent a point at or after which a static factor change occurred. For example, when coefficients are calculated using the two data windows and a difference in coefficients is large enough, the data point that is used as the endpoint or start point for the data windows may be determined to represent a time at or after which a potential change in static factors occurred. In alternative embodiments, the different windows could include gaps between the windows (e.g., data points "in between" the data points in the two windows) or some amount of overlap.

Process 850 further includes, while the first window end is less than or equal to n−p+2, increasing the first window end by one (e.g., sliding the first data window endpoint by one) (step 858). n is the number of data points in the entire baseline period being used. The data is divided into the two data windows based on the endpoints (step 860). Coefficients are calculated for each of the data windows (steps 862, 864). In step 862, coefficients for the response variables Y for the two data windows are calculated, and in step 864, coefficients for the predictor variables X for the two data windows are calculated. The difference in coefficients and the $\Delta\beta$ statistic is calculated (step 866), the F-statistic $F_{\Delta\beta}$ is calculated (step 868), and the standardized statistic $Z_{\Delta\beta}$ is calculated (step 870). Steps 866-870 corresponds with steps 804-808 of process 800. Process 850 is then repeated until the second data window is eventually reduced to only p+2 data points.

Referring again to FIG. 8A, after calculating the statistics, process 800 includes determining the maximum Z-statistic from steps 802-808 (step 812). Step 812 includes comparing the differences calculated in step 808 (e.g., or step 870) to find the maximum difference. Process 800 further includes calculating the P-value of the maximum Z-statistic (step 814). The P-value represents the probability of obtaining a maximum test statistic as extreme as the observed maximum Z-statistic determined in step 812 given that the null hypothesis (linear model with constant coefficients) is true.

The P-value may be calculated in various ways. In one exemplary embodiment, the P-value may be approximated using a Monte Carlo simulation. In one embodiment, Monte Carlo samples of the maximum $Z_{\Delta\beta}$ determined in step 812. For example, steps 808-812 are performed on computer generated data that fits the null hypothesis, samples which have a maximum value greater than the data points used in process 800 may be determined, and the fraction or ratio of such samples may be used to calculate the P-value. In another exemplary embodiment, the P-value may be approximated using a Monte Carlo simulation of a multivariate normal vector. One exemplary use of a Monte Carlo simulation to calculate a P-value (e.g., step 814) is shown in greater detail in FIG. 13.

Process 800 further includes displaying the P-value to a user and displaying alarms or warnings based on the P-value if necessary (step 816). The P-value is representative of the likelihood of a change in the static factors of the building (e.g., a P-value near zero indicated that a change may have occurred). Step 816 includes using the P-value to generate an alarm or warning representative of the likelihood of the change. Step 816 may also or alternatively include providing the P-value to another system component or automated process (e.g., recalculating the baseline model with knowledge of the changed static factor likelihood). The energy cost or savings is determined if a change occurred (step 818). An adjustment to account for the change in static factors is also determined (step 820). Steps 818-820 may include estimations of energy cost or savings (e.g., based on the changed static factors and/or updated model) and adjustments based on the P-value.

Figure 9A:
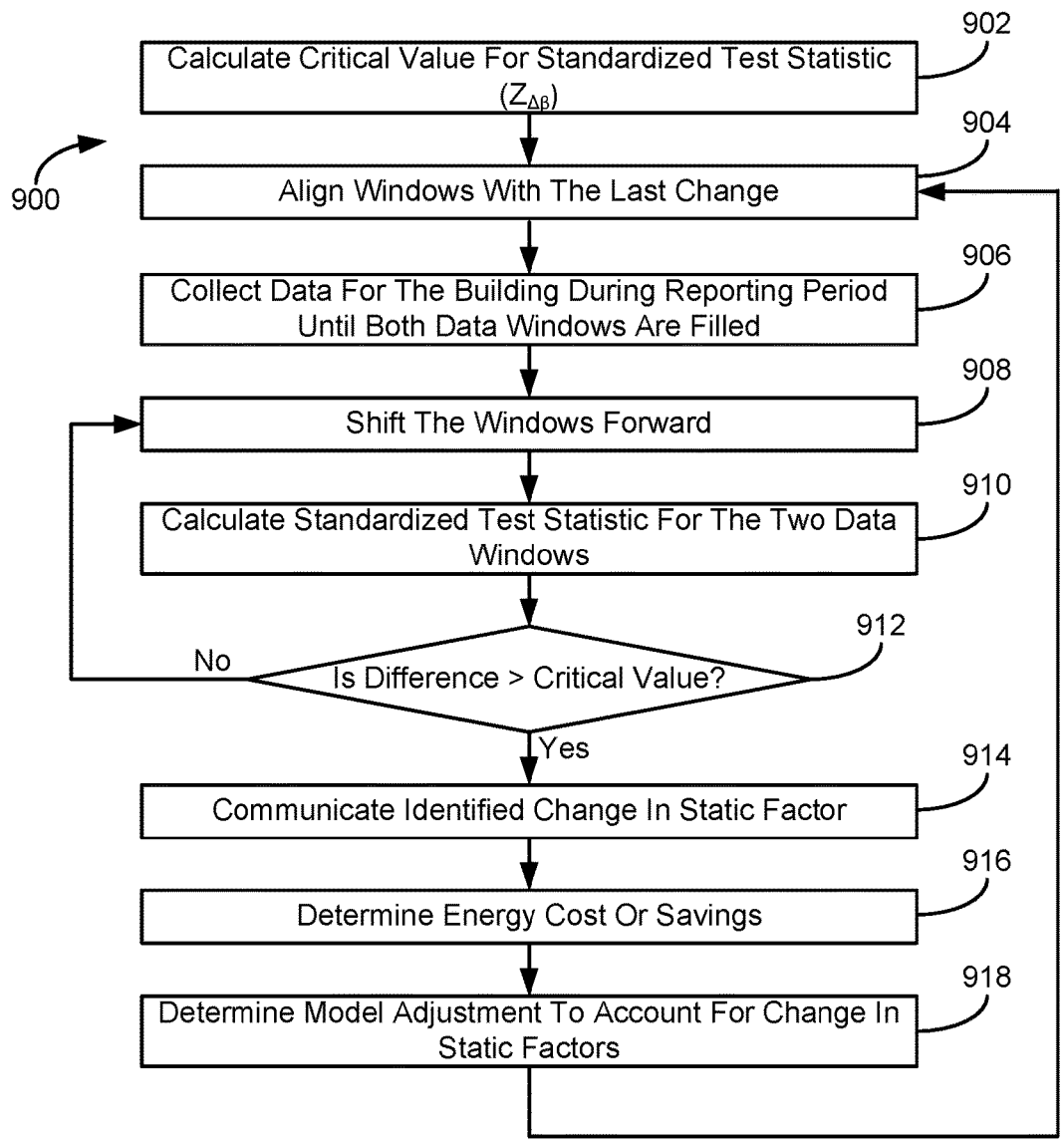
FIG. 9A is a flow chart of a process for detecting changes in static factors of a baseline model during a reporting period, according to an exemplary embodiment.

Referring now to FIG. 9A, a flow chart of a process 900 for detecting changes in static factors of a baseline model during a reporting period (as opposed to during a baseline period as described above with reference to FIGS. 8A-B) is shown, according to an exemplary embodiment. The reporting period may last as long as twenty years or more and several changes in static factors may occur over the time frame. Process 900 may be used once enough data is collected by the building management system, and after enough data is collected, old data may be discarded from process 900 as new data continues to be collected.

Process 900 includes calculating a critical value for the test statistic at a given alpha value (step 902). The alpha value can be supplied by the user or obtained from the standards of the contract and may vary from building to building or building type to building type. According to one embodiment, step 902 includes using a Monte Carlo cumulative probability distribution inversion to calculate the critical value. An exemplary method and use of such an inversion to find the critical value is shown in greater detail in FIG. 12. The samples used in the inversion may be performed using the actual data points (formed by simulating a linear model and calculating $Z_{\Delta\beta}$) or may be simulated from a multivariable normal distribution.

Process 900 further includes aligning the two data windows with the last change (step 904). Step 904 includes receiving new data and sliding the data in the two windows. Data for the building during the reporting period is collected until two data windows are filled (step 906). In an exemplary embodiment, a window may not be considered full until a minimum amount of time has elapsed (e.g., one month, one year, etc.). The data in each window is then shifted forward (step 908) (e.g., as described in process 950 of FIG. 9B) and a normalized test statistic for the two data windows is calculated (step 910). Step 910 may include, for example, calculating coefficients for the two data windows and determining the difference in the coefficients as described in process 700 of FIG. 7.

Process 900 further includes determining whether the test statistic calculated in step 910 is greater than the critical value determined in step 902 (step 912). If the test statistic is greater than the critical value, the user may be alerted to a change in static factors or an indication of the change in static factors may be communicated (step 914) to another module of the building management system (e.g., a reporting module, a logging module, a module for automatically initiating recalculation of the energy model, etc.) and an energy cost or savings is determined (step 916). An adjustment to account for the change is determined as well (step 918). After the change or adjustment has completed, building response and predictor variables may be collected again until the initial windows are filled again. In other words, process 900 may repeat accordingly to continuously evaluate static factor changes in the utilized baseline model.

If the difference in step 910 is less than the critical value, process 900 repeats steps 908-910 by shifting the two data windows. The method of shifting the two data windows is shown in greater detail in FIG. 9B.

Figure 9B:
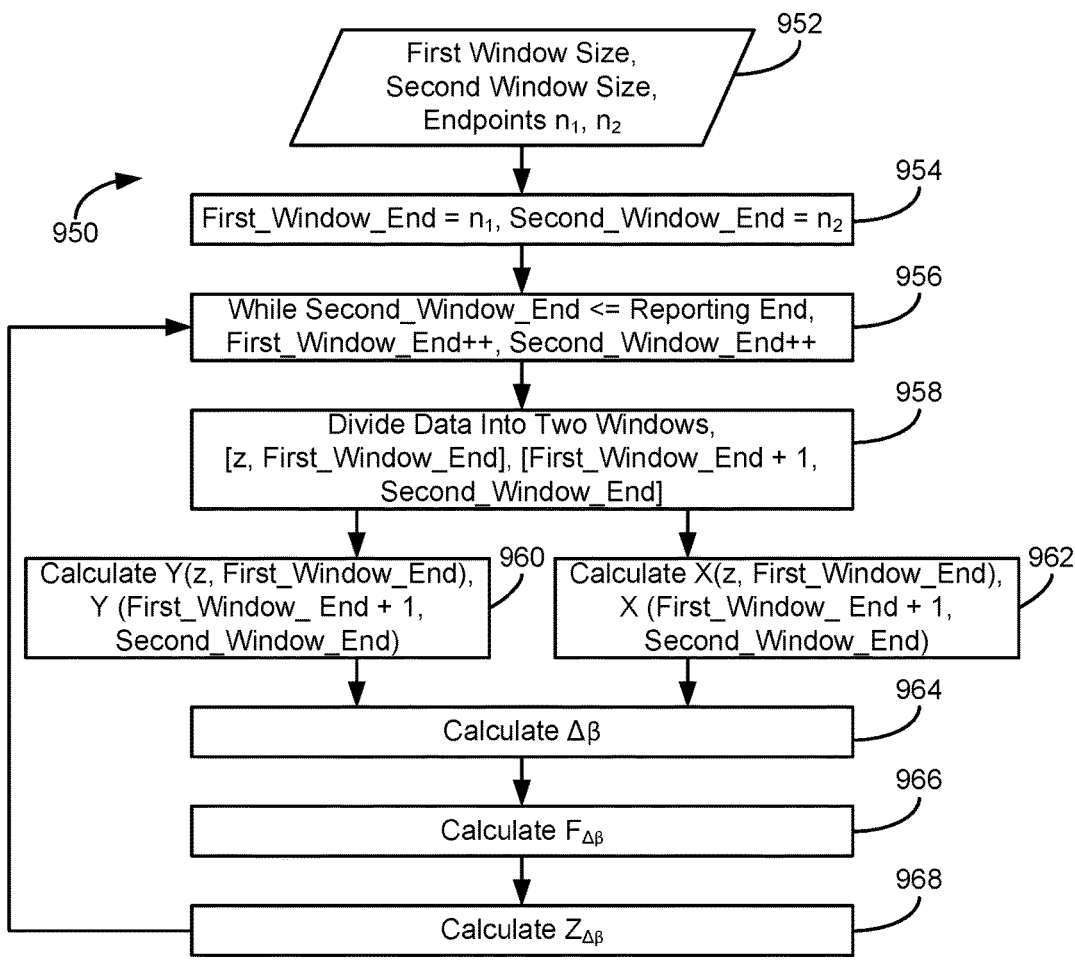
FIG. 9B is a flow chart of a process for calculating an observed statistic for detecting changes in static factors during a reporting period, according to an exemplary embodiment.

Referring now to FIG. 9B, the shifting of the data windows for calculating an new observed standardized statistic of step 908 of process 900 is shown in greater detail. Process 950 is configured to keep both data windows used at a fixed length, and moves the data windows forward in time instead of changing the size of either window. Therefore, when a new reporting period data point is obtained and used, the data point will become the last data point in the second data window, and the oldest data point in the first data window winds up being eliminated from the analysis.

Process 950 includes receiving a first window size, a second window size $n_2$, and endpoints $n_1$, $n_2$ (step 952). Process 950 includes using the endpoints for the two data windows (step 954). The first window size and second window size are the sizes of the data windows that are preferred for process 900. The two sizes of the data windows will remain fixed throughout process 900, and process 950 includes changing the endpoints of the data windows instead of the size of the data windows. The sizes of the data windows may be predetermined by the building management system or a user thereof. The endpoints $n_1$ and $n_2$ are used to determine the initial endpoints of the two windows (e.g., the first window includes all data points from a cutoff point to point $n_1$, and the second window includes all data points from $n_1+1$ to $n_2$.

While the second window end is less than the reporting end (e.g., the end data point for the reporting period), the first window end $n_1$ and second window end $n_2$ are increased by one (step 956). The data received by process 950 is then divided into two windows with start points and endpoints defined by the first window end and second window end (step 958). Since the size of the two data windows are limited (e.g., based on the first window size and second window size specified in step 952), the "oldest" data point that used to be in the first data window in the previous iteration of process 950 no longer fits in the data window. Therefore, the data points in the first data window may range from a value z to the new $n_1$. The second data window may continually be adjusted such that it includes data points from the new $n_1+1$ to the new $n_2$.

Coefficients are calculated for each of the data windows (steps 960, 962). In step 960, the response variables are placed into two vectors corresponding to the two windows, and in step 962, the predictor variables are placed into two matrices corresponding to the two windows. The difference in coefficients (and the $Z_{\Delta\beta}$ statistic) is calculated (steps 964-968). Process 950 is then repeated as new data is gathered throughout the reporting period until the second data window reaches the reporting period end. The $Z_{\Delta\beta}$ statistic is then used in the comparison of step 912 of process 900.

Figure 10:
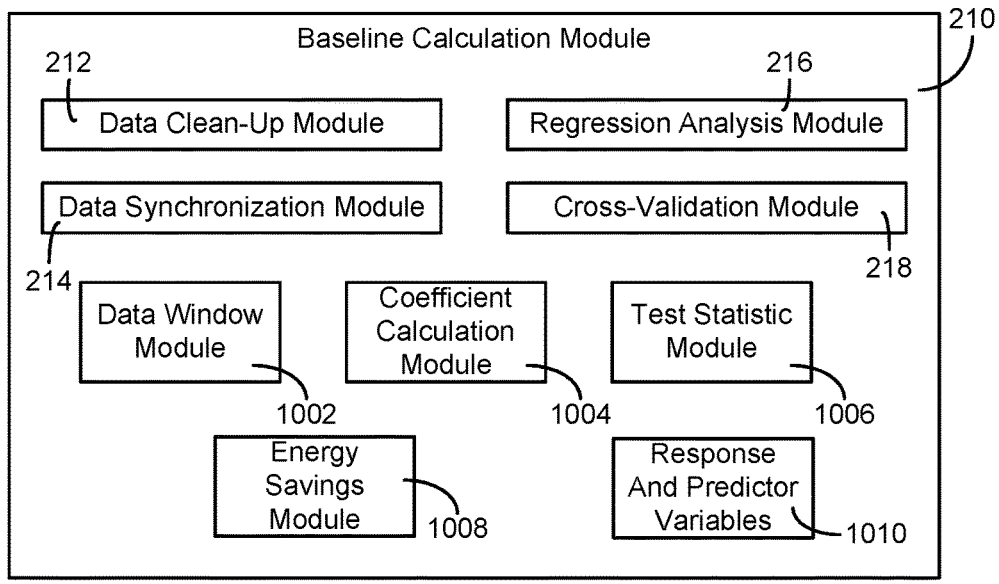
FIG. 10 is a detailed block diagram of a baseline calculation module for detecting changes during a baseline period, according to an exemplary embodiment.

Referring now to FIG. 10, a block diagram of baseline calculation module 210 is shown in greater detail, according to an exemplary embodiment. Baseline calculation module 210 is shown to include the data clean-up module, data synchronization module, regression analysis module, and cross-validation module as described in FIG. 2. Baseline calculation module 210 further includes data window module 1002, coefficient calculation module 1004, and test statistic module 1006. Baseline calculation module 210 is configured to, using modules 1002-1006, detect changes in static factors during a baseline period. Baseline calculation module 210 further includes predictor variables 1010 which may be provided to the various modules of the computer system (e.g., facility monitoring module 230).

Data window module 1002 is configured to perform the data window sliding and calculations as described in FIGS. 8B and 9B. Data window module 1002 may receive data and either receive or determine initial data windows for the process of FIG. 8B to use. Data window module 1002 further slides the data windows (e.g., via processes 850, 950) and organizes the data in the two windows to facilitate the completion of the processes of FIG. 8B.

Coefficient calculation module 1004 is configured to calculate the coefficients for the baseline model and for the detection of changes in static factors. Coefficient calculation module 1004 may be configured to, for example, conduct the calculations shown in steps 862 and 864 of FIG. 8B and steps 960 and 962 of FIG. 9B.

Test statistic module 1006 is configured to receive coefficient calculation results from module 1004 and to calculate a test statistic $Z_{\Delta\beta}$ representative of the difference in coefficients. The calculation may include the calculation of the F-statistic $F_{\Delta\beta}$ which is then converted into the test statistic $Z_{\Delta\beta}$. Test statistic module 1006 may further be configured to calculate a PDF of the test statistic $Z_{\Delta\beta}$ and a PDF of the maximum of n test statistics $Z_{\Delta\beta}$.

Baseline calculation module 210 further includes energy savings module 1008. Energy savings module 1008 is configured to determine the energy (or monetary) costs or savings associated with a change in static factors.

One method of estimating the cost or savings is to take data from the last detected change (or the end of the installation period) to the time the change was detected and the data available since the change occurred. Model coefficients can be calculated for both the pre- and post-change data. The estimated cost is then given by:

$$\text{cost}=x^T[\beta_{new}-\beta_{old}]$$

with a standard error of:

$$\text{se(cost)}=\hat{\sigma}\{1+x^T[(X_{old}{}^T X_{old})^{-1}+(X_{new}{}^T X_{new})^{-1}]x\}^{1/2}.$$

where $\beta_{new}$, $\beta_{old}$ are the calculated coefficients, $X_{old}$ is data from before the change, and $X_{new}$ is data from after the change.

Figure 11:
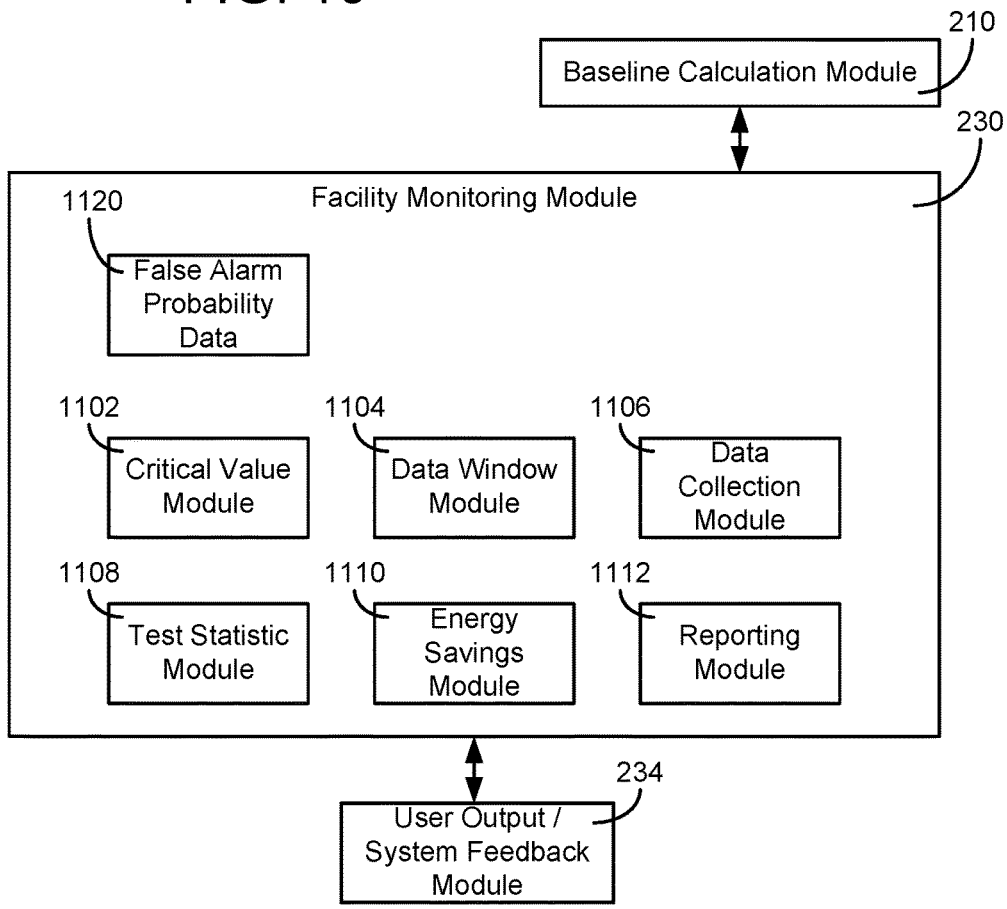
FIG. 11 is a detailed block diagram of a facility monitoring module for detecting changes during a reporting period, according to an exemplary embodiment.

Referring now to FIG. 11, a detailed block diagram of the facility monitoring module 230 of FIG. 1C is shown, according to an exemplary embodiment. Facility monitoring module 230 is configured to detect changes in static factors during the reporting period. Module 230 receives baseline model information (e.g., predictor variables 1010) from baseline calculation module 210 and other building information such as false alarm probability data 1120 and other building data. False alarm probability data 1120 may be a user entered value that represents a desired probability of generating a false alarm of determining that a static factor has changed when it actually has not. For example, 5% may be a desired probability. False alarm probability data 1120 may further be received from system feedback module 234, baseline agreement information 232, or otherwise.

Facility monitoring module 230 includes critical value module 1102. Critical value module 1102 is configured to calculate a critical value for the $Z_{\Delta\beta}$ statistic. Critical value module 1102 may be configured to perform a cumulative probability distribution inversion calculation as described in FIG. 12, according to an exemplary embodiment.

Facility monitoring module 230 further includes data window module 1104, data collection module 1106, and test statistic module 1108. Data window module 1104 is configured to determine initial data window parameters for the processes of FIGS. 8B and 9B and may have the same functionality as data window module 1002 of FIG. 10. Data collection module 1106 collects building data and provides the data to data window module 1104 for filling the two data windows. Test statistic module 1108 is configured to calculate a test statistic using predictor variables 1010. Test statistic module 1108 may calculate the test statistic may have the same functionality as test statistic module 1006 of FIG. 10.

Facility monitoring module 230 further includes energy savings module 1110 and reporting module 1112. After calculating the test statistic and determining if a change in static factors has occurred, energy savings module 1110 is configured to calculate the energy savings or cost associated with the change, and reporting module 1112 is configured to generate a report about the change. Facility monitoring module 230 may use energy savings module 1110 and reporting module 1112 to generate a report to provide to system feedback module 234 for user output and analysis. Energy savings module 1110 may have the same functionality as energy savings module 1008 of FIG. 10, according to an exemplary embodiment.

Figure 12:
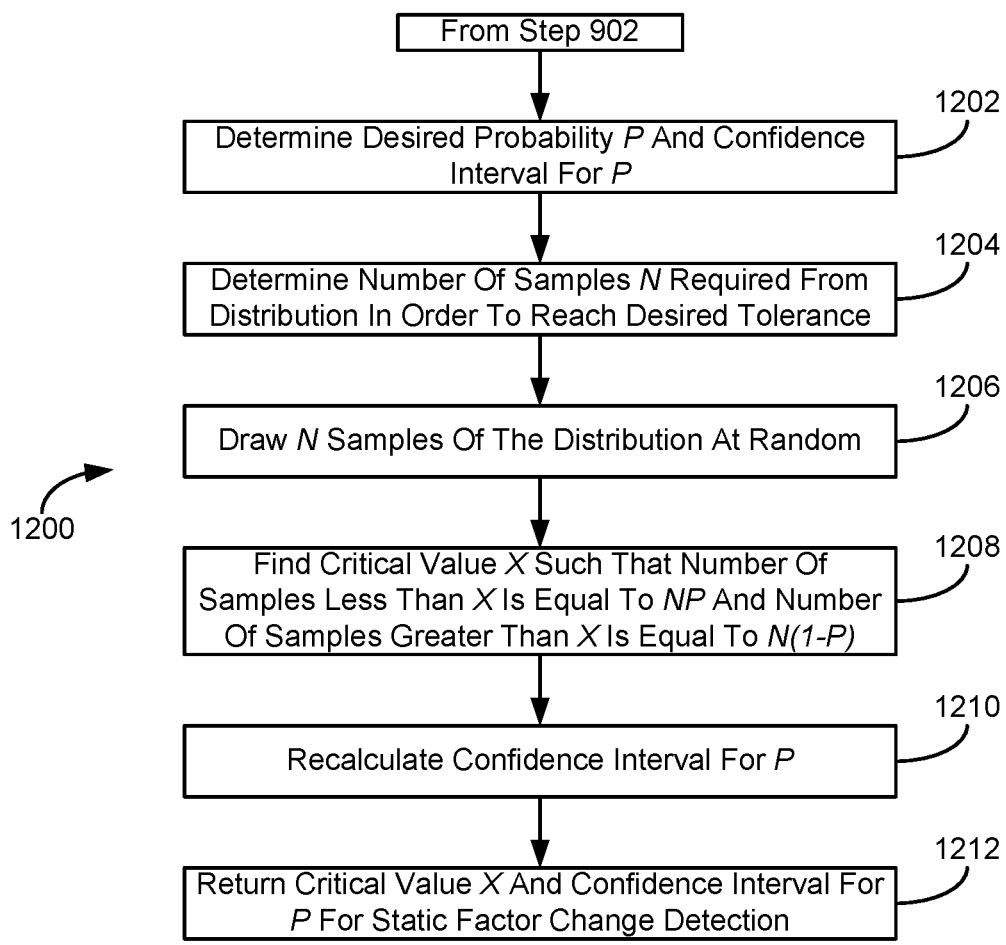
FIG. 12 is a flow chart of evaluating an inverse of a cumulative probability distribution function for determining a critical value for the process of FIG. 9A, according to an exemplary embodiment.

Referring now to FIG. 12, process 1200 is used to find a critical value for a maximum of a sequence of standardized F-statistics ($Z_{\Delta\beta}$ statistics) where the sequence is determined using the process described in the present disclosure. Process 1200, according to an exemplary embodiment, converts the problem of finding this critical value to a problem of finding a critical value for a maximum element of a multivariate normal vector with a known covariance matrix. In an exemplary embodiment, this problem is solved by performing a Monte Carlo simulation to find the inverse cumulative distribution function (CDF). Process 1200, therefore, evaluates an inverse of a CDF to ultimately use the values to reject or accept a null hypothesis of an accurate and constant baseline model, according to an exemplary embodiment.

In multiple hypothesis tests, correlation of the test statistics may largely impact the conservativeness of typical methods for suppressing the family-wise probability of falsely rejecting the null hypothesis (Bonferroni's method, for example). For example, if multiple statistics two data sets are highly correlated, the statistics do not differ by a significant amount. Thus, direct applications of Bonferroni's method would be very conservative and greatly reduce the power of the test (probability of correctly identifying a change in the model coefficients). In the embodiments of the present disclosure, if static factors are not changing, the statistics calculated using the windowing method described previously should be highly correlated. Window data selection steps described above could be designed to maintain this high correlation during normal behavior. For example, during the reporting period, the last data point inserted into the second data window replaces the oldest data point in the first data window, meaning that only two data points have changed since the last calculation. Using the inverse CDF process of FIG. 12, values that are generated are suitable for use for determining the accuracy and consistency of a baseline model without having the issue of highly correlated data skewing the results. This is done by determining the autocorrelation of the test statistics, which is dependent on the method used to window the data and to slide the window forward, and using the correlation to directly calculate (or approximate) the inverse CDF of the maximum of this autocorrelated sequence.

Evaluation of the inverse CDF can be phrased as, given a value p (e.g., a desired probability), find a value x such that $P(X<x)=p$, where X is a random variable, in the current disclosure the maximum of the sequence of statistics and x is the argument of the CDF, which in the current disclosure corresponds with the critical value of the null hypothesis (e.g., the value of step 708 of process 700 for the null hypothesis test). In context of the present disclosure, this means the inverse CDF is used to determine a critical value such that the probability that the maximum of the sequence of statistics is equal to the desired probability p typically equal to one minus the indicated probability of falsely rejecting the null hypothesis.

If several samples from drawn from the distribution of data points, a point estimate for the probability p is given by:

$$\hat{P}(X<x) = \hat{p} = \frac{n_{\{X<x\}}}{n}$$

with an associated $1-\alpha$ confidence interval for p given by the equation in step 1210 below. The confidence interval $1-\alpha$ indicates a desired probability that the true value of p resides within the band $\hat{p}$ plus or minus the tolerance.

Process 1200 includes determining a desired probability p (e.g., the p value of $P(X<x)=p$) and a confidence interval for p (step 1202). The desired probability p and confidence interval may be chosen by a user of the building. The confidence interval should be determined such that probabilities with values on the upper and lower limits of the interval are accepted at the $1-\alpha$ confidence level. Process 1200 is configured to return a value such that all probabilities within the $1-\alpha$ confidence interval are included in the range defined by the upper and lower limits. This guarantees that the probability that the actual value of p for the returned value is between the upper and lower limits is greater than $1-\alpha$.

Process 1200 further includes determining the number of samples required to draw from the distribution in order to reach a desired tolerance (step 1204). The number of samples n may be found by using an iterative root finding technique where the objective is to find n such that:

$$\max\left(\frac{n\hat{p}F^{-1}_{2n\hat{p},2[n(1-\hat{p})+1]}(a/2)}{n(1-\hat{p})+1+n\hat{p}F^{-1}_{2n\hat{p},2[n(1-\hat{p})+1]}(a/2)} - \text{low limit},\right.$$

-continued $$\left.\text{high limit} - \frac{(n\hat{p}+1)F^{-1}_{2[n\hat{p}+1],2n(1-\hat{p})}(1-a/2)}{n(1-\hat{p})+(n\hat{p}+1)F^{-1}_{2[n\hat{p}+1],2n(1-\hat{p})}(1-a/2)}\right) = 0,$$

where $\hat{p}$ is given the value of p and the low limit and high limit are the upper and lower limits of the $1-\alpha$ confidence interval.

Process 1200 further includes drawing n samples of the distribution at random (step 1206). The samples can be drawn by simulating a linear model and performing the process or in order to do an approximation from a multivariate normal distribution. Using the samples, a critical value x is found such that the total number of samples n drawn less than x is equal to np (e.g., the number of samples times the probability of each individual sample being less than x) and the total number of samples greater than x is equal to $n(1-p)$ (e.g., the number of samples times the probability of each individual sample being greater than x) (step 1208).

Process 1200 further includes recalculating the $1-\alpha$ confidence interval for p (step 1210). The equation used for the calculation may be the following:

$$P\left(\frac{n\hat{p}F^{-1}_{2n\hat{p},2[n(1-\hat{p})+1]}(a/2)}{n(1-\hat{p})+1+n\hat{p}F^{-1}_{2n\hat{p},2[n(1-\hat{p})+1]}(a/2)} < p <\right.$$

$$\left.\frac{(n\hat{p}+1)F^{-1}_{2[n\hat{p}+1],2n(1-\hat{p})}(1-a/2)}{n(1-\hat{p})+(n\hat{p}+1)F^{-1}_{2[n\hat{p}+1],2n(1-\hat{p})}(1-a/2)}\right) = 1-a.$$

Process 1200 further includes returning the critical value x and the confidence interval $1-\alpha$ for p (step 1212). The critical value is found by taking the smallest value that will result in a fraction of samples less than x to be greater than p. x is used for static factor change detection by process 900 of FIG. 9 and static factor change module 1100 of FIG. 11. For example, x is used as the critical value in step 902 of process 900. The difference calculated through each iteration of steps 906-908 is compared to the value of x in step 910.

Figure 13:
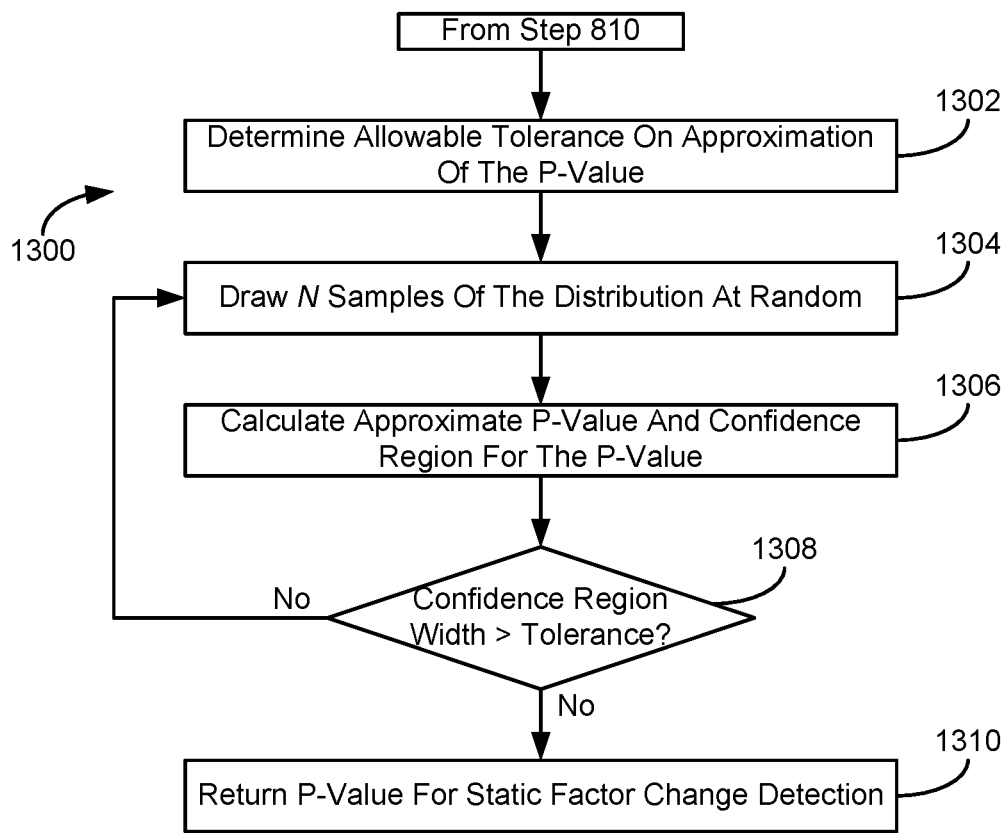
FIG. 13 is a flow chart of calculating a P-value for the process of FIG. 8A, the P-value for use in determining changes in static factors, according to an exemplary embodiment.

Referring now to FIG. 13, a process 1300 of determining a P-value is shown, according to an exemplary embodiment. Process 1300 may be used to determine the P-value to use during baseline period detection of static factor changes (e.g., step 814 of FIG. 8A). In process 800 of FIG. 8A, since the P-value is not known, an approximate P-value is found using process 1300, and it is determined if the approximate P-value is suitable for use in process 800. Compared to process 1200 for finding a critical value given a known P-value, process 1300 includes having a maximum of a statistic and determining the P-value instead.

Process 1300 includes determining an allowable tolerance on the approximation of the P-value (step 1302). The allowable tolerance may be set by a user of the building management system or may be determined by process 800 or another system of the building management system. The allowable tolerance relates to a confidence interval or region for which the P-value should fall under. For example, the set allowable tolerance may be compared to the width of the calculated confidence interval (see step 1308).

Process 1300 includes drawing a number of samples N of the distribution (e.g., data from the two data windows) at random (step 1304). The number of samples taken may be determined by approximation by taking the maximum of a normal random vector with appropriate correlations or by simulation of the actual process of calculating the maximum statistic.

Using the samples N, an approximate P-value is calculated as well as a confidence region or interval for the P-value (step 1306). The P-value is calculated using the method of step 814 of FIG. 8A, according to an exemplary embodiment. The confidence region for the approximate P-value is also determined in step 1306. The confidence region is a region for which the probability of the actual P-value being within the confidence region is greater than a specified threshold. The confidence region is a function of both the number of samples used in the Monte Carlo simulation (e.g., determined in step 1304) and the P-value (determined in step 1306). For example, for a given P-value P' and confidence interval for the P-value of [P'−a, P'+b] (where a and b are chosen or calculated based on the desired threshold) the probability that the actual P-value falls within the confidence interval should be equal to a specified threshold (e.g., 95%).

Process 1300 further includes comparing the width of the confidence region to the tolerance determined in step 1302 (step 1308). If the confidence region is smaller than the tolerance, then the approximate P-value for which the confidence region is based on is accepted and the P-value is returned to, for example, process 800 for determining a change in static factors (step 1310). If the confidence region is greater than the tolerance, then the approximate P-value is rejected since the approximation of the P-value is not reliable or close enough. Process 1300 then draws another N samples for calculating a new approximate P-value (step 1304). Step 1308 of comparing the confidence region to the tolerance can be described as determining if enough samples N were used to approximate the P-value. For example, as more samples are used to approximate the P-value, the confidence region is reduced as the approximation is more accurate due to the use of additional samples.

One embodiment of the present disclosure relates to a method for calculating a P-value associated with a baseline period test statistic (e.g., a Z-statistic related to a difference in model coefficients). The method includes calculating an approximate P-value. The approximate P-value may be calculated using a number of random samples of the distribution of data used to calculate the model coefficients. The method further includes calculating a confidence interval for the P-value and determining the accuracy of the approximate P-value using the confidence interval. The method further includes estimating that the approximate P-value is a reliable P-value when the approximate P-value is within the confidence interval. The approximate P-value may then be used further steps and calculations (e.g., to determine energy usage and energy usage changes). If the approximate P-value is not within the confidence interval during the estimating step, then a new approximate P-value is calculated. The new approximate P-value may be calculated by selecting new samples of the distribution of data used to calculate the model coefficients.

One embodiment of the present disclosure includes a method for calculating a critical value associated with a known distribution of data points. The critical value is calculated such that the probability that any given test statistic is greater than the critical value matches a predefined probability of falsely determining that a model has changed in a significant way. The method includes determining a desired probability (e.g., user-selected, preselected). The method further includes simulating (e.g., using a Monte Carlo simulation), for varying samples of the known distribution of data relevant data points, a process of finding the test statistic. The results of the simulations, the desired probability, and a desired confidence interval are used to calculate the critical value. The method further includes using the critical value and confidence interval in a comparison against a test statistic to determine if the model has changed.

Graphical User Interfaces for Creating and Using a New Baseline Model

Referring now to FIGS. 14A-14K, exemplary graphical user interfaces (GUIs) for the BMS are shown. In an exemplary embodiment, the BMS receives a selection of one or more variables for generating a baseline model from a user interface device (e.g., from a computer terminal, a mobile device, etc.). A system feedback module 234 of BMS computer system 200, for example, as shown in FIG. 1C, may cause the GUIs of FIGS. 14A-14K to be displayed on a user interface using user I/O 240. Input calibration module 236 of BMS computer system 200 may receive the selection of the one or more variables from the user interface device and provide the selection to baseline calculation module 210. The GUIs provide an interactive process for allowing a user to review and revise which variables and observation periods of those variables are used in the calculation of the baseline calculation. In some embodiments, the BMS may validate the user selections and/or suggest variables to be used in the baseline calculation.

Figure 14E:
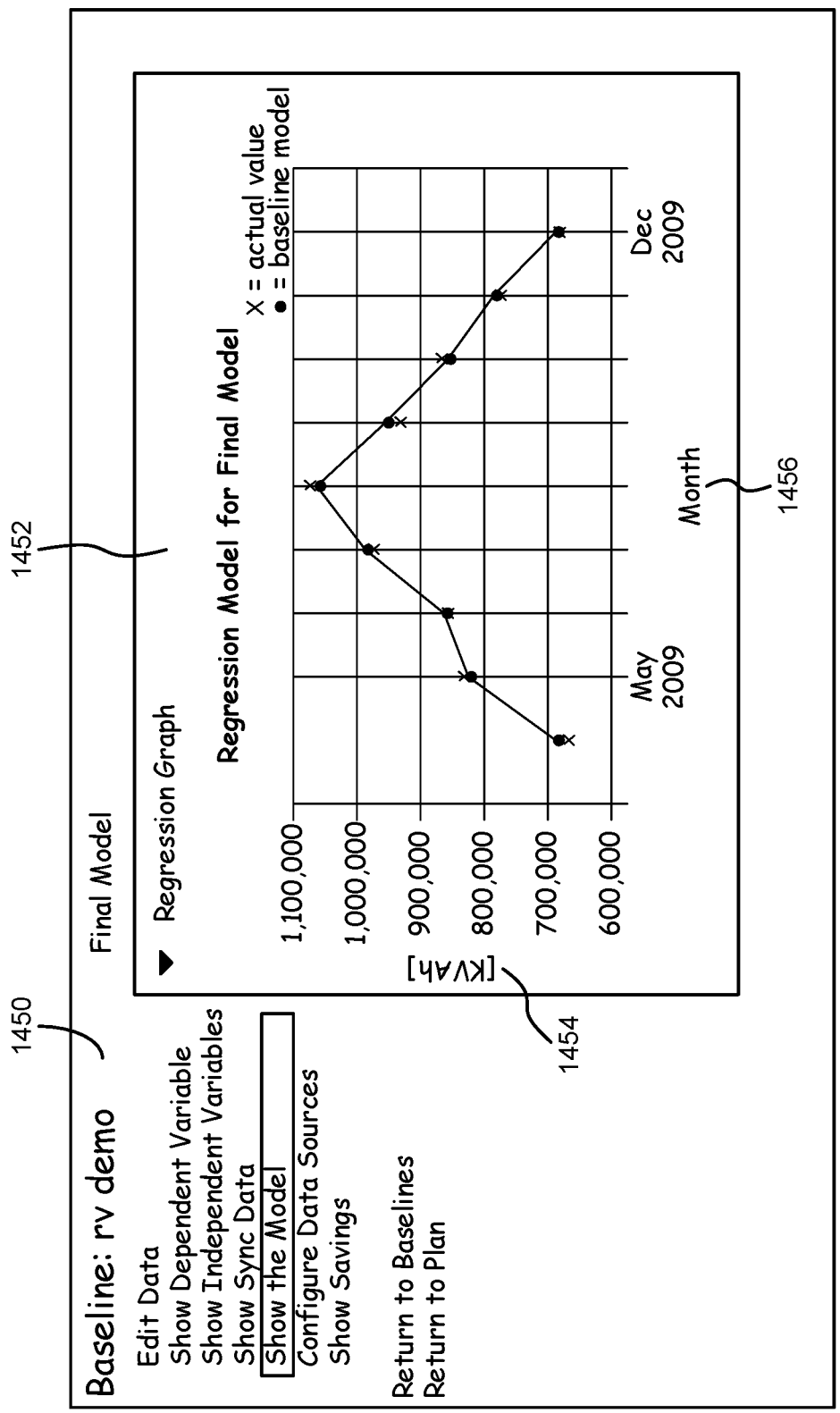

FIG. 14A illustrates an exemplary screen 1400 for initiating the creation of a new baseline. Screen 1400 includes a number of input fields configured to receive data input from a user interface device. For example, input fields may be drop-down boxes, text fields, buttons, radials, dials, slide bars, or any other form of graphical input configured to receive a selection from a user interface device. Similar fields may be used in the GUIs of FIGS. 14B-14K.

Screen 1400 may include name field 1402 and description field 1404. Such fields allow baselines to be stored and easily identified by a user. For example, a user may provide different names and/or descriptions for baselines of different buildings, campuses, or the like. In some embodiments, the name entered into name field 1402 may be used as a database identifier for the created baseline (e.g., stored in BMS database 206 or another location).

Screen 1400 may also include a number of input fields used to select the appropriate historical measurement data used to generate the baseline model, as well as the appropriate measurement data (e.g., from facility monitoring module 230) to compare to the baseline model. For example, screen 1400 may include facilities field 1406, which is used to identify the facility for which the baseline is to apply. Facilities field 1406 may allow a selection of a building, campus, zone, or other area to be analyzed. Screen 1400 may also include one more date fields 1408, 1410 to receive a selection of a time period over which the historical measurement data is to be retrieved. For example, historical measurements over the course of a previous year may be used to generate the baseline model.

Screen 1400 may also include a number of input fields that allow a user to select the type of utility usage. For example, screen 1400 may include utility fields 1412, 1414 and 1416, which receive inputs of the type of utility, how the utility charges for power (e.g., by consumption, demand, etc.), and a unit of measure. As shown, utility fields 1412, 1414 and 1416 may be used to generate a baseline model used to evaluate electric power consumption by the selected facility.

FIG. 14B illustrates an exemplary screen 1420 for receiving a selection of a dependent variable. In general, a dependent variable may be any BMS measurement that may be related to another measurement. Typically, a dependent variable is a power consumption that is related to one or more independent variables. For example, an energy consumption may be dependent upon the outdoor air temperature for the facility. If the outdoor air temperature is higher than the building's cooling balance point temperature, additional power may be consumed by HVAC equipment to provide chilled air to the facility. Similarly, additional power may be consumed by HVAC equipment to provide heated air to the facility, if the outdoor air temperature is lower than the building's heating balance point temperature.

Screen 1420 may include input fields that allow a selection of a name and/or abbreviated name. For example, screen 1420 may include name fields 1421, 1422, which receive selections of a name and an abbreviation, respectively.

Screen 1420 may also include a source field 1423 that allows a measurement source (e.g., a meter, a sensor, etc.) to be selected. The source selected by source field 1423 is used to retrieve the historical data from memory that is used to generate the baseline. For example, if the dependent variable selected in screen 1420 is a power consumption, an electric meter may be selected via source field 1423. Measurement data stored in the BMS database (e.g., BMS database 206) associated with the selected meter is then used to generate the baseline.

Screen 1420 may also include indicia relating to the utility information selected in screen 1400. For example, screen 1420 may include indicia 1425, 1426, which displays the utility type and charge type selected in screen 1400. Since the dependent variable is typically an energy consumption, indicia 1425, 1426 allows a user to review the associated utility information that was selected for the baseline. For example, a user that selects electric power consumption in screen 1400 may review indicia 1425, 1426 to ensure that an appropriate source is selected for the measurement data in source input 1423.

Screen 1420 may also include input fields used to further define the selected measurement source. For example, screen 1420 may include input fields 1424, 1427, and 1428, which allow further refinement of how the measurement data is to be retrieved and used to create the baseline. For example, input fields 1427, 1428 may be used to specify that instantaneous power consumptions measured in kilowatts should be retrieved for the electric meter specified in source field 1423.

FIG. 14C illustrates an exemplary screen 1430 for receiving a selection of an independent variable. An independent variable is one in which its measurement is not affected by another measurement variable. For example, the outdoor air temperature is a function of the weather and is not affected by other parameters of a facility. One or more independent variables may be selected via screen 1430 that correspond to the dependent variable entered in screen 1420. For example, the energy consumption of a building may depend on independent factors such as the outdoor air temperature, the outdoor air humidity, and the occupancy of the building. Screen 1430 may be used multiple times to enter such values into the BMS for creation of a baseline model. In some embodiments, additional variables may be automatically calculated and selected. For example, if the outdoor air temperature and outdoor air humidity are selected as independent variables, other weather related variables (e.g., cooling degree days, cooling energy days, enthalpy, heating degree days, heating energy days, etc.) may also be calculated and selected by the BMS for possible use in the baseline model.

Screen 1430 may include input fields that allow a selection of a name and/or abbreviated name. For example, screen 1430 may include name fields 1431, 1432, which receive selections of a name and an abbreviation, respectively. Similar to the name fields of screen 1420, name fields 1431, 1432 allow a user to define how the dependent variables entered in screen 1430 are represented in other screens.

Similar to screen 1420, screen 1430 may include a source field 1433 that allows a measurement source (e.g., a meter, a sensor, etc.) to be selected for the dependent variable. The source selected by source field 1433 is used to retrieve the historical data from memory that is used to generate the baseline. For example, if the independent variable selected in screen 1430 is a temperature measurement, source field 1433 may be used to specify from which sensor the temperature measurement data is to be retrieved. Indicia 1435 may be associated with source field 1433 and provide further information about the selected source. For example, the outdoor air temperature source selected in source field 1433 may correspond to a temperature sensor operated by National Oceanic and Atmospheric Administration (NOAA).

Screen 1430 may also include a number of fields used to further refine the measurement data for the selected dependent variable. For example, screen 1430 may include inputs 1434, 1436. Input 1434 may be used to specify that the measurement data will be retrieved as a stream, period of time (e.g., billing periods), or as calendar months. Input 1436 may be used to specify the scale for the specified dependent variable. For example, temperature may be represented in Fahrenheit, Celsius, Kelvin, etc.

FIG. 14D illustrates an exemplary screen 1440 for providing validation information about the variables selected via screen 1420, 1430. In some embodiments, the BMS may validate that the selected variables for the baseline have sufficient historical measurement data before generating the baseline. For example, data clean-up module 212 of BMS computer system 200 may verify that sufficient data points exist for each of the selected variables. In general, each variable used to generate the baseline must include data over time periods that correspond to the time periods with data for each of the other variables. For example, a meter reading from a particular day must also have corresponding temperature, humidity, and occupancy values for that day.

Screen 1440 may provide a warning 1441, if the selected variables do not have data values that correspond to an overlapping time frame. For example, as shown, warning 1441 indicates that insufficient historical data points exist for the specified time period for variables 1442. Data clean-up module 212 may impose, for example, a condition that historical data used to generate the baseline overlap for a sufficient amount of time. In particular, occupancy data over a time period of ten months does not sufficiently overlap that of the rest of variables 1442. In some embodiments, screen 1440 may allow a user to continue to generate a baseline, even if a warning is issued. For example, a baseline may still be generated using data over a period of ten months, instead of the recommended twelve months. In this way, the BMS may provide suggestions to the user, while a baseline is user-defined.

FIG. 14E illustrates an exemplary screen 1450 for providing a visualization of a regression graph using the selected variables. In some embodiments, if the user selects to proceed with the variables shown on screen 1440, even if a warning is issued, the BMS may use the variables to generate the regression model for the variables. For example, data synchronization module 214 may synchronize the historical data for the variables (e.g., by temporally matching the variables, etc.) and provide the synchronized values to regression analysis module 216. Regression analysis module 216 performs regression on the synchronized values to generate a baseline. In some embodiments, the BMS may calculate a baseline using different variables, if warnings are issued in screen 1440. For example, baseline calculation module 210 may select variables for the baseline calculation as suggestions for a user, if warnings are issued in screen 1440.

Screen 1450 may include a graph 1452 of the baseline generated by regression analysis module 216. Graph 1452 provides a visualization of the regressed data. This allows a user to visually inspect the generated baseline, to ensure that the baseline is correct. Graph 1452 may display independent variable 1454 and its relation to time period 1456. For example, graph 1452 may show electrical power consumption over the course of a number of months. A user may visually inspect graph 1452 to verify that the power consumption for the baseline period is correct, such as an increase in power consumption during summer months, due to an increase in demand for cooling.

In embodiments in which the BMS is configured to suggest variables to be used for the baseline calculation, graph 1452 may be generated using those suggested variables, instead. For example, if warnings are issued in screen 1440, graph 1452 may be generated using variables different than those selected via screen 1430. In such a case, regression analysis module 216 may determine that other variables stored in BMS database 206 demonstrate a greater correlation to the dependent variable or variables entered via screen 1430. For example, graph 1452 may be generated by performing regression using energy usage data and cooling energy days as the independent variable, instead of using outdoor air temperature, outdoor air humidity, and occupancy variables.

FIG. 14F illustrates an exemplary screen 1460 for selecting inputs for the baseline model. Screen 1460 may include subscreen 1461 to accept selections of the inputs used to generate the baseline model. Subscreen 1461 may be displayed, for example, in conjunction with the display of graph 1452 (e.g., screen 1450 and screen 1460 are part of the same display). Subscreen 1461 may include inputs 1462 that receive selections of variables to be used as inputs to the model. For example, variables selectable via inputs 1462 may include cooling degree days (CDD), cooling energy days (CED), days off, enthalpy, heating degree days (HDD), heating energy days (HED), outdoor air humidity (OAH), outdoor air temperature (OAT), occupancy (OCC), or any other measurement relating to energy usage of a building. In various embodiments, some or all of inputs 1462 may be determined automatically, based on the categories of variables entered via screen 1420 and/or screen 1430. For example, selection of weather-related variables may cause screen 1460 to display other weather-related variables as part of inputs 1462.

Subscreen 1461 may also include inputs 1463 for receiving a selection of one or more time periods for the model inputs. For example, inputs 1463 may allow a user to select data taken at specific time periods, dates, or ranges of dates. In one embodiment, data retriever 208 analyzes measurement variables stored in BMS database 206 to determine the periods available for selection via inputs 1463.

In embodiments in which the BMS automatically selects variables to be used to calculate the baseline model, the selected values may be highlighted or using some other indicia to denote that graph 1452 in screen 1450 is not generated using the variables specified by the user. Such a feature helps to prevent a user from creating a baseline that does not lead to an accurate estimate of the post-installation energy savings. Subscreen 1461 may, however, still include override input 1464, which allows a user to still override the variables used for the baseline model with those variables selected by the user.

Other data may also be overridden using override input 1464. For example, balance points 1465 may be overridden if override input 1464 is selected. In general, balance points provide an estimate at what outdoor temperature or enthalpy cooling is need or below outdoor temperature or enthalpy heating is needed. For example, the heating degree days balance point for heating may be an outdoor air temperature of 55 degrees Fahrenheit. However, selection of override input 1464 may allow this value to be changed in subscreen 1461.

Figure 14G:
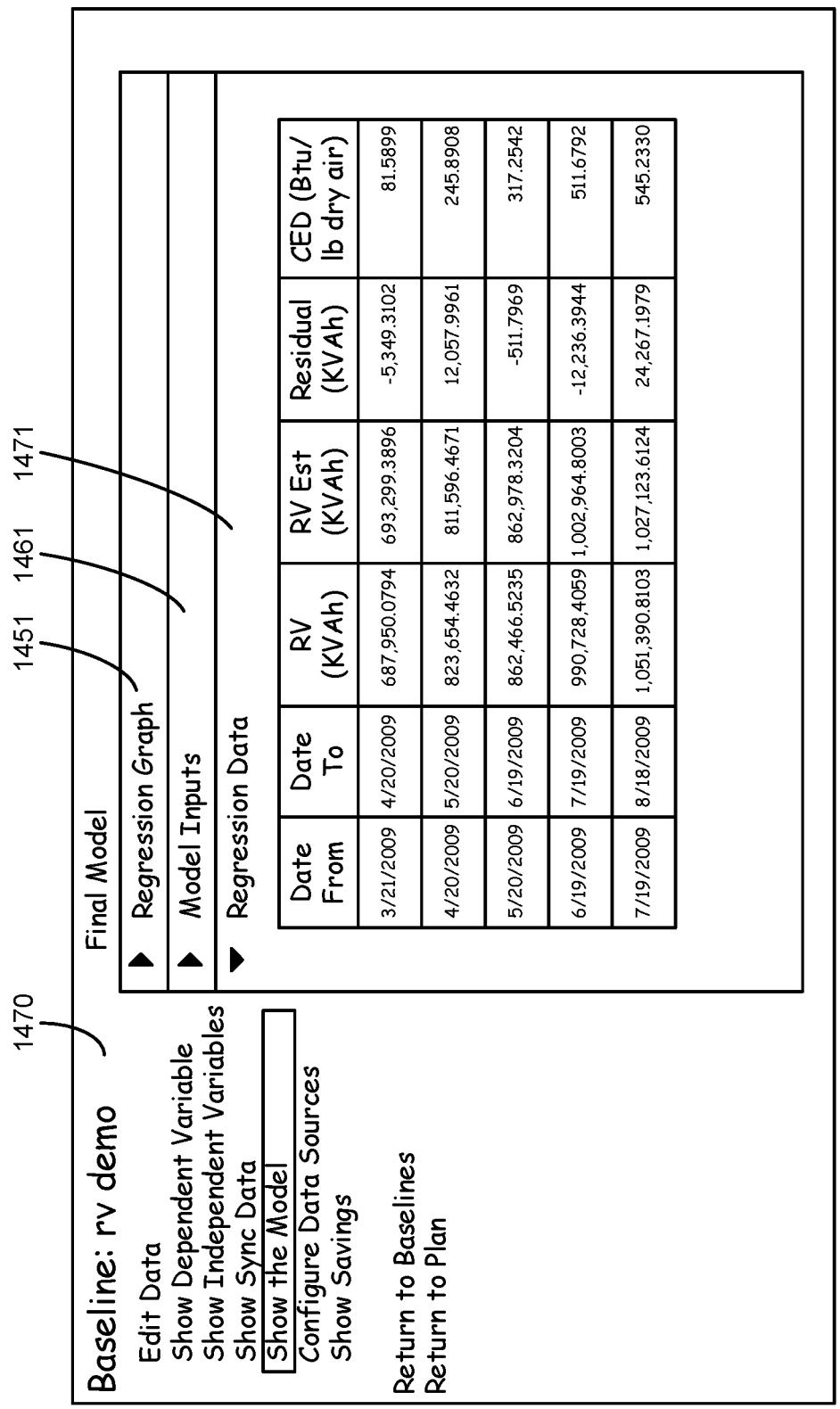

FIG. 14G illustrates an exemplary screen 1470 for providing additional information about the regression data used to generate graph 1452 in screen 1450. Screen 1470 may include subscreen 1471, which displays the regression data (e.g., as a table, chart, list, etc.) for the time periods that were used by regression analysis module 216 to generate graph 1452. For example, subscreen 1471 may display regression data in month-long intervals. As shown, regression CED values corresponding to the time periods are also shown in subscreen 1471. Subscreen 1471 may be provided in conjunction with subscreens 1461 and 1451 (e.g., as a selectable drop-down, as a separate tab, etc.).

Figure 14H:
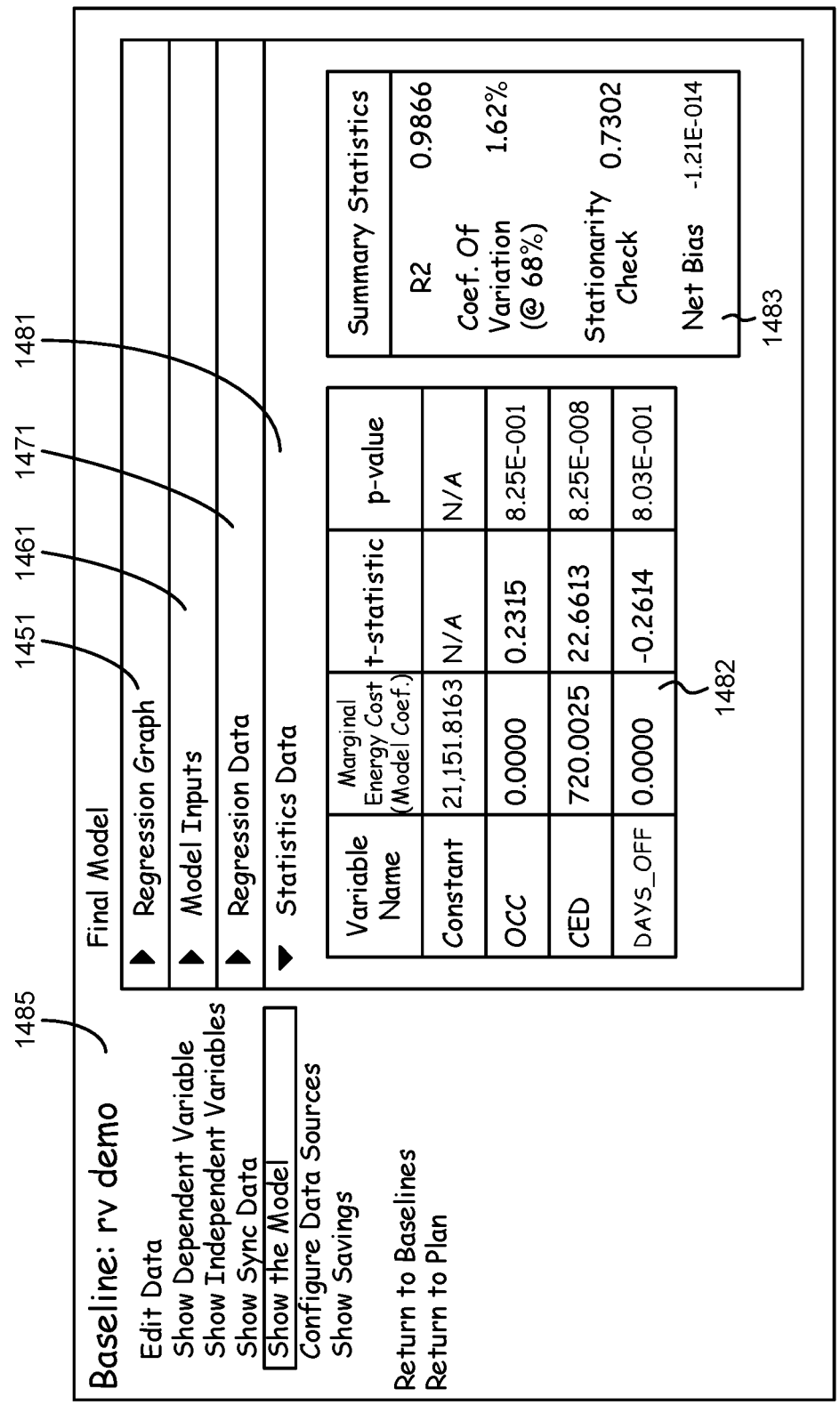

FIG. 14H illustrates an exemplary screen 1485. As shown, screen 1485 includes subscreen 1481 for providing statistics on variables selected to generate the baseline. In some embodiments, subscreen 1481 may also be provided in conjunction with subscreens 1451, 1461, and 1471 (e.g., as a dropdown, tab, etc.). Subscreen 1481 allows a user to further evaluate statistics for the variables selectable via variable inputs 1462 on subscreen 1461. For example, the model coefficient, t-statistic, and p-value may be displayed in window 1482 for each of the selectable variables.

Summary statistics 1483 may also be provided by subscreen 1481. In general, summary statistics 1483 are those statistics that are not tied to one particular variable, but provide overall metrics on the data. For example, summary statistics 1483 may include statistics on the coefficient of determination (R2), stationarity, variation, bias, and/or other statistics that can be used to analyze the usefulness of the historical measurement data. For example, a low p-value for the stationarity check may indicate that the regression coefficients and/or variance of the data changes over time.

Figure 14I:
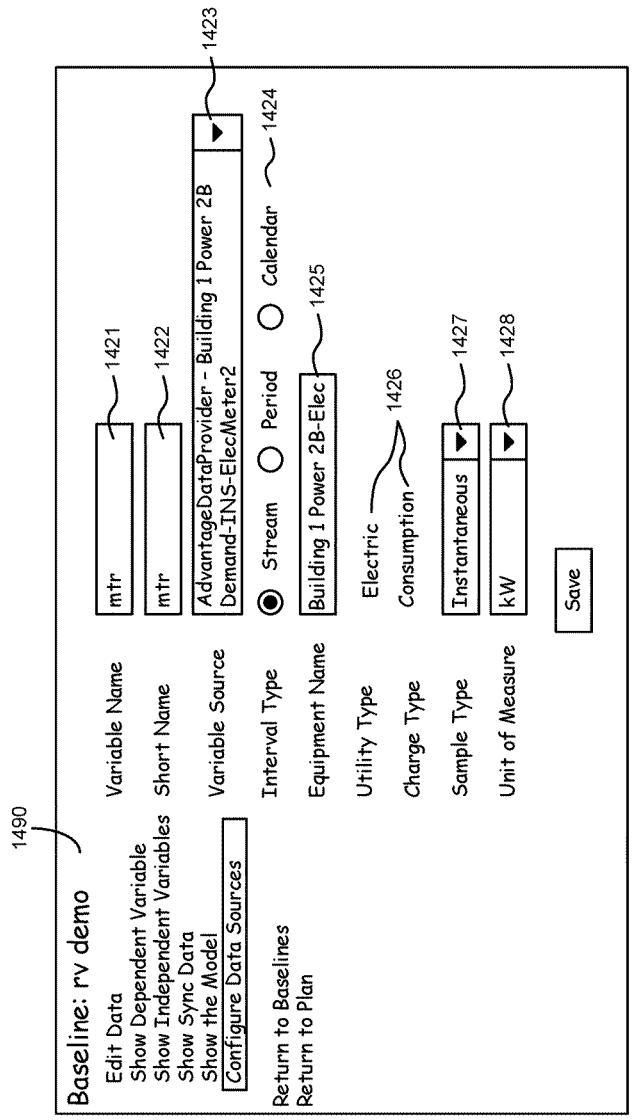

FIG. 14I illustrates an exemplary screen 1490. Once a user has accepted a baseline model, screen 1490 may be used to change selections of data sources from which measurement data is to be collected and compared against the baseline model. Screen 1490 may include input fields similar to that of dependent or independent variable input screens 1420, 1430. For example, screen 1490 may include name inputs 1421, 1422, source input 1423, inputs 1424, 1427, 1428, and/or indicia 1425, 1426, similar to that of screen 1420.

In one example, post-installation energy usage may be measured at a meter specified via screen 1490. For example, facility monitoring module 230 may use measurements from the source specified by source input 1423 on screen 1490 to retrieve post-installation energy consumption readings. These readings can then be used to compare with the generated baseline model.

Figure 14J:
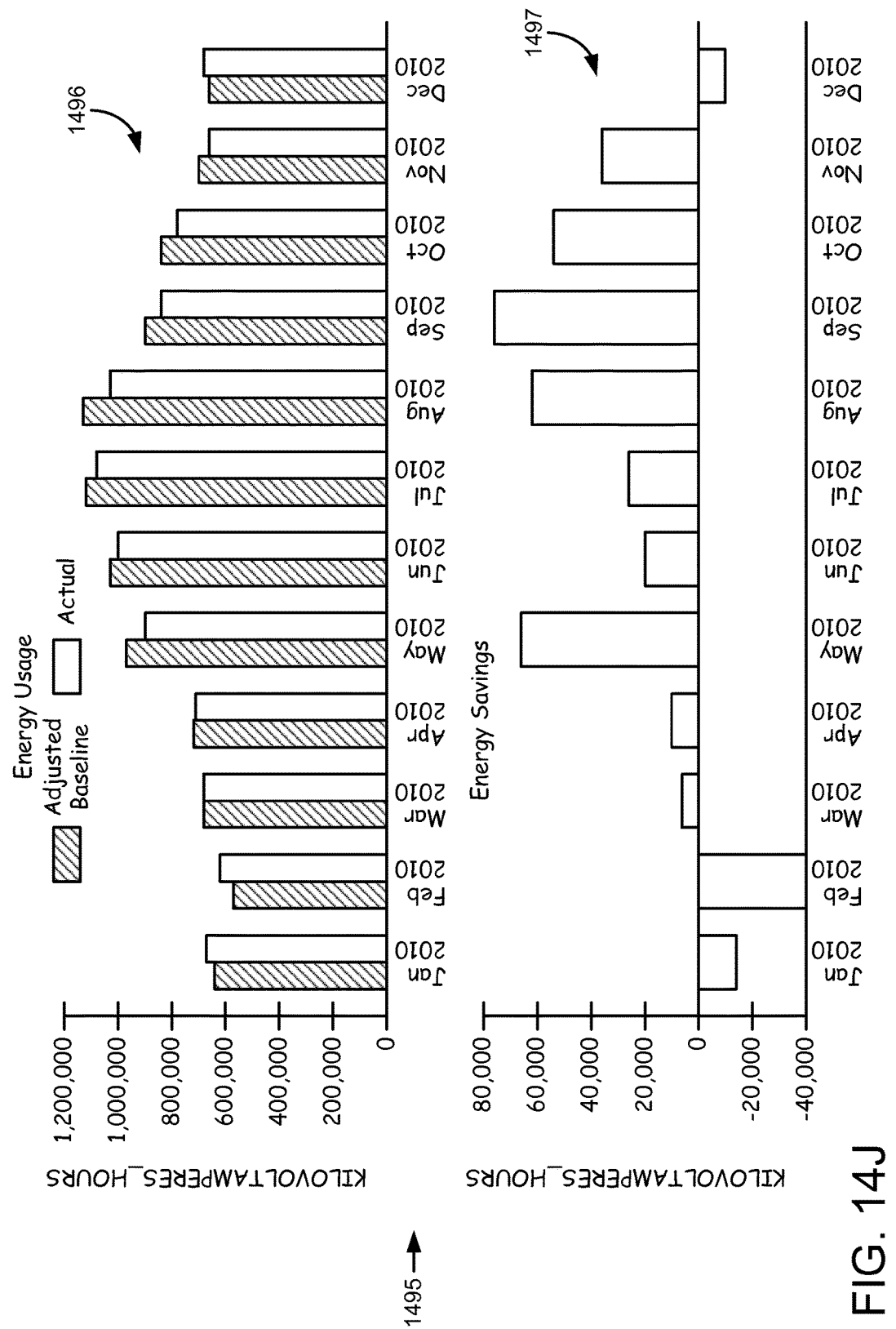
Figure 14K:

FIGS. 14J and 14K illustrate exemplary reporting screens. Once a baseline model has been calculated, it can be used as a point of comparison for more recent energy consumptions. Such a comparison may indicate, for example, the amount of energy savings over that of the baseline, financial amounts associated with the savings, statistics on how the savings change over time, and other information relevant to the energy use of the specified facility.

FIG. 14J illustrates an exemplary screen 1495 for providing energy usage information to the user. Screen 1495 may include a graph 1496 that compares the actual energy usage against the energy usage baseline over certain periods of time. Screen 1495 may be generated using an IPMVP algorithm part of AM&V layer 110, as discussed previously. In one example, the actual energy usage in July 2010 is less than that of the baseline, showing that the energy consumption in July was less than the estimated energy usage of the building without any energy efficiency retrofits.

Screen 1495 may also include graph 1497 for displaying the calculated energy savings. Graph 1497 may be generated, for example, by determining the difference between an actual energy consumption and baseline, as shown in graph 1496. This allows a user to easily view and determine the post-installation energy savings. As shown, the energy savings may fluctuate during an installation period. Once the installation period is complete, the energy savings are generally positive (e.g., less energy has been consumed than estimated using the baseline model).

FIG. 14K illustrates an exemplary screen 1499 which also provides energy usage information to a user. Screen 1499 conveys similar information as that of screen 1495, except that screen 1499 is in table form. Screen 1499 may also include information about when installation was performed (e.g., the installation period between January and June) and the post-installation period (e.g., the period from June through December). This allows a user to account for fluctuations in the energy savings that may occur during the installation period. Screen 1499 may also include additional calculations, such as the savings as a percentage of the baseline. For example, if the baseline energy usage for a particular month is 500,000 KVAh, a decrease of 5,000 KVAh may be reflected as a positive 1% savings over the baseline.

While many of the embodiments of the present disclosure relate to baseline models for energy use, measurement and verification features provided by the above systems and methods may be performed on many building resources or energy types. For example, the measurement and verification as described in the present disclosure may be applied to resource consumption types including electrical energy (or power/demand) usage, natural gas usage, steam usage, water usage, and other types of resource usage or consumption. As one example, gas and steam consumption can be used in the energy usage models described herein. As another example, water usage or consumption (and/or other types of resource consumption by a building) may be represented and processed using, e.g., the baseline models and varying related systems and methods of the present disclosure.

Configurations of Various Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can include RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A building management system comprising:
   HVAC equipment configured to affect an environmental condition within a building by providing heating or cooling to the building;
   one or more sensors configured to measure one or more predictor variables for potential use in a baseline energy usage model for the building, wherein the baseline energy usage model predicts an energy consumption of the HVAC equipment; and
   a baseline model generator comprising a processing circuit configured to:
   receive an initial set of predictor variables including the one or more measured predictor variables;

generate a first set of coefficients for the baseline energy usage model based on the initial set of predictor variables;
remove one of the predictor variables from the initial set of predictor variables to create a subset of the initial set of predictor variables;
generate a second set of coefficients for the baseline energy usage model based on the subset of the initial set of predictor variables;
calculate a test statistic for the removed variable using a difference between the first set of coefficients and the second set of coefficients; and
automatically select the removed predictor variable for use in the baseline energy usage model in response to the test statistic exceeding a critical value.

2. The system of claim 1, wherein the processing circuit is configured to determine that the removed predictor variable is statistically significant to energy usage of the building in response to the test statistic exceeding the critical value.

3. The system of claim 1, wherein the processing circuit is configured to:
generate the first set of coefficients by applying a regression analysis to the initial set of predictor variables; and
generate the second set of coefficients by applying a regression analysis to the subset of the initial set of predictor variables.

4. The system of claim 1, wherein the initial set of predictor variables comprises a calculated predictor variable based on one or more of the measured predictor variables.

5. The system of claim 1, wherein the processing circuit is configured to:
receive a user selection of one or more predictor variables via a user interface device; and
add one or more predictor variables to the initial set of variables based on the user selection.

6. The system of claim 1, wherein the processing circuit is configured to:
receive a user selection of a data source via a user interface device;
identify one or more predictor variables provided by the data source; and
add the one or more identified predictor variables to the initial set of predictor variables.

7. The system of claim 1, wherein the processing circuit is configured to:
collect data points for each of the predictor variables in the initial set of predictor variables, each data point having a data value and a time value;
identify a time period during which all of the predictor variables in the initial set of predictor variables have a threshold number of data points based on the time values for each of the data points; and
using the identified time period to generate the first set of coefficients for the baseline energy usage model.

8. The system of claim 1, wherein the processing circuit is configured to:
use a first set of building data collected during a first time period to generate a third set of coefficients for the baseline energy usage model;
use a second set of building data collected during a second time period to generate a fourth set of coefficients for the baseline energy usage model; and
detect a fault in the building in response to a difference between the third set of coefficients and the fourth set of coefficients exceeding a threshold value.

9. The system of claim 1, wherein the processing circuit is configured to:
use a first set of building data collected prior to implementing energy conservation measures to generate a third set of coefficients for the baseline energy usage model;
use a second set of building data collected after implementing the energy conservation measures to generate a fourth set of coefficients for the baseline energy usage model; and
estimate an amount of energy saving resulting from the energy conservation measures based on a difference between the third set of coefficients and the fourth set of coefficients.

10. The system of claim 9, wherein the processing circuit is configured to:
apply the second set of building data to the baseline energy model with the third set of coefficients to estimate an energy usage of the building had the energy conservation measures not been implemented; and
compare the estimated energy usage to an actual energy usage of the building after implementing the energy conservation measures to estimate an amount of energy savings resulting from the energy conservation measures.

11. A method for generating a baseline energy usage model for a building, the method comprising:
operating HVAC equipment to affect an environmental condition within the building by providing heating or cooling to the building;
measuring one or more predictor variables for potential use in the baseline energy usage model using one or more sensors of the building, wherein the baseline energy usage model predicts an energy consumption of the HVAC equipment;
receiving, at a processing circuit, an initial set of predictor variables including the one or more measured predictor variables;
generating, by the processing circuit, a first set of coefficients for the baseline energy usage model based on the initial set of predictor variables;
removing, by the processing circuit, one of the predictor variables from the initial set of predictor variables to create a subset of the initial set of predictor variables;
generating, by the processing circuit, a second set of coefficients for the baseline energy usage model based on the subset of the initial set of predictor variables;
calculating, by the processing circuit, a test statistic for the removed predictor variable using a difference between the first set of coefficients and the second set of coefficients; and
automatically selecting, by the processing circuit, the removed predictor variable for use in the baseline energy usage model in response to the test statistic exceeding a critical value.

12. The method of claim 11, further comprising determining that the removed predictor variable is statistically significant to energy usage of the building in response to the test statistic exceeding the critical value.

13. The method of claim 11, wherein:
generating the first set of coefficients comprises applying a regression analysis to the initial set of predictor variables; and
generating the second set of coefficients comprises applying a regression analysis to the subset of the initial set of predictor variables.

14. The method of claim 11, wherein the initial set of predictor variables comprises a calculated predictor variable based on one or more of the measured predictor variables.

15. The method of claim 11, further comprising:
receiving a user selection of one or more predictor variables via a user interface device; and
adding one or more predictor variables to the initial set of predictor variables based on the user selection.

16. The method of claim 11, further comprising:
receiving a user selection of a data source via a user interface device;
identifying one or more predictor variables provided by the data source; and
adding the one or more identified predictor variables to the initial set of variables.

17. The method of claim 11, further comprising:
collecting data points for each of the predictor variables in the initial set of predictor variables, each data point having a data value and a time value;
identifying a time period during which all of the predictor variables in the initial set of predictor variables have a threshold number of data points based on the time values for each of the data points; and
using the identified time period to generate the first set of coefficients for the baseline energy usage model.

18. The method of claim 11, further comprising:
using a first set of building data collected during a first time period to generate a third set of coefficients for the baseline energy usage model;
using a second set of building data collected during a second time period to generate a fourth set of coefficients for the baseline energy usage model; and
detecting a fault in the building in response to a difference between the third set of coefficients and the fourth set of coefficients exceeding a threshold value.

19. The method of claim 11, further comprising:
using a first set of building data collected prior to implementing energy conservation measures to generate a third set of coefficients for the baseline energy usage model;
using a second set of building data collected after implementing the energy conservation measures to generate a fourth set of coefficients for the baseline energy usage model; and
estimating an amount of energy saving resulting from the energy conservation measures based on a difference between the third set of coefficients and the fourth set of coefficients.

20. The method of claim 19, further comprising:
applying the second set of building data to the baseline energy model with the third set of coefficients to estimate an energy usage of the building had the energy conservation measures not been implemented; and
comparing the estimated energy usage to an actual energy usage of the building after implementing the energy conservation measures to estimate an amount of energy savings resulting from the energy conservation measures.

* * * * *